(12) United States Patent
Fukumoto et al.

(10) Patent No.: US 8,865,326 B2
(45) Date of Patent: Oct. 21, 2014

(54) MAGNETORESISTANCE DEVICE INCLUDING LAYERED FERROMAGNETIC STRUCTURE, AND METHOD OF MANUFACTURING THE SAME

(75) Inventors: Yoshiyuki Fukumoto, Tokyo (JP); Chuuji Igarashi, Tokyo (JP)

(73) Assignee: NEC Corporation, Tokyo (JP)

( * ) Notice: Subject to any disclaimer, the term of this patent is extended or adjusted under 35 U.S.C. 154(b) by 103 days.

(21) Appl. No.: 12/834,646

(22) Filed: Jul. 12, 2010

(65) Prior Publication Data

US 2010/0276771 A1   Nov. 4, 2010

Related U.S. Application Data

(63) Continuation of application No. 11/354,144, filed on Feb. 15, 2006, now abandoned.

(30) Foreign Application Priority Data

Feb. 16, 2005   (JP) ................................. 2005-039852
Dec. 15, 2005   (JP) ................................. 2005-361431

(51) Int. Cl.
| | | |
|---|---|---|
| H01F 10/30 | (2006.01) | |
| G11C 11/16 | (2006.01) | |
| G01R 33/09 | (2006.01) | |
| B82Y 25/00 | (2011.01) | |
| B82Y 40/00 | (2011.01) | |
| H01F 41/30 | (2006.01) | |
| H01L 43/08 | (2006.01) | |
| H01F 10/32 | (2006.01) | |

(52) U.S. Cl.
CPC .............. *G11C 11/16* (2013.01); *G01R 33/098* (2013.01); *B82Y 25/00* (2013.01); *B82Y 40/00* (2013.01); *H01F 10/30* (2013.01); *H01F 10/3254* (2013.01); *H01F 10/3281* (2013.01); *H01F 41/303* (2013.01); *H01L 43/08* (2013.01)
USPC ........................................ 428/811.1; 365/171

(58) Field of Classification Search
None
See application file for complete search history.

(56) References Cited

U.S. PATENT DOCUMENTS

| 5,959,880 A | 9/1999 | Shi et al. |
|---|---|---|
| 6,233,172 B1 | 5/2001 | Chen et al. |

(Continued)

FOREIGN PATENT DOCUMENTS

| CN | 1503912 A | 6/2004 |
|---|---|---|
| JP | 2002-329903 A | 11/2002 |

(Continued)

OTHER PUBLICATIONS

Y.K. Zheng et al., "Spin Flop Switching of the Guided Synthetic Antiferromagnet MRAM", IEEE Transactions on Magnetics, Oct. 2006, pp. 2742-2744, vol. 42, No. 10, IEEE.

(Continued)

*Primary Examiner* — Kevin Bernatz
(74) *Attorney, Agent, or Firm* — Sughrue Mion, PLLC

(57) ABSTRACT

A layered ferromagnetic structure is composed of a first ferromagnetic layer positioned over a substrate; a second ferromagnetic layer positioned over the first ferromagnetic layer; and a first non-magnetic layer placed between the first and second ferromagnetic layers. The top surface of the first ferromagnetic layer is in contact with the first non-magnetic layer. The first ferromagnetic layer includes a first orientation control buffer that exhibits an effect of enhancing crystalline orientation of a film formed thereon.

7 Claims, 39 Drawing Sheets

(56) References Cited

U.S. PATENT DOCUMENTS

| | | | |
|---|---|---|---|
| 6,307,708 B1 | 10/2001 | Yoda et al. | |
| 6,466,417 B1* | 10/2002 | Gill | 360/324.12 |
| 6,545,906 B1 | 4/2003 | Savtchenko et al. | |
| 6,714,446 B1 | 3/2004 | Engel | |
| 6,905,780 B2* | 6/2005 | Yuasa et al. | 428/611 |
| 7,071,522 B2* | 7/2006 | Yuasa et al. | 257/421 |
| 7,163,755 B2* | 1/2007 | Hiramoto et al. | 428/811.3 |
| 7,280,389 B2 | 10/2007 | Guo | |
| 7,298,643 B2 | 11/2007 | Kim et al. | |
| 7,379,280 B2* | 5/2008 | Fukumoto et al. | 360/324.2 |
| 7,466,526 B2* | 12/2008 | Sato et al. | 360/324.2 |
| 7,538,402 B2 | 5/2009 | Fukumoto | |
| 7,684,161 B2* | 3/2010 | Pietambaram et al. | 360/324.12 |
| 2002/0008948 A1* | 1/2002 | Sasaki et al. | 360/324.12 |
| 2002/0009616 A1* | 1/2002 | Kamiguchi et al. | 428/692 |
| 2002/0048128 A1* | 4/2002 | Kamiguchi et al. | 360/324.1 |
| 2002/0051380 A1* | 5/2002 | Kamiguchi et al. | 365/158 |
| 2002/0085323 A1* | 7/2002 | Smith et al. | 360/324.12 |
| 2002/0105823 A1 | 8/2002 | Redon et al. | |
| 2003/0048658 A1 | 3/2003 | Chen | |
| 2003/0123197 A1 | 7/2003 | Mizuguchi et al. | |
| 2003/0184921 A1 | 10/2003 | Sugita et al. | |
| 2004/0145850 A1* | 7/2004 | Fukumoto et al. | 361/143 |
| 2004/0170055 A1 | 9/2004 | Albert et al. | |
| 2005/0099724 A1* | 5/2005 | Nakamura et al. | 360/125 |
| 2005/0201022 A1* | 9/2005 | Horng et al. | 360/324.11 |
| 2005/0280953 A1* | 12/2005 | Hasegawa et al. | 360/324.1 |
| 2006/0034118 A1* | 2/2006 | Saito et al. | 365/158 |
| 2006/0038213 A1 | 2/2006 | Mori et al. | |
| 2006/0110625 A1* | 5/2006 | Nakabayashi et al. | 428/816 |
| 2006/0187705 A1* | 8/2006 | Nakamura et al. | 365/171 |
| 2008/0055792 A1 | 3/2008 | Zheng et al. | |

FOREIGN PATENT DOCUMENTS

| | | |
|---|---|---|
| JP | 2003-283001 A | 10/2003 |
| JP | 2004-87870 A | 3/2004 |
| JP | 2004-179187 A | 6/2004 |
| JP | 2004-200245 A | 7/2004 |
| JP | 2004-253807 A | 9/2004 |
| JP | 2005-86015 A | 3/2005 |
| JP | 2005-294376 A | 10/2005 |
| JP | 2006-5278 A | 1/2006 |
| JP | 2006-40960 A | 2/2006 |
| JP | 2006-319259 A | 11/2006 |
| JP | 2007-59879 A | 3/2007 |
| WO | 02088765 A1 | 11/2002 |
| WO | 2005088745 A1 | 9/2005 |

OTHER PUBLICATIONS

Y. Fukumoto et al., "Significant reduction in writing field of toggle MRAMs using novel free layer structures", Journal of Magnetisim and Magnetic Materials, 2007, pp. 2674-2676, 310.

Office Action dated Jun. 6, 2012, issued by the U.S. Patent and Trademark Office in counterpart U.S. Appl. No. 12/453,209.

* cited by examiner

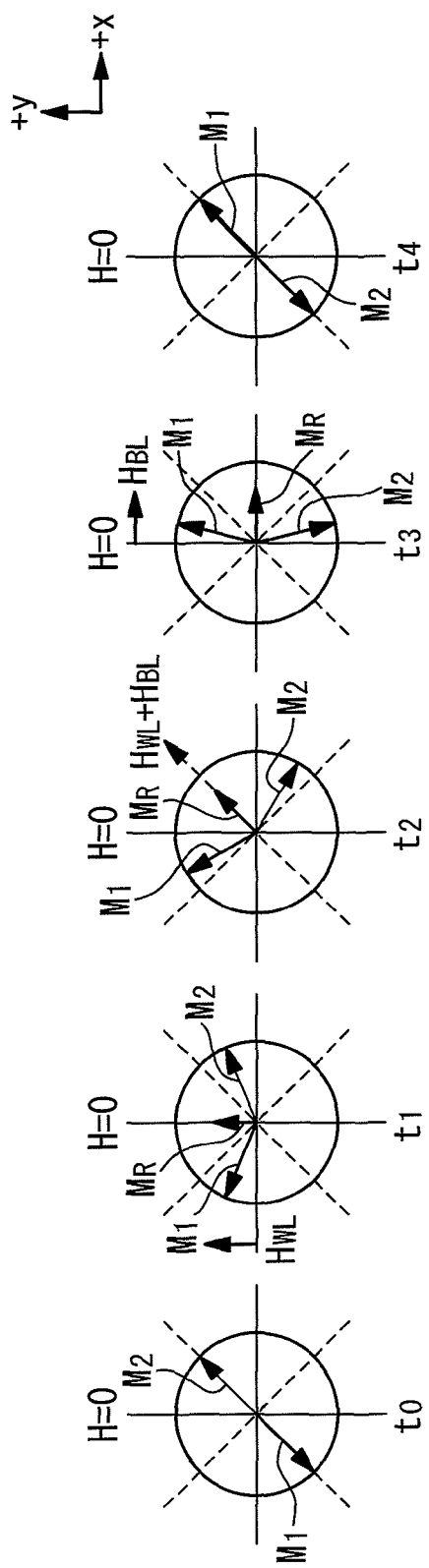

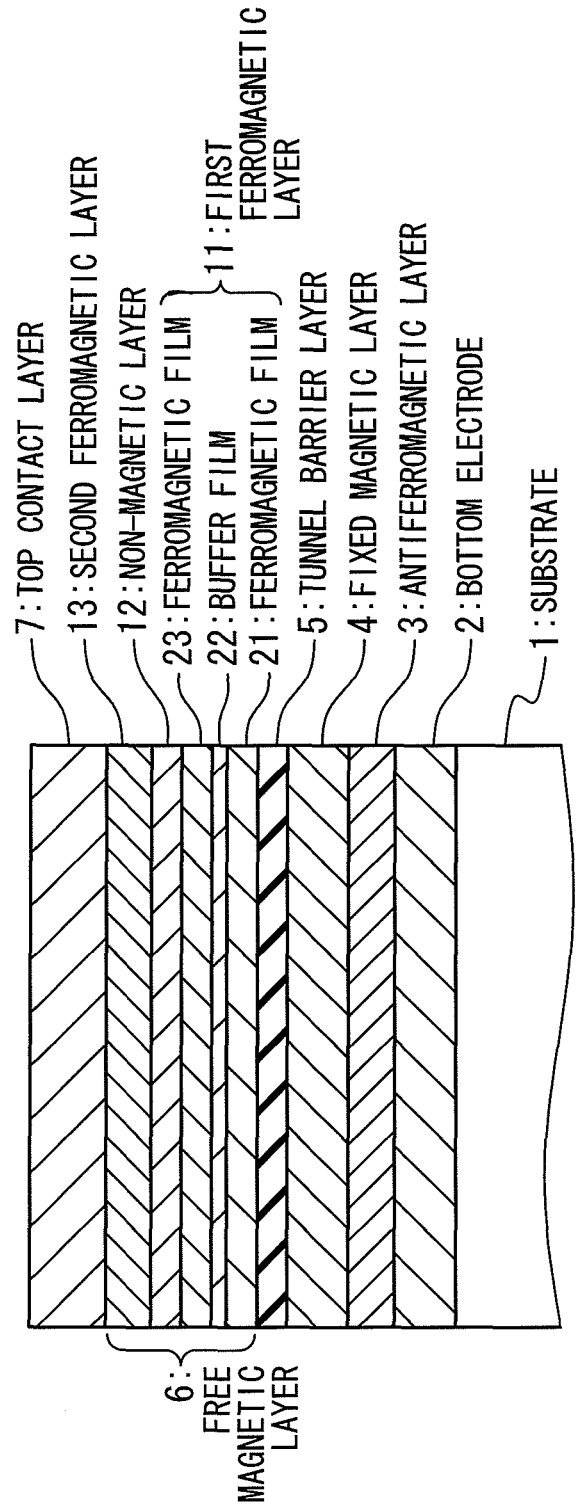

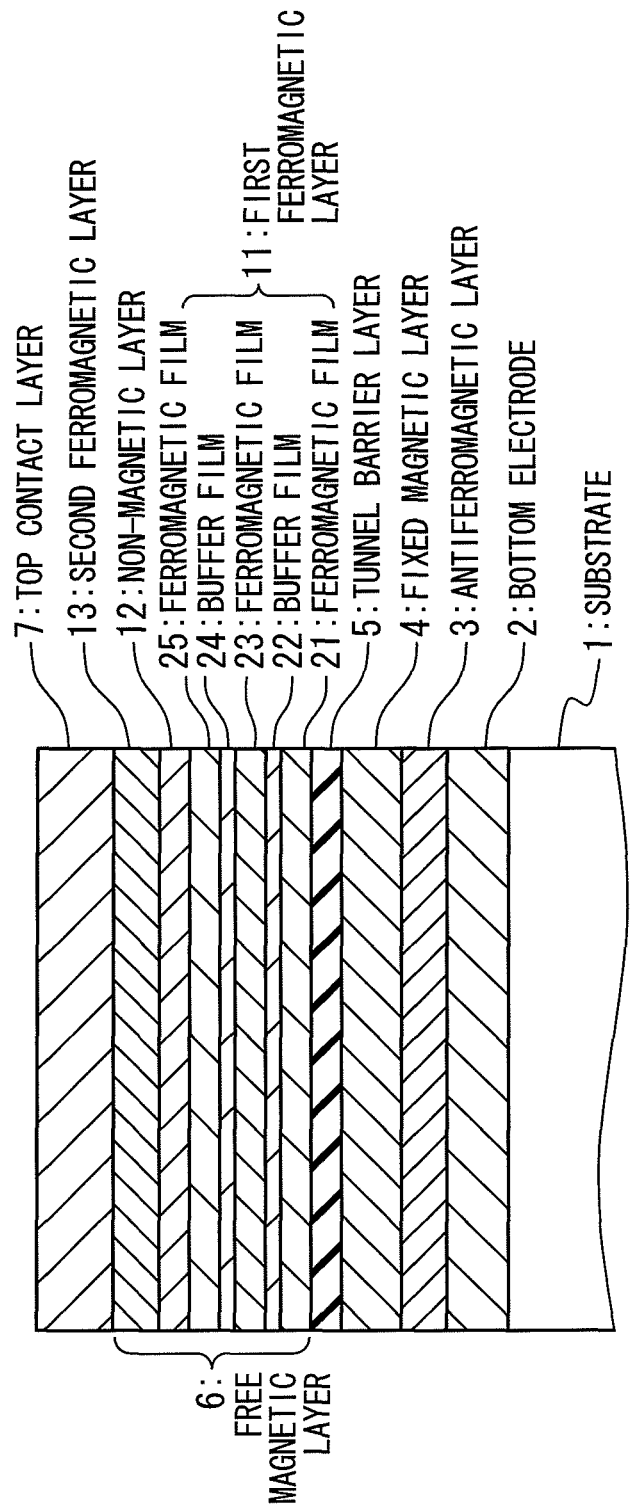

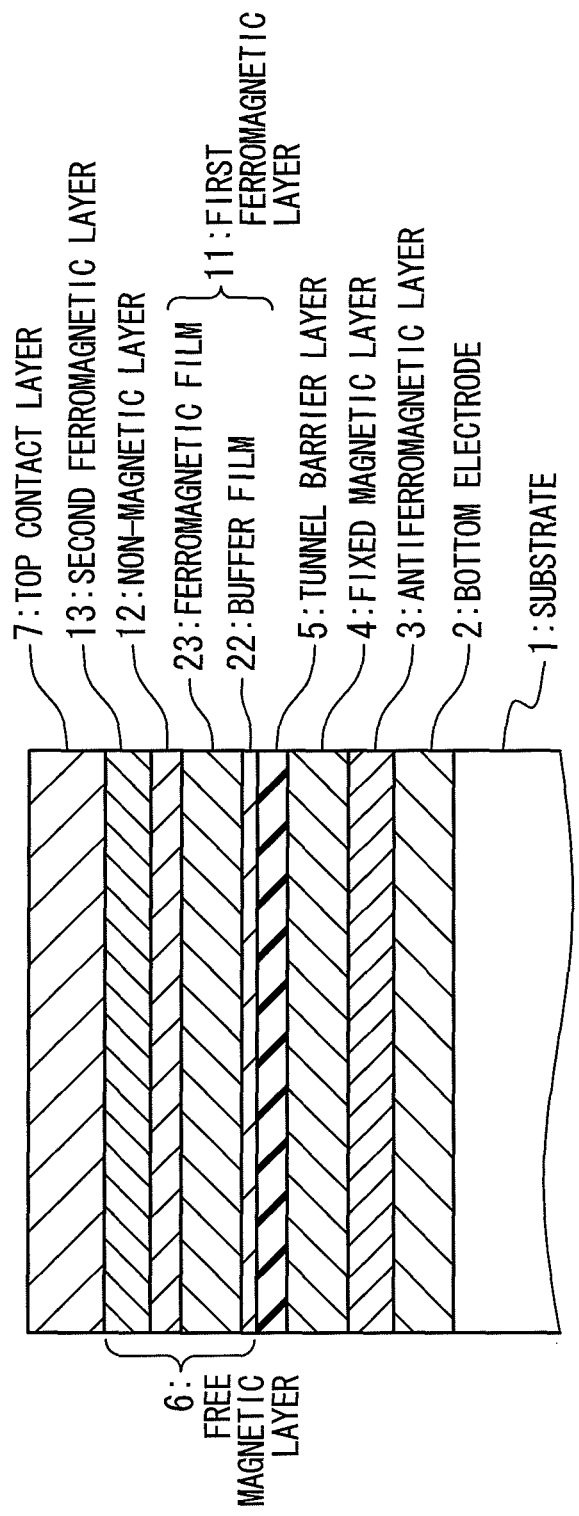

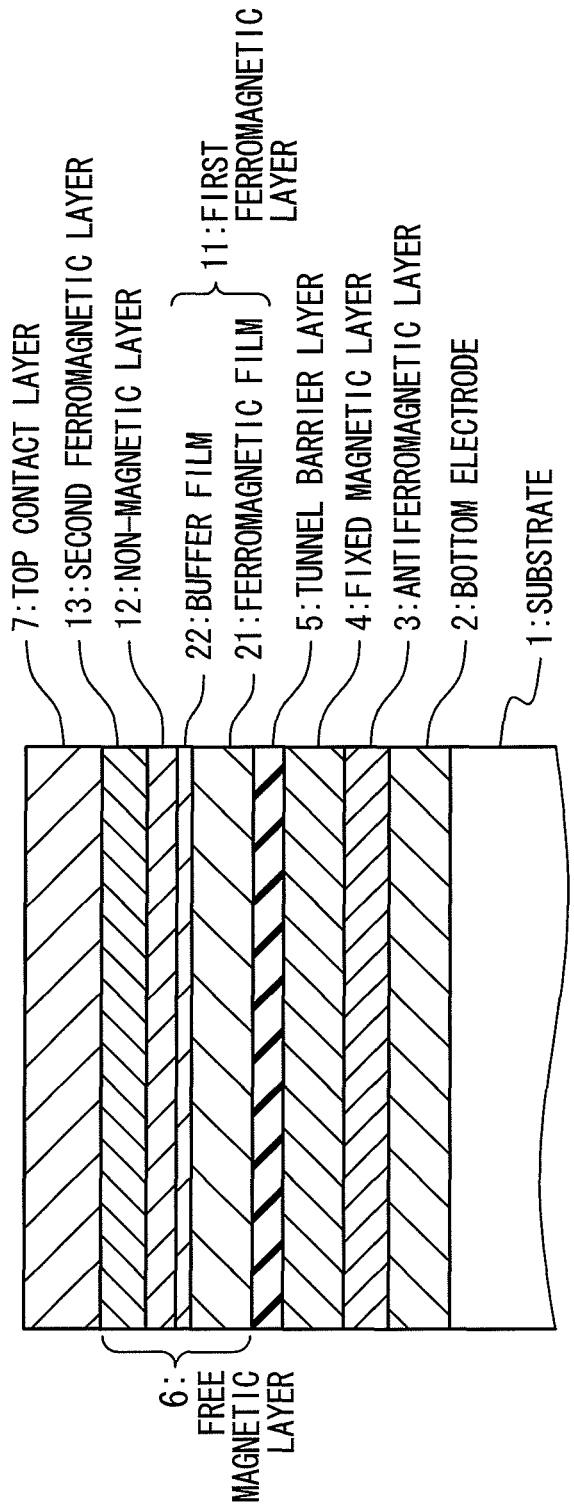

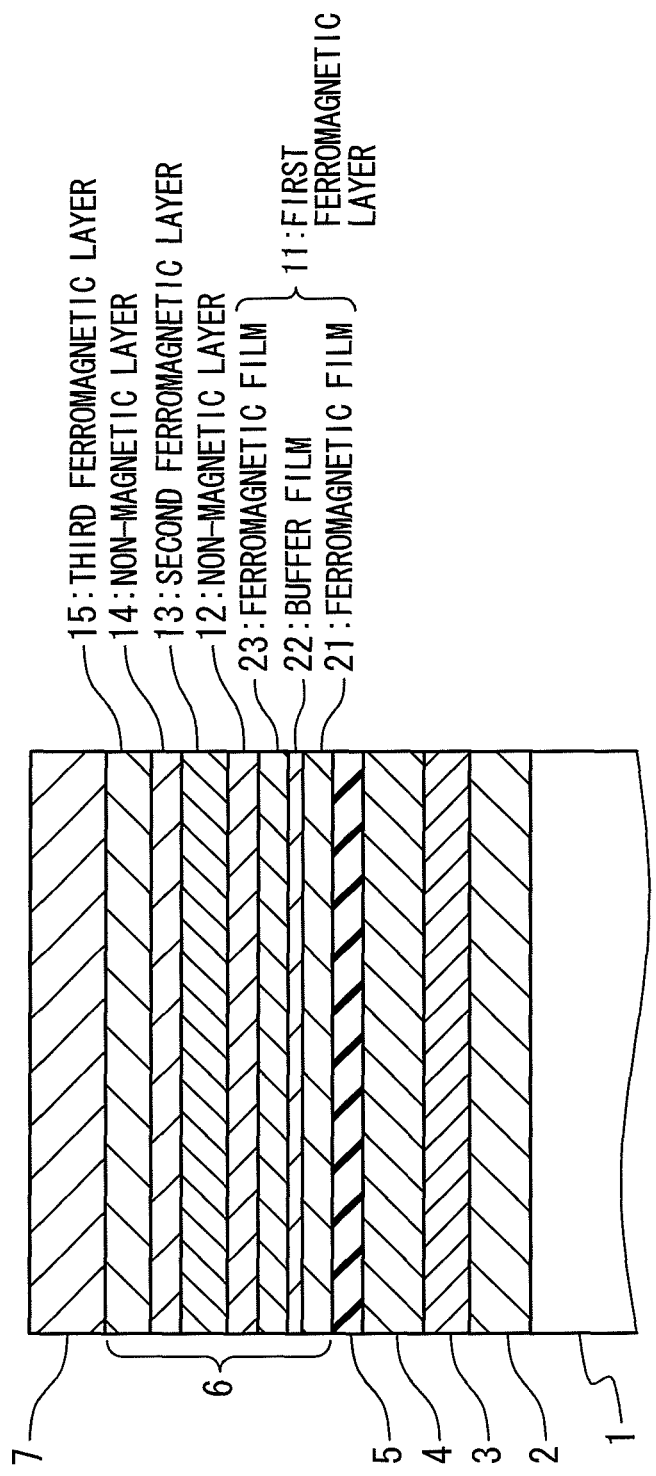

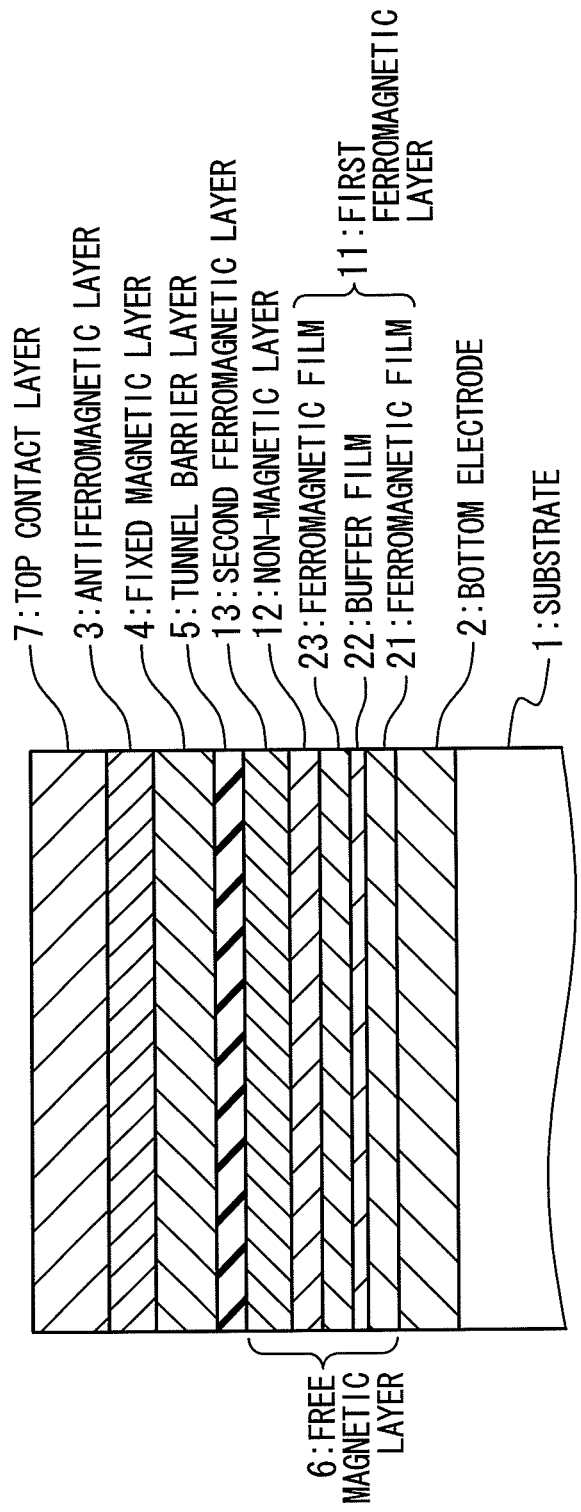

Fig. 20

| MATERIAL OF BUFFER FILM | THICKNESS (nm) | EXCHANGE COUPLING ENERGY J (erg/cm$^2$) |
|---|---|---|
| NONE | 0 | 0.00317 |
| Ta | 0.2 | 0.00450 |
| Ta | 0.3 | 0.01166 |
| Ta | 0.4 | 0.01601 |
| Zr | 0.2 | 0.01255 |
| Zr | 0.3 | 0.01476 |
| Zr | 0.4 | 0.01498 |
| Ru | 0.5 | 0.00387 |
| Al | 0.4 | 0.00399 |

Fig. 32

| | SAF STRUCTURE | SAF CHARACTERISTICS | | THICKNESS AND MAGNETIZATION PRODUCT (Tnm) | THICKNESS OF BOTTOM FERROMAGNETIC LAYER OF SAF MAGNETO-CRYSTALLINE ANISOTROPY FIELD Hk (Oe) |
|---|---|---|---|---|---|
| | | Hs (Oe) | J (erg/cm²) | | |
| EMBODIMENT 8 (PRESENT INVENTION) | NiFe(1.5nm)/Ta(0.3nm)/NiFe(2.0nm)/Ru(2.1nm)/ NiFe(2.0nm)/Ta(0.3nm)/NiFe(1.5nm) | 165 | 0.00750 | 2.24 | 2.8 |
| | NiFe(2nm)/Ta(0.3nm)/NiFe(2nm)/Ru(2.1nm)/ NiFe(2nm)/Ta(0.3nm)/NiFe(2nm) | 203 | 0.01166 | 2.70 | 3.2 |
| COMPARATIVE EXAMPLE 5 | NiFe(2nm)/CoFe(0.5nm)/Ru(2.1nm)/ CoFe(0.5nm)/NiFe(2nm) | 218 | 0.01221 | 2.81 | 17 |
| | NiFe(3nm)/CoFe(0.5nm)/Ru(2.1nm)/ CoFe(0.5nm)/NiFe(3nm) | 239 | 0.01845 | 3.79 | 14 |
| | NiFe(4nm)/CoFe(0.5nm)/Ru(2.1nm)/ CoFe(0.5nm)/NiFe(4nm) | 249 | 0.02386 | 4.72 | 12.1 |

MAGNETORESISTANCE DEVICE INCLUDING LAYERED FERROMAGNETIC STRUCTURE, AND METHOD OF MANUFACTURING THE SAME

This is a continuation of application Ser. No. 11/354,144 filed Feb. 15, 2006, which claims priority from Japanese Application No. 2005-039852 filed on Feb. 16, 2005 and Japanese Application No. 2005-361431, filed Dec. 15, 2005. The entire disclosures of the prior applications are considered part of the disclosure of the accompanying continuation application and is hereby incorporated by reference.

BACKGROUND OF THE INVENTION

1. Field of the Invention

The present invention relates to a magnetoresistance device, and more particularly relates to a magnetoresistance device having a structure where at least one of free and fixed magnetic layers is composed of a plurality of ferromagnetic layers separated by one or more non-magnetic layers.

2. Description of the Related Art

Magnetoresistance devices, such as a memory cells of MRAM (Magnetic Random Access Memory) and magnetic heads of recording devices is often composed of a structure provided with a plurality of ferromagnetic layers whose neighbors are separated by a non-magnetic layer; such structure is referred to as the layered ferromagnetic structure, hereinafter. The layered ferromagnetic structure is designed so as to attain desirable functions by using exchange coupling between the adjacent ferromagnetic layers.

One example of the applications of the layered ferromagnetic structure is the MRAM including memory cells in which free magnetic layers are composed of SAFs (Synthetic Anti-Ferromagnet). The SAF denotes a layered ferromagnetic structure in which adjacent ferromagnetic layers are antiferromagnetically coupled. FIG. 1A is a sectional view showing one example of the memory cell structure of the MRAM in which the free magnetic layers are composed of an SAF, and FIG. 1B is the top view thereof.

As shown in FIG. 1A, an MTJ element (magnetic tunnel junction element) 101 is provided at an intersection of a word line 102 and a bit line 103. The MTJ element 101 is composed of an antiferromagnetic layer 104, a fixed magnetic layer 105, a tunnel barrier layer 106 and a free magnetic layer 107.

The free magnetic layer 107 is composed of an SAF. Specifically, the free magnetic layer 107 is composed of ferromagnetic layers 108, 110, and a non-magnetic layer 109 placed therebetween. The ferromagnetic layers 108, 110 are antiferromagnetically coupled by the exchange coupling through the non-magnetic layer 109. As shown in FIG. 1B, the MTJ element 101 is long in the direction in which the word line 102 is extended. The easy axes of the ferromagnetic layers 108, 110 are directed in the direction in which the word line 102 is extended.

Referring back to FIG. 1A, the ferromagnetic layers 108 and 110 have different magnetizations $M_1$ and $M_2$, respectively. This implies that a net magnetization $M_R$ of the entire free magnetic layer 107 is not zero even when an external magnetic field is not applied. The net magnetization $M_R$ of the free magnetic layer 107 can be reversed by applying the external magnetic field greater than a switching magnetic field $H_c$. The MTJ element 101 stores one-bit data as the orientation of the net magnetization $M_R$ of the free magnetic layer 107.

FIG. 1C is a magnetization curve of the free magnetic layer 107 thus structured. In the range where an external magnetic field H is relatively small, the antiferromagnetic coupling is maintained between the ferromagnetic layers 108 and 110. The free magnetic layer 107 exhibits the behavior similar to that of a single ferromagnetic layer. Specifically, the free magnetic layer 107 exhibits hysteresis characteristics in the magnetization curve. The net magnetization $M_R$ of the free magnetic layer 107 can be reversed by applying the external magnetic field greater than the switching magnetic field $H_c$.

The magnitude of the switching magnetic field $H_c$ depends on the direction of the external magnetic field, namely, the magnitudes of the components of the external magnetic field in the directions of the easy and hard axes. In detail, as shown in FIG. 1D, the switching magnetic field $H_c$ exhibits an asteroid curve in a coordinate system where the magnetic field in the easy axis direction is represented on the horizontal axis, and the magnetic field in the hard axis direction is represented on the vertical axis.

Referring back to FIG. 1C, the net magnetization $M_R$ of the free magnetic layer 107 is not increased by the application of the external magnetic field that slightly exceeds the switching magnetic field $H_c$. This is because the magnetizations of the ferromagnetic layers 108 and 110 are kept antiparallel by the antiferromagnetic coupling between the ferromagnetic layers 108 and 110, and the increase in the external magnetic field does not contribute to the increase in the net magnetization $M_R$ of the free magnetic layer 107.

When an external magnetic field $H_E$ is further increased to exceed a certain magnetic field, the net magnetization $M_R$ of the free magnetic layer 107 begins to be increased. This is because the directions of the magnetizations of the ferromagnetic layers 108, 110 are redirected against the antiferromagnetic coupling, and the magnetizations of the respective ferromagnetic layers are placed out of the antiparallel state. Hereafter, in this specification, the magnetic field at which the magnetizations of the ferromagnetic layers within the SAF are placed out of the antiparallel state is referred to as a threshold magnetic field $H_1$. When the external magnetic field exceeding the threshold magnetic field $H_1$ is applied, the magnetizations of the ferromagnetic layers 108 and 110 are neither parallel nor anti-parallel. The angles of the magnetizations of the ferromagnetic layers 108, 110 depend on the magnitude of the external magnetic field.

When the external magnetic field $H_E$ is further increased, the magnetizations of the ferromagnetic layers 108 and 110 are directed in parallel, and the net magnetization $M_R$ of the free magnetic layer 107 is saturated. After the magnetizations of the ferromagnetic layers become parallel, there is no increase in the net magnetization $M_R$ caused by the changes in the directions of the magnetizations of the respective ferromagnetic layers, and the magnitude of the net magnetization $M_R$ of the free magnetic layer is no longer increased.

Data is written onto the free magnetic layer 107 within the SAF by sending write currents through both of the word line 102 and the bit line 103, and thereby applying a magnetic field to the free magnetic layer 107, similarly to typical MRAMs. Since the write currents are sent through both of the word line 102 and the bit line 103, a synthetic magnetic field is generated in a direction oblique to the easy axis, ideally, in the direction of the angle of 45° to the easy axis. The directions of the write currents, that is, the direction of the synthetic magnetic field is determined in accordance with the data to be written. Depending on the generated synthetic magnetic field, the magnetizations of the ferromagnetic layers 108 and 110 within the free magnetic layer 107 are flipped to desired directions to write the desired data onto the free magnetic layer 107.

The magnitudes of the write currents through the word line 102 and the bit line 103 are selected so that the synthetic magnetic field exceeds the switching magnetic field $H_c$. Specifically, the direction and magnitude of the synthetic magnetic field are selected such that the synthetic magnetic field corresponds to a point outside the asteroid curve in the coordinate system shown in FIG. 1D. Under such meaning, the above-described writing operation is referred to as the asteroid writing, hereinafter. When the asteroid writing is used, the antiparallel coupling between the adjacent two ferromagnetic layers is required to be maintained within the SAF of the free magnetic layer. This requires the sufficiently large exchange coupling, namely, the sufficiently large threshold magnetic field $H_1$.

Spin-current injection may be used for bit writing instead of the asteroid writing, which involves magnetization reversal of the free magnetic layer 107 by injecting a spin-polarized current into the free magnetic layer 107 and thereby transferring a spin torque of the spin-polarized electrons. In the structure shown in FIG. 1A, the spin-polarized current through the tunnel barrier layer 106 in the vertical direction exerts a spin torque between the free magnetic layer 107 and the fixed magnetic layer 105. The directions of the magnetizations are controllable by the direction of the spin-polarized current. The switching current of spin-current injection also depends on the switching magnetic field $H_c$ of the SAF. The use of spin-current injection for the MRAM is advantageous for reducing the write current and avoiding writing errors. In particular, a single magnetic domain is easily established in the respective ferromagnetic layers within the SAF, and the net magnetization $M_R$ of the SAF can be easily reduced. This is advantageous in the spin-current injection.

Another example of the application of the layered ferromagnetic structure is a toggle writing MRAM disclosed in U.S. Pat. No. 6,545,906. In this MRAM, differently from the MRAM adopting the asteroid writing, a free magnetic layer is composed of an SAF exhibiting a net magnetization of substantially zero when no external magnetic field is applied.

FIG. 2A is a plan view showing the structure of the MRAM disclosed in U.S. Pat. No. 6,545,906. The MRAM has a free magnetic layer 201, a word line 202 extended at an angle of 45° to the easy axis of the free magnetic layer 201, and a bit line 203 orthogonal to the word line 202. The free magnetic layer 201 is composed of an SAF having a free magnetic layer composed of two ferromagnetic layers having the same magnetization.

FIG. 2B is a graph showing the magnetization curve of the free magnetic layer 201. The net magnetization $M_R$ of the free magnetic layer 201 is substantially 0 when the applied external magnetic field is small. This is because the magnetizations of the ferromagnetic layers are kept antiparallel by the antiferromagnetic coupling between the ferromagnetic layers.

When the magnitude of the external magnetic field is further increased to a certain magnitude, the external magnetic field suddenly breaks the antiferromagnetic coupling between the two ferromagnetic layers, and then, the magnetizations of the two ferromagnetic layers are rearranged at a certain angle so that the direction of the resultant magnetization vector of the two ferromagnetic layers is in coincidence with the direction of the external magnetic field. Hereinafter, such magnetic field is referred to as the spin flop field $H_{flop}$. When the magnitude of the external magnetic field is further increased in the range between those of the spin flop field $H_{flop}$ and the saturation magnetic field $H_s$, the increase in the applied external magnetic field increases the net magnetization of the free magnetic layer. This is because the directions of the magnetizations of the ferromagnetic layers are redirected to be nearly placed in the parallel state. When the applied magnetic field is further increased to then exceed the saturation magnetic field $H_s$, the magnetizations of the ferromagnetic layers become completely parallel, and the net magnetization of the free ferromagnetic layer is saturated.

FIG. 3 is a diagram showing the writing operation of the MRAM disclosed in the patent document 1. It should be understood that symbols $M_1$, $M_2$ denotes the magnetizations of the respective ferromagnetic layers within the free magnetic layer 201.

The data writing of this MRAM is achieved by rotating the in-plane direction of the magnetic field applied to the free magnetic layer and consequently rotating the magnetizations of the ferromagnetic layers within the free magnetic layer 201 to desired directions. Specifically, at first, a write current is sent through the word line 202 so that a magnetic field $H_{WL}$ is generated in the direction vertical to the word line 202 at a time $t_1$. Another write current is then sent through the bit line 203 at a time $t_2$ while the write current through the word line 202 is maintained. Consequently, a magnetic field $H_{WL}+H_{BL}$ is generated in the direction oblique to both of the word line 202 and the bit line 203, typically, in the direction at an angle 45° to the word line 202 and the bit line 203. In succession, the write current to the word line is terminated at a time $t_3$ with the write current maintained through the bit line 203. Consequently, the magnetic field $H_{BL}$ is generated in the direction orthogonal to the bit line 203, that is, in the direction parallel to the word line 202. The thus described process achieves rotation of the magnetic field applied to the free magnetic layer 201, and resulting in that the magnetizations of the ferromagnetic layers within the free magnetic layer 201 are rotated by 180 degrees. The data writing in this procedure may be referred to as the toggle writing, hereinafter.

In the MRAM adopting the toggle writing, the magnetic field applied to the free magnetic layer is required to be greater than the spin flop field $H_{flop}$ and smaller than the saturation magnetic field $H_s$, when the write currents are sent to the word line 202 and the bit line 203. If not so, the magnetizations of the ferromagnetic layers within the free magnetic layer 201 are not directed to desired directions.

The MRAM adopting the toggle writing has various advantages. One advantage is that the toggle writing achieves superior selectivity. In principle, the toggle writing does not cause the rotation of the magnetizations of the ferromagnetic layers within the SAF when a write current is sent through only one of the word line 202 and the bit line 203. In other words, the magnetizations of half-selected memory cells are not undesirably reversed. This is important from the viewpoint of the operation reliability of the MRAM.

Another advantage of the toggle writing is that the tolerance for thermal activation is improved with the reduced net magnetization of the free magnetic layer. In order to improve the tolerance for the thermal activation, the volume of the free magnetic layer is required to be increased. However, in the MRAM that uses a single-layered ferromagnetic film as the free magnetic layer, the increase in the volume of the free magnetic layer undesirably increases the magnetization and thickness product (namely, the product of the magnetic film thickness and the saturation magnetization) of the free magnetic layer. as the free magnetic layer. The increase in the magnetization and thickness product of the free magnetic layer increases the magnetic field generated by the magnetization, and thereby undesirably causes the magnetic interference between adjacent memory cells. Moreover, the increase in the magnetization and thickness product of the free magnetic layer makes it hard to reverse the magnetization of the free magnetic layer. These phenomena are not preferable for the operation of the MRAM. On the other hand, the MRAM based on the toggle writing, which incorporates the SAF as the free magnetic layer, allows the volume of the free magnetic layer to be increased with a reduced net magnetization of the free magnetic layer. For example, increasing the number and/or film thickness of the ferromagnetic layers within the SAF allows the increase in the volume of the free magnetic layer. However, the net magnetization of the SAF can be ideally kept zero by using a properly designed SAF structure.

Still another example of the applications of the layered ferromagnetic structure is the fixed magnetic layer composed of two ferromagnetic layers coupled antiferromagnetically (for example, refer to Japanese Laid-Open Patent Applications Nos. P2004-87870A and P2004-253807). An advantage of such-designed fixed magnetic layer is that undesired reverse of the magnetizations is not easily caused by an external magnetic field due to the reduced net magnetization; the net magnetization of the fixed magnetic layer incorporating an SAF is ideally zero. In order to make the net magnetization of the fixed magnetic layer closer to 0, the two ferromagnetic layers are coupled in an antiferromagnetic manner, and designed to have the same magnetizations. The fact that the two ferromagnetic layers are coupled in the antiferromagnetic manner is important to provide the net magnetization of zero.

One requirement on the layered ferromagnetic structure (typically, the SAF) is that the sufficiently large exchange coupling acts between adjacent ferromagnetic layers. For example, an MRAM which uses an SAF as the free magnetic layer and performs the asteroid writing requires sufficiently large antiferromagnetic exchange coupling between the ferromagnetic layers. If not so, the free magnetic layer does not function as the SAF. Similarly, an MRAM which uses an SAF as the fixed magnetic layer requires sufficiently large antiferromagnetic exchange coupling between the ferromagnetic layers of the SAF.

Achieving sufficiently great exchange coupling may be a problem, especially in the case where a layered ferromagnetic structure is formed on a tunnel barrier layer. The tunnel barrier layer is often formed of an amorphous layer or a poorly-oriented layer, such as $AlO_x$. As a result, a ferromagnetic layer formed on the tunnel barrier layer often exhibits poor orientation. The poorly-oriented ferromagnetic layer causes a non-magnetic layer formed thereon to be also poorly oriented. This weakens the exchange coupling between the ferromagnetic layers, and prevents desired properties from being achieved in the layered ferromagnetic structure. Such situation is especially severe when the ferromagnetic layers within the SAF are formed of NiFe. It is hard to obtain sufficiently large exchange coupling between NiFe ferromagnetic layers within SAF.

The same applies to a case where the crystalline structure of the tunnel barrier layer is not compatible for growing SAF films thereon, even if the tunnel barrier layer is formed of a highly-oriented insulating film, such as a MgO film having the NaCl crystal structure. In such situations, large exchange coupling is not obtained, which causes the same problem. In many cases, crystal structures of SAF films are not well matched with that of the underlying crystalline tunnel barrier film.

Although there is a need for a technique that achieves improved crystal growth of SAF films regardless of the crystal structure the underlying tunnel barrier, no approach has been currently proposed.

Incorporating a layer structure composed of CoFe and NiFe films within each ferromagnetic layer of the SAF may achieve enhanced exchange coupling; however, the use of CoFe films results in the increase in the saturated magnetization and crystal magnetic anisotropy of the SAF. This is not preferable for the operation of the MRAM. For the MRAM adopting the asteroid writing, the increases in the saturated magnetization and crystal magnetic anisotropy undesirably increase the switching magnetic field $H_c$ and thereby increase the write current.

Another requirement imposed on the layered ferromagnetic structure is that the strength of the exchange coupling between the ferromagnetic layers can be easily controlled. In the toggle writing, for example, it is important that an anisotropic magnetic field $H_k$ of each ferromagnetic layer and an exchange coupling energy J between the adjacent ferromagnetic are appropriately adjusted. This is because the spin flop field $H_{flop}$ and the saturation magnetic field $H_s$, which determine the operational margin of the toggle writing, depend on the exchange coupling energy J. Specifically, the spin flop field $H_{flop}$ and saturation magnetic field $H_s$ of the SAF composed of two ferromagnetic layers are represented by the following equations:

$$H_s = 2J/M_s \cdot (1/t_1 + 1/t_2) - 2K/M, \quad (1)$$

$$H_{flop} = 2/M_s \cdot [K(2J/t-K)]^{0.5}, \quad (2)$$

where J is the exchange coupling energy acting through the non-magnetic layer within the SAF, $M_s$ is the saturated magnetization of the SAF, K is the anisotropic energy, and $t_1$ and $t_2$ are the film thicknesses of the respective ferromagnetic layers within the SAF. It should be noted that the anisotropic energy K is increased with the increase in the anisotropic magnetic field $H_k$, and that the saturation magnetic field $H_s$ given by the equation (1) can be approximated by only the first term, when $t_1$ and $t_2$ are not equal. Moreover, the equation (2) can be defined only when $t_1$ and $t_2$ are equal. That is, if the equation (2) can be defined, it holds that $t=t_1=t_2$.

The equation (2) can be rewrite as shown below:

$$H_{flop} = (H_s \times H_k)^{0.5} \quad (2)'$$

As can be understood from the equations (1), (2), the toggle writing requires a sufficiently increased exchange coupling energy J in order that the ferromagnetic layer functions as the SAF. However, the excessive increase in the exchange coupling energy J undesirably leads to the increase in the spin flop field $H_{flop}$. Hence, the exchange coupling energy J is required to be controlled to a proper value. In addition, it would be preferable the anisotropic magnetic field $H_k$, namely, the anisotropic energy K can be controlled independently of the exchange coupling energy J, because it allows the spin flop field $H_{flop}$ to be controlled independently of the saturation magnetic field $H_s$, as can be understood from the equation (2)'.

As is widely known to those skilled in the art, the exchange coupling energy that acts between the ferromagnetic layers is somewhat controllable on the basis of the thickness of the non-magnetic layer formed therebetween, as shown in FIG. 4. However, in order to stabilize the magnitude of the exchange coupling energy, the thickness of the non-magnetic layer should be adjusted so that the exchange coupling energy exhibits an extreme value. This implies that the magnitude of the exchange coupling energy is not freely controllable by the thickness of the non-magnetic layer. It is advantageous to provide a technique for controlling the exchange coupling energy through parameters other than the thickness of the non-magnetic layer for attaining highly-reliable MRAMs based on the toggle writing.

U.S. Pat. No. 6,714,446 discloses an improved SAF structure in which two ferromagnetic layers within an SAF are each composed of two ferromagnetic films antiferromagnetically coupled. The disclosed SAF structure, however, does not address enhancing or controlling the exchange coupling energy.

SUMMARY OF THE INVENTION

Therefore, an object of the present invention is to provide a technique for providing sufficiently great exchange coupling between ferromagnetic layers within a layered ferromagnetic structure.

Another object of the present invention is to provide a technique for flexibly controlling the strength of exchange coupling between ferromagnetic layers within a layered ferromagnetic structure, preferably independently of a magnetocrystalline anisotropy field $H_k$ of each ferromagnetic layer.

In an aspect of the present invention, a layered ferromagnetic structure is composed of: a first ferromagnetic layer positioned over a substrate; a second ferromagnetic layer positioned over the first ferromagnetic layer; and a first non-magnetic layer placed between the first and second ferromagnetic layers. The top surface of the first ferromagnetic layer is in contact with the first non-magnetic layer. The first ferromagnetic layer includes a first orientation control buffer that exhibit an effect of enhancing crystalline orientation of a film formed thereon.

In such layered ferromagnetic structure, the first orientation control buffer effectively improves crystalline orientation of the first non-magnetic layer through improving crystalline orientation of at least a top portion of the first ferromagnetic layer or, through directly enhancing crystalline orientation of the first non-magnetic layer. The enhancement of the crystalline orientation of the first non-magnetic layer effectively achieves enhancing the exchange coupling between the first and second ferromagnetic layers.

In one embodiment, the first ferromagnetic layer may further include a first ferromagnetic film; and a second ferromagnetic film positioned over the first ferromagnetic film. In this case, the first orientation control buffer is placed between the first and second ferromagnetic films and designed to provide ferromagnetic coupling between the first and second ferromagnetic films.

The first orientation control buffer preferably has a thickness of 1.0 nm or less. This allows ferromagnetic coupling between the first and second ferromagnetic layers.

In this case, the first orientation control buffer is preferably formed of material selected from a group consisting of tantalum (Ta), ruthenium (Ru), niobium (Nb), vanadium (V), osmium (Os), rhodium (Rh), iridium (Ir), titanium (Ti), zirconium (Zr), hafnium (Hf), copper (Cu), silver (Ag), gold (Au), chromium (Cr), molybdenum (Mo), tungsten (W), aluminum (Al), magnesium (Mg), silicon (Si), yttrium (Y), cerium (Ce), palladium (Pd), rhenium (Re), alloys thereof. It is also preferable that the first orientation control buffer is formed of compounds of material selected from a group consisting of tantalum (Ta), ruthenium (Ru), niobium (Nb), vanadium (V), osmium (Os), rhodium (Rh), iridium (Ir), titanium (Ti), zirconium (Zr), hafnium (Hf), copper (Cu), silver (Ag), gold (Au), chromium (Cr), molybdenum (Mo), tungsten (W), aluminum (Al), magnesium (Mg), silicon (Si), yttrium (Y), cerium (Ce), palladium (Pd), rhenium (Re), and of alloys thereof.

It is more preferable that the first orientation control buffer is formed of material selected from a group consisting of tantalum (Ta), niobium (Nb), zirconium (Zr), hafnium (Hf), molybdenum (Mo), tungsten (W), and alloys thereof. These material provide a superior effect of enhancing crystalline orientation of a film formed thereon, especially when the film formed thereon mainly consisting of NiFe or CoFe. Therefore, the use of the materials listed above effectively enhances the exchange coupling between the first and second ferromagnetic layers.

The first orientation control buffer may be configured so as to allow the first and second ferromagnetic films to be partially in direct contact with each other. The partial contact effectively provides ferromagnetic coupling between the first and second ferromagnetic films.

The first orientation control buffer may be formed of a group consisting of ruthenium (Ru), chromium (Cr), rhenium (Re), rhodium (Rh), iridium (Ir), yttrium (Y), silver (Ag), copper (Cu), alloys thereof, and compounds thereof. These material effectively improves crystalline orientation of a film formed thereon, when the film formed thereon mainly consisting of NiFe or CoFe. Additionally, these materials allows ferromagnetic coupling between the first and second ferromagnetic films, even when the first orientation control buffer has an increased thickness. The thickness of the first orientation control buffer is adjusted to exhibit sufficiently strong ferromagnetic coupling.

In another embodiment, the first orientation control buffer is directly formed on the tunnel barrier layer so as to exhibit ferromagnetism, and the first ferromagnetic layer further includes a ferromagnetic film on the first orientation control buffer.

In still another embodiment, the first ferromagnetic layer further includes a ferromagnetic film, and the first orientation control buffer is formed on the ferromagnetic film, exhibiting ferromagnetism. In this case, the first non-magnetic layer is formed on the first orientation control buffer.

In these embodiments, it is preferable that the first orientation control buffer is configured to exhibit ferromagnetism, and includes ferromagnetic material, such as NiFe and CoFe, and at least one material selected from a group consisting of tantalum, niobium, zirconium, hafnium, molybdenum, and tungsten.

In a preferred embodiment, the first orientation control buffer is formed of NiFe doped with tantalum or zirconium, and the tantalum or zirconium content of the first orientation control buffer ranges from 5 to 25 atomic %.

As thus described, the present invention achieves enhancement of the exchange coupling by the improvement of the crystalline orientation of the first non-magnetic layer. The strength of the exchange coupling through the first non-magnetic layer depends on the state of surfaces of the first non-magnetic layer, which are in contact with the first and second ferromagnetic layers, respectively. In general, the strongest exchange coupling is obtained when the closest-packed face of the first non-magnetic layer is parallel to the surfaces of the first non-magnetic layer, that is, when the closest-packed face of the first non-magnetic layer orients perpendicular to the film plane. Therefore, one approach for achieving sufficiently strong exchange coupling is to enhance the crystalline orientation of the first non-magnetic layer with the closest-packed face thereof oriented perpendicular to the film plane.

One promising approach is to enhance the crystalline orientation of the first ferromagnetic layer so that the closest-packed face of the first ferromagnetic layer orients perpendicular to the film plane. Depositing the first non-magnetic layer on the closest-packed face of the ferromagnetic underlayer helps the lattice matching between the first non-magnetic layer and the ferromagnetic underlayer, enhancing the crystalline orientation of the first non-magnetic layer with the closest-packed face orients perpendicular to the film plane.

When the first orientation control buffer is placed between the first and second ferromagnetic films to provide ferromagnetic coupling therebetween, the second ferromagnetic film exhibits higher crystalline orientation with the closest-packed face thereof oriented perpendicular to the film plane, compared to the first ferromagnetic film. This is because the first orientation control buffer enhances the crystalline orientation of the second ferromagnetic film with the closest-packed face thereof oriented perpendicular to the film plane, and thereby enhances the crystalline orientation of the first non-magnetic film with the closest-packed face thereof oriented perpendicular to the film plane. This achieves enhanced exchange coupling. When the second ferromagnetic film has the FCC (face-centered cubic) structure, the second ferromagnetic film is preferably configured to exhibit high FCC (111) orientation. When the second ferromagnetic film has the BCC (body-centered cubic) structure, the second ferromagnetic film is preferably configured to exhibit high BCC (110) orientation. Finally, when the second ferromagnetic film has the HCP (hexagonal closed packed) structure, the second ferromagnetic film is preferably configured to exhibit high HCP (001) orientation. These are especially effective when the second ferromagnetic film is formed of material selected from a group consisting of Ni, Fe, Co, and alloys thereof, and when the first non-magnetic film is formed of ruthenium or alloy thereof. Improved lattice matching is achieved between the HCP (001) face of the ruthenium film and the closest-packed face of a NiFeCo alloy film, as is understood from their lattice constants.

In order to reduce the structure difference between the first and second ferromagnetic layers, the second ferromagnetic layer is preferably composed of a third ferromagnetic film, a fourth ferromagnetic film positioned over the third ferromagnetic film, and a second orientation control buffer placed between third and fourth ferromagnetic films.

In this case, the second orientation control buffer is preferably formed of amorphous material, such as $NiFeTaO_x$, $NiFeTaN_x$, CoFeB, and NiFeB, in order to avoid the crystalline orientation of the fourth ferromagnetic film being excessively enhanced.

It is also preferable that the second ferromagnetic film includes a third orientation control buffer placed between the second orientation control buffer and the fourth ferromagnetic film, the third orientation control buffer being configured to enhance the fourth ferromagnetic film.

In order to suppress an excessive improve of the crystalline orientation of the second ferromagnetic layer as a whole, the second ferromagnetic layer is preferably composed of an amorphous ferromagnetic film on the first non-magnetic layer, a fourth orientation control buffer on the amorphous ferromagnetic film, and an additional ferromagnetic film on the fourth orientation control buffer, the fourth orientation control buffer being configured to enhance the crystalline orientation of the additional ferromagnetic film.

When the second ferromagnetic layer includes third and fourth ferromagnetic films, and fifth orientation control buffer placed between the third and fourth ferromagnetic films, it is preferable that the third ferromagnetic film is subject to plasma treatment, and the fifth orientation control buffer placed is configured to enhance the crystalline orientation of the fourth ferromagnetic film.

The use of the technique of avoiding the excessive improvement of the crystalline orientation of the second ferromagnetic layer is especially preferable when the layered ferromagnetic structure incorporates three or more ferromagnetic layers, specifically, when the layered ferromagnetic structure includes a second non-magnetic layer on the second ferromagnetic layer, and a third ferromagnetic layer on the second non-magnetic layer.

In this case, the third ferromagnetic layer is preferably composed of a fifth ferromagnetic film, a sixth ferromagnetic film positioned over the fifth ferromagnetic film, and a sixth orientation control buffer formed of amorphous material and placed between the fifth and sixth ferromagnetic films.

When the third ferromagnetic layer is composed of fifth and sixth ferromagnetic films, and a sixth orientation control buffer placed therebetween, it is preferable that the fifth ferromagnetic film is subjected to plasma-treatment, and the sixth orientation control buffer is configured to enhance the crystalline orientation of the sixth ferromagnetic film.

When the layered ferromagnetic structure includes three ferromagnetic layers, the second ferromagnetic layer is preferably formed of ferromagnetic material doped with non-ferromagnetic material. In this case, it is further preferable that the third ferromagnetic layer is formed of ferromagnetic material doped with non-ferromagnetic material.

In another aspect of the present invention, a layered ferromagnetic structure is composed of: first and second ferromagnetic layers and a first non-magnetic layer placed between the first and second ferromagnetic layers. The top surface of the first ferromagnetic layer is in contact with the first non-magnetic layer. The first ferromagnetic layer is composed of first and second ferromagnetic films ferromagnetically coupled with each other. The second ferromagnetic film is positioned between the first ferromagnetic film and the first non-ferromagnetic film. The crystalline orientation of the second ferromagnetic film is different from that of the first ferromagnetic film.

Such designed layered ferromagnetic structure allows the control of the first non-ferromagnetic layer through appropriately control the second ferromagnetic film, and thereby provides control of the strength of the exchange coupling between the first and second ferromagnetic layers.

When the layered ferromagnetic structure is used as an SAF, the first non-magnetic layer is configured to provide antiferromagnetic coupling between the first and second ferromagnetic layers.

In one embodiment, the second ferromagnetic film is configured to exhibit higher crystalline orientation than that of the first ferromagnetic film. This achieves the improvement of the crystalline orientation of the first non-magnetic layer on the second ferromagnetic layer, and thereby enhances the exchange coupling through the first non-magnetic layer. This is especially advantageous when the first ferromagnetic film is in contact with an amorphous film.

The second ferromagnetic layer is preferably composed of third and fourth ferromagnetic films ferromagnetically coupled with each other. In this case, the fourth ferromagnetic film is preferably configured to exhibit poorer crystalline orientation than that of the third ferromagnetic film. Instead, the third ferromagnetic film may be subjected to plasma-treatment.

The structure in which the fourth ferromagnetic film exhibits poorer crystalline orientation than that of the third ferromagnetic film, and the structure in which the third ferromagnetic film is subjected to plasma-treatment are especially effective when the layered ferromagnetic structure is composed of a second non-magnetic layer on the second ferromagnetic layer, and a third ferromagnetic layer on the second non-magnetic layer. In general, when the layered ferromagnetic structure is formed of three or more ferromagnetic layers and non-magnetic layers inserted thereinto, the non-magnetic layers exhibit higher crystalline orientation as the order of the depositions is later. This undesirably causes non-uniformity of exchange couplings through the respective non-magnetic layers. The non-uniformity of exchange couplings is, however, effectively avoided by the use of the structure in which the fourth ferromagnetic film exhibits poorer crystalline orientation than that of the third ferromagnetic film, or the structure in which the third ferromagnetic film is subjected to plasma-treatment, because these structures effectively avoid the excessive improvement of the crystalline orientation of the second non-magnetic layer.

It should be noted that the second non-magnetic layer is formed to provide antiferromagnetic coupling between the second and the third ferromagnetic layers, when the layered ferromagnetic structure is used as an SAF.

The third ferromagnetic layer is preferably composed of a fifth ferromagnetic layer and a sixth ferromagnetic layer coupled ferromagnetically with the fifth ferromagnetic layer. In this case, the sixth ferromagnetic layer is preferably configured to exhibit poorer crystalline orientation than that of the fifth ferromagnetic film. It is also preferable that the fifth ferromagnetic film is subjected to plasma-treatment, instead.

In order to avoid the non-uniformity of the exchange couplings through the respective non-magnetic layers, it is also preferable that the second ferromagnetic layer is formed of ferromagnetic material doped with non-magnetic material. In this case, it is preferable that the third ferromagnetic layer is also formed of ferromagnetic material doped with non-magnetic material.

In an alternative embodiment, the second ferromagnetic film is configured to exhibit poorer crystalline orientation than that of the first ferromagnetic film. Such structure allows the deterioration of the crystalline orientation of the second non-magnetic layer positioned over the second ferromagnetic film.

Such designed layered ferromagnetic structure is preferably applied to a free ferromagnetic layer and a fixed ferromagnetic layer.

When the above-described layered ferromagnetic structure is used as an SAF, the thickness(es) of the non-magnetic layer(s) is controlled to obtain the antiferromagnetic coupling of a desired strength. When the above-described layered ferromagnetic structure is applied to a produce other than the SAF, the thickness(es) of the non-magnetic layer(s) is controlled to obtain the ferromagnetic coupling of a desired strength.

BRIEF DESCRIPTION OF THE DRAWINGS

The above and other advantages and features of the present invention will be more apparent from the following description taken in conjunction with the accompanied drawings, in which:

FIG. 2B is a conceptual view showing a procedure of implementing the toggle writing in the conventional MRAM;

FIG. 5A is a sectional view showing a structure of an MRAM in a first embodiment of the present invention;

FIG. 5B is a sectional view showing another structure of the MRAM in the first embodiment of the present invention;

FIG. 7A is a sectional view showing still another structure of the MRAM in the first embodiment of the present invention;

FIG. 7B is a sectional view showing still another structure of the MRAM in the first embodiment of the present invention;

FIG. 12 is a sectional view showing an exemplary structure of an MRAM in a third embodiment of the present invention;

FIG. 13 is a sectional view showing a preferable structure of the MRAM in the third embodiment of the present invention;

FIG. 17B is a sectional view showing a preferable structure of MRAM in a fifth embodiment;

FIG. 20 is a table showing a relation between the material and thickness of the buffer film and the magnitude of the exchange coupling energy J acting between the ferromagnetic layers within the SAF;

FIG. 32 is a table showing the exchange coupling energies J and the magneto-crystalline anisotropy fields $H_k$ of the SAFs of Embodiment 8 and Comparative Example 5;

DESCRIPTION OF THE PREFERRED EMBODIMENTS

Figure 1A:
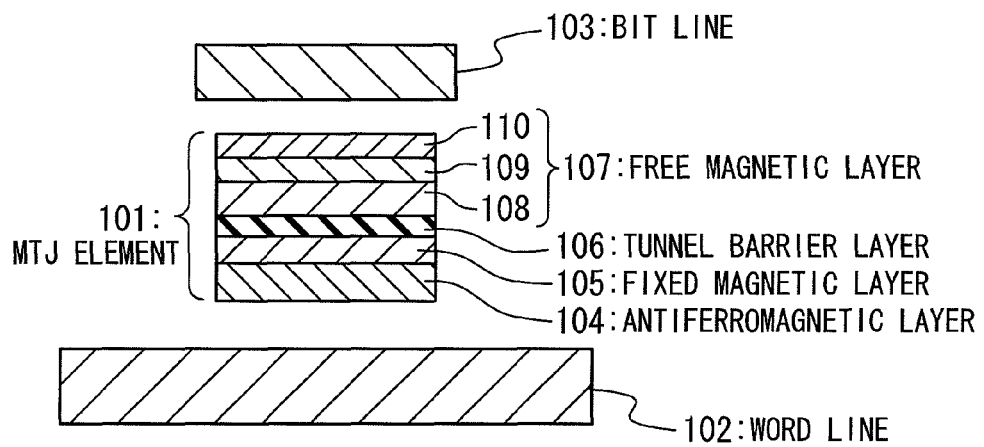
FIG. 1A is a sectional view showing an exemplary structure of a conventional MRAM.
Figure 1B:
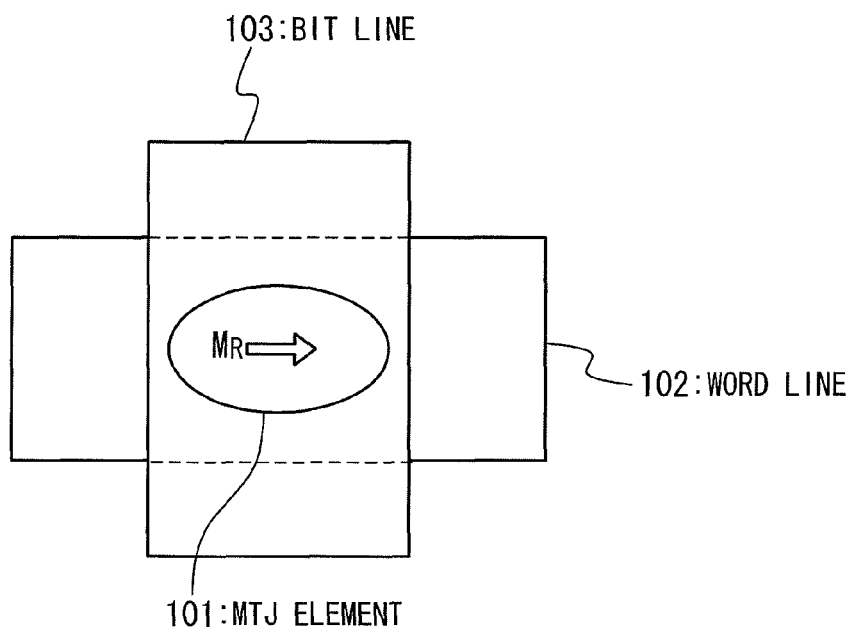
FIG. 1B is a plan view showing the exemplary structure of the conventional MRAM shown in FIG. 1A.
Figure 1C:
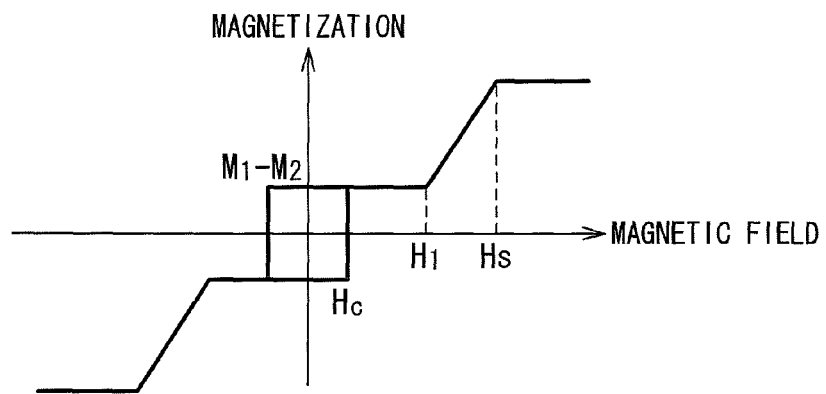
FIG. 1C is a magnetization curve of an SAF used as a free magnetic layer in an MRAM that adopts the asteroid writing.

A layered ferromagnetic structure according to the present invention is preferably applied to a free magnetic layer and/or a fixed magnetic layer in MRAM memory cells. In the following embodiments, preferred MRAM memory cell structures are explained in detail.

First Embodiment

FIG. 5A is a sectional view showing an exemplary structure of MRAM memory cells in a first embodiment of the present invention. An MRAM is composed of a substrate 1, a bottom electrode 2 formed on the substrate 1, an antiferromagnetic layer 3 formed of antiferromagnetic material, a fixed magnetic layer 4, a tunnel barrier layer 5, a free magnetic layer 6 and a top contact layer 7. The antiferromagnetic layer 3 fixes the magnetization of the fixed magnetic layer 4 by exchange interaction therebetween. The fixed magnetic layer 4 is composed of a single ferromagnetic layer or an SAF, and the magnetization(s) thereof is fixed by the antiferromagnetic layer 3.

The tunnel barrier layer 5 is composed of a very thin non-magnetic insulative layer. In this embodiment, many materials may be used for the tunnel barrier layer 5. In an aspect of the crystalline structure, the tunnel barrier layer 5 may be formed of amorphous or crystalline material. Specifically, the tunnel barrier layer 5 may be composed of an amorphous $AlO_x$ layer formed by oxidizing an aluminum film. Alternatively, a highly-oriented crystalline MgO layer having the NaCl structure may be used as the tunnel barrier layer 5. The use of a crystalline MgO layer exhibiting high (001) orientation as the tunnel barrier layer 5 advantageously achieves a high MR ratio of the magnetic tunnel junction. It should be noted that the present invention causes its advantageous effects, regardless of the material and crystalline structure of the tunnel barrier layer 5.

The free magnetic layer 6 is composed of an SAF including ferromagnetic layers having reversible magnetizations. The magnetizations of the free magnetic layer 6 are directed in the direction corresponding to data to be stored. The fixed magnetic layer 4, the tunnel barrier layer 5 and the free magnetic layer 6 constitute an MTJ element. The resistance of the MTJ element changes on the direction of the magnetizations of the ferromagnetic layers within the free magnetic layer 6, that is, the data stored onto the free magnetic layer 6, due to the tunnel magnetoresistance effect. The data is identified on the basis of the change in the resistance of the MTJ element.

Specifically, the free magnetic layer 6 is composed of a first ferromagnetic layer 11, a second ferromagnetic layer 13, and a non-magnetic layer 12 placed therebetween. The first ferromagnetic layer 11 is formed on the tunnel barrier layer 5. The first and second ferromagnetic layers 11 and 13 are both configured to exhibit the ferromagnetic behavior. The non-magnetic layer 12 is configured to provide the antiferromagnetic exchange coupling between the first and second ferromagnetic layers 11 and 13. In detail, the material and film thickness of the non-magnetic layer 12 are selected so that the first and second ferromagnetic layers 11 and 13 are antiferromagnetically coupled. In a preferred embodiment, the non-magnetic layer 12 is composed of a Ru film having a thickness of about 0.9 nm. As described below in detail, the MRAM structure in this embodiment addresses improving the crystal orientation of the non-magnetic layer 12. The improvement of the crystalline orientation of the non-magnetic layer 12 is important in order to enhance the exchange coupling between the first and second ferromagnetic layers 11 and 13.

In the MRAM structure of FIG. 5A, the first ferromagnetic layer 11 is composed of two ferromagnetic films 21, 23, and a buffer film 22 placed therebetween. The ferromagnetic films 21 and 23 are made of ferromagnetic material, such as permalloy (NiFe), and CoFe. The material and deposition method of the buffer film 22 are selected so that the crystalline orientation of the ferromagnetic film 23 deposited thereon is enhanced. The buffer film 22 allows the ferromagnetic film 23 to exhibit crystalline orientation higher than that of the ferromagnetic film 21, which is located below the buffer film 22. The improvement of the crystalline orientation of the ferromagnetic film 23 leads to the improvement of the crystalline orientation of the non-magnetic layer 12 formed thereon, and thereby effectively enhances the exchange coupling between the first and second ferromagnetic layers 11 and 13. The buffer film 22 may be formed of tantalum or ruthenium through a sputtering method. The details of the buffer film 22 will be described later.

The improvement of the crystalline orientation of the ferromagnetic film 23 by the buffer film 22 is essentially important for enhancing the exchange coupling between the first and second ferromagnetic layers 11 and 13. The ferromagnetic film 21 exhibits poor crystalline orientation, since being formed on the tunnel barrier layer 5 that is amorphous. The buffer film 22 effectively avoids the non-magnetic layer 12 being poorly-oriented because of the poor crystalline orientation of the ferromagnetic film 21. The buffer film 22 formed on the ferromagnetic film 21 improves the crystalline orientation of the ferromagnetic film 23 formed thereon and consequently improves the crystalline orientation of the non-magnetic layer 12 formed on the ferromagnetic film 23. The improvement in the crystalline orientation of the non-magnetic layer 12 effectively enhances the exchange coupling between the first and second ferromagnetic layers 11 and 13.

The buffer film 22 is formed so that the ferromagnetic films 21 and 23 are antiferromagnetically coupled. It should be noted that the configuration in which, the first ferromagnetic layers 11 functions as a single ferromagnetic layer, although incorporating the multiple ferromagnetic films 21 and 23.

As mentioned above, one requirement to be satisfied by the buffer film 22 is to improve the crystalline orientation of the ferromagnetic film 23 formed thereon, and another requirement is to ferromagnetically couple the ferromagnetic films 21 and 23. A first approach for satisfying these requirements is to form the buffer film 22 in accordance with the following two conditions (A1) and (A2):

(A1) The buffer film 22 is made of one material selected from the group consisting of tantalum (Ta), ruthenium (Ru), niobium (Nb), vanadium (V), osmium (Os), rhodium (Rh), iridium (Ir), titanium (Ti), zirconium (Zr), hafnium (Hf), copper (Cu), silver (Ag), gold (Au), chromium (Cr), molybdenum (Mo), tungsten (W), aluminum (Al), magnesium (Mg), silicon (Si), yttrium (Y), cerium (Ce), palladium (Pd), rhenium (Re), and alloys thereof.

(A2) The thickness of the buffer film 22 is extremely reduced. Preferably, the average thickness of the buffer film 22 is reduced down to 1.0 nm or less, more preferably down to 0.7 nm or less.

The use of the materials listed in the condition (A1) effectively improve the crystalline orientation of the ferromagnetic film 23 formed on the buffer film 22. As mentioned above, the improvement of the ferromagnetic film 23 is important in order to improve the crystalline orientation of the non-magnetic layer 12 formed thereon.

In addition, the reduction of the thickness of the buffer film 22 is important in order to allow the ferromagnetic films 21 and 23 to function as a single ferromagnetic layer.

When the ferromagnetic films 21 and 23 are formed of the permalloy (NiFe) or CoFe, it is especially preferable that the buffer film 22 is formed of one material selected from a group consisting of tantalum (Ta), niobium (Nb), zirconium (Zr), hafnium (Hf), molybdenum (Mo), tungsten (W), alloys thereof, and compounds of any of the elements and alloys. These materials especially exhibit enhanced effects for improving the crystal orientation of the permalloy (NiFe) film and the CoFe film which have the FCC (Face Center Cubic) structure, and the Fe-rich NiFe film which has the BCC (Body Center Cubic) structure. Therefore, the use of the above-listed materials for the buffer film 22 effectively improves the crystalline orientation of the ferromagnetic film 23 formed on the buffer film 22, and thereby improves the crystalline orientation of the non-magnetic layer 12 formed thereon. Additionally, the use of the elements selected from the group consisting of tantalum (Ta), niobium (Nb), zirconium (Zr), hafnium (Hf), molybdenum (Mo), and tungsten (W) provides the effect of improving the crystalline orientation of the ferromagnetic film 23 and the non-magnetic layer 12 and formed thereon, when the elements are included within buffer film 22 as compounds such as oxide, nitride and carbide, and also when the buffer film 22 is so thin that the thickness thereof is reduced down to 1.0 nm or less.

A second approach of satisfying the above-described two requirements is to form the buffer film 22 in accordance with the following two conditions (B1), and (B2):

(B1) The buffer film 22 is made of one material selected from a group consisting of ruthenium (Ru), chromium (Cr), rhenium (Re), rhodium (Rh), iridium (Ir), yttrium (Y), silver (Ag) and copper (Cu).

(B2) The thickness of the buffer film 22 is selected as the thickness which allows the buffer film 22 to exhibit the ferromagnetic exchange coupling.

Figure 4:
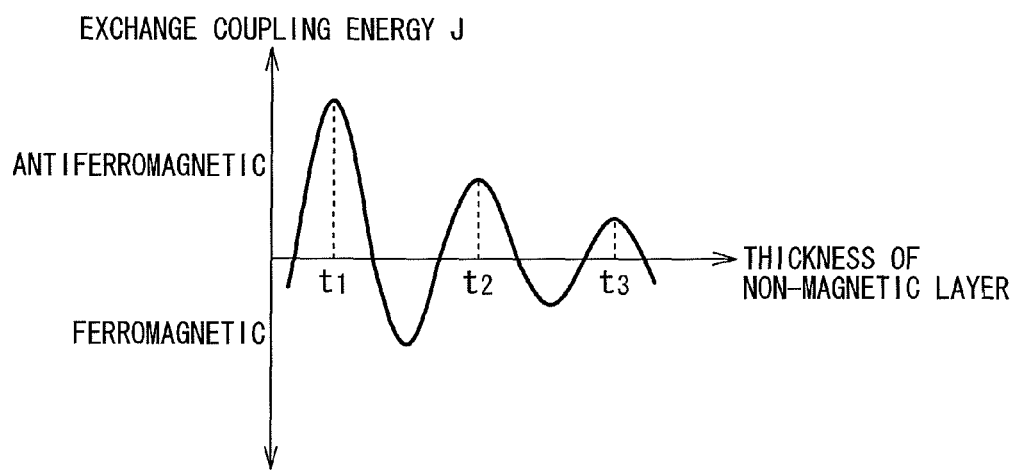
FIG. 4 is a graph showing a relation between a thickness of a non-magnetic layer and an exchange coupling energy.

As explained by referring to FIG. 4, the buffer film 22 provides the antiferromagnetic or ferromagnetic exchange coupling, depending on the thickness thereof, when one of the above-listed materials is used as the buffer film 22. The ferromagnetic exchange coupling is achieved by properly selecting the thickness of the buffer film 22.

This approach does not require the extreme reduction of the buffer film 22 in order to provide ferromagnetic coupling between the ferromagnetic films 21 and 23. Therefore, this approach is preferable in that the buffer film 22 is allowed to have a sufficient film thickness to be controlled. The fact that the buffer film 22 has a sufficient thickness is effective for further improving the crystalline orientation of the ferromagnetic film 23 formed thereon, and thereby improving the crystalline orientation of the non-magnetic layer 12.

A third approach of satisfying the above-described two requirements is to form the buffer film 22 with ferromagnetic material doped with material which exhibits effects for improving the crystalline orientation of a thin film disposed thereon. Specifically, the buffer film 22 is preferably formed of material whose composition is represented by a composition formula of $(FM)_{1-x}M_x$, where the material "FM" is selected from materials that exhibit the ferromagnetic property, specifically, selected from a group consisting of Ni, Fe and Co, and alloys thereof, and the material "M" is selected from a group consisting of tantalum (Ta), niobium (Nb), zirconium (Zr), hafnium (Hf), molybdenum (Mo), tungsten (W), and alloys thereof. The index "x" in the composition formula is determined so that the buffer film 22 provides exchange coupling between the ferromagnetic films 21 and 23, and exhibits the ferromagnetic property itself. In one preferred embodiment, permalloy (NiFe) is selected as the material "FM", and tantalum (Ta) or zirconium (Zr) is selected as the material "M". The index "x" is more than 5% and is equal to or less than 25%.

The buffer film 22 having such composition effectively improves the crystalline orientation of the ferromagnetic film 23 by the effect of the elements listed above (namely, Ta, Nb, Zr, Hf, Mo and W), and consequently improves the crystalline orientation of the non-magnetic layer 12. In addition, the ferromagnetic films 21 and 23 are ferromagnetically coupled automatically, since the buffer film 22 itself is formed of ferromagnetic material, regardless of the film thicknesses thereof. This is effective for improving the crystalline orientation of the ferromagnetic film 23 formed thereon and the non-magnetic layer 12 through increasing the film thickness of the buffer film 22.

As compared with the buffer film 22 made of only non-magnetic elements, an advantage of the buffer film 22 made of the ferromagnetic material doped with one or more materials selected from Ta, Nb, Zr, Hf, Mo and W is that the enhancement of the exchange coupling between the first and second ferromagnetic layers 11 and 13 is achieve with a relatively small amount of non-magnetic element. The elements having the effect for improving the crystalline orientation is typically refractory metal which is hard to be etched. Thus, the reduction of the total amount of the above-listed materials is effective in order to make the MRAM manufacture process easy.

The inventors have experimentally confirmed advantages of the buffer film 22 made of the ferromagnetic material doped with one material selected from Ta, Nb, Zr, Hf, Mo and W. The inventors have measured saturation magnetic fields $H_s$ and exchange coupling energies J for an SAF structure in which the first ferromagnetic layer 11 is composed of two NiFe films separated by a buffer film composed of a Ta film of 0.3 nm, and for another SAF structure in which the first ferromagnetic layer 11 is composed of two NiFe films separated by a buffer film composed of a $(NiFe)_{85}Ta_{15}$ film of 1.0 nm. It should be noted that the $(NiFe)_{85}Ta_{15}$ film of 1 nm corresponds to a Ta film of 0.15 nm from the viewpoint of the total amount of the Ta element. When the buffer film 22 is composed of the Ta film of 0.3 nm, the saturation magnetic field $H_s$ is 203 (Oe), and the exchange coupling energy J is 0.01166 (erg/cm$^2$). On the other hand, when the buffer film 22 is composed of the $(NiFe)_{85}Ta_{15}$ film of 1.0 nm, the saturation magnetic field $H_s$ is 192 (Oe), and the exchange coupling energy J is 0.01519 (erg/cm$^2$). As thus described, the saturation magnetic fields $H_s$ and the exchange coupling energies J of these two SAF are substantially same. This implies that the use of ferromagnetic element doped with element that exhibits the crystalline-orientation-improving effect for the buffer film 22 effectively achieves the effect of the increase in the exchange coupling energy J with the reduced amount of the non-magnetic element.

When the buffer film 22 is formed of the ferromagnetic material doped with element having the crystalline-orientation improving effect (namely, Ta, Nb, Zr, Hf, No and W), as shown in FIG. 7A, the buffer film 22 may be directly formed on the tunnel barrier layer 5. In this case, the ferromagnetic film 21 is removed form the first ferromagnetic layer 11. Such structure also improves the crystalline orientation of the ferromagnetic film 23 formed thereon, and consequently improves the crystalline orientation of the non-magnetic layer 12. The structure shown in FIG. 7A is rather preferable in that the number of the films within the first ferromagnetic layer 11 is reduced.

It should be noted that there is a special importance in the fact that the buffer film 22 is formed of ferromagnetic material when the buffer film 22 is directly formed on the tunnel barrier layer 5 as shown in FIG. 7A. In the structure of FIG. 7A, the MR ratio of the MTJ element is undesirably decreased when the buffer film 22 is formed of non-magnetic material (for example, Ta, Nb, Zr, Hf, Mo, W and so on). The decrease in the MR ratio is undesirable because it deteriorate the read operation reliability of the MRAM.

Moreover, the buffer film 22 may be formed so as to be in direct contact with the non-magnetic layer 12 as shown in FIG. 7B, when the buffer film 22 is formed of ferromagnetic material doped with element having the crystalline-orientation-improving effect. In this case, the ferromagnetic film 23 is removed from the first ferromagnetic layer 11. Such structure also improves the crystalline orientation of the non-magnetic layer 12, due to the effect of the buffer film 22. The structure of FIG. 7B is rather preferable in that the number of the films within the first ferromagnetic layer 11 is reduced.

It should be noted that there is a special importance in that the buffer film 22 is formed of ferromagnetic material, when the buffer film 22 is in direct contact with the non-magnetic layer 12 as shown in FIG. 7B. The antiferromagnetic exchange coupling is not exerted between the first and second ferromagnetic layers 11 and 13 through the non-magnetic layer 12, if the buffer film 22 were formed of non-magnetic material. This undesirably prevents the free magnetic layer 6 from functioning as an SAF.

Figure 6:
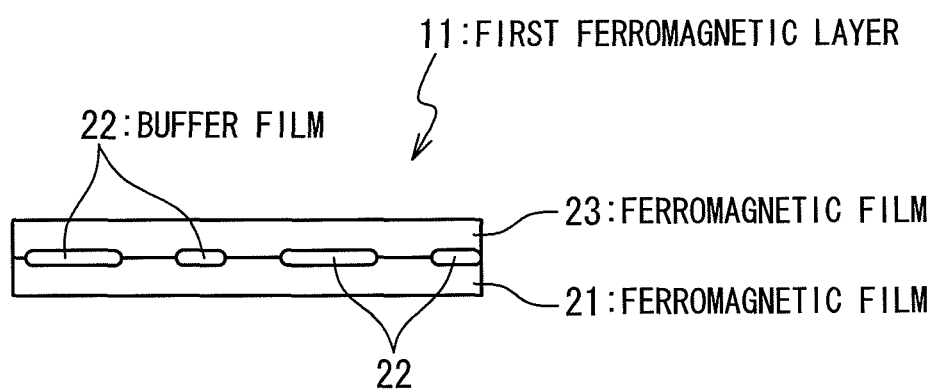
FIG. 6 is a sectional view showing a typical structure of a buffer film.

It should be noted that the buffer film 22 may be discontinuous as shown in FIG. 6, typically exhibiting island growth, when the thickness of the buffer film 22 is extremely thin. The discontinuous buffer film 22 also improves the crystalline orientation of the ferromagnetic film 23 formed thereon. The discontinuous buffer film 22 is rather effective for providing ferromagnetic coupling between the ferromagnetic films 21 and 23. The discontinuous structure of the buffer film 22 allows the ferromagnetic films 21 and 23 to be partially directly contacted with each other. The partial direct contact provides the ferromagnetic coupling between the ferromagnetic films 21 and 23.

In this embodiment, a plurality of buffer layers may be inserted into the first ferromagnetic layer 11. As shown in FIG. 5B, for example, the first ferromagnetic layer 11 may be composed of three ferromagnetic films 21, 23 and 25, and buffer layers 22 and 24 placed therebetween. The insertion of the multiple buffer layers effectively enhances the crystalline orientation of the ferromagnetic layer 25 positioned at the top of the first ferromagnetic layer 11, and thereby further improves the crystalline orientation of the non-magnetic layer 12.

As thus described, the enhancement of the crystalline orientation of the non-magnetic layer 12 is important. In addition to that, it is significantly preferable that the non-magnetic layer 12 is highly-oriented so that the closest packed face orients perpendicular to the film plane. For example, when the non-magnetic layer 12 is formed of a ruthenium (Ru) film, which exhibits the HCP structure (hexagonal closed packed structure), it is advantageous to enhance the HCP (001) orientation of the ruthenium film. When NiFe alloy films are used as the ferromagnetic layers 11 and 12 within the layered ferromagnetic structure and an amorphous $AlO_x$ film is used as the tunnel barrier layer 5, the first ferromagnetic layer 11 exhibits no clear crystalline orientation plane, and thus the non-magnetic layer 12 also exhibits poor orientation. This undesirably deteriorates the exchange coupling between the ferromagnetic layers 11 and 12. The same applies to the case when a crystalline MgO film is used as the tunnel barrier layer 5. Although providing the first ferromagnetic layer 11 with relatively high (111) orientation perpendicular to the film plane, compared to the amorphous $AlO_x$ film, the use of crystalline MgO film exhibiting high (001) orientation for achieving high MR ratio does not provide the first ferromagnetic layer 11 with sufficiently high (111) orientation perpendicular to the film plane. Specifically, inventors' experiments have confirmed that the first ferromagnetic layer 11 includes regions where the plane except the closest-packed face, such as the (001) plane and so forth, orients perpendicular to the film plane, and regions where the (111) direction is slightly inclined from the perpendicular to the film plane. This prevents the first ferromagnetic layer 11 from exhibiting sufficiently high (111) orientation. This can be inferred from the fact that the excellent lattice matching cannot be obtained due to the crystal structures of the MgO and NiFe alloy. This makes difficult to deposit the Ru film so that the Ru film exhibits the (001) orientation, which provides the closest-packed face on the film surface. The SAF structure of the present invention deals with such situations; the SAF structure in this embodiment switches the crystalline orientations and/or enhances preferred crystalline orientations within the SAF, and thereby enhances the (001) orientation of the Ru film to consequently obtain the strong antiferromagnetic coupling. In summary, the SAF structure in this embodiment stably enhances the (001) crystalline orientation of the Ru film regardless of the underlayer structure.

Second Embodiment

One issue of the structure of the free magnetic layer 6 shown in FIG. 5A is the difference in the characteristics between the first and second ferromagnetic layers 11 and 13 resulting from the structure difference therebetween. The large difference in the characteristics between the first and second ferromagnetic layers 11 and 13, especially, the large difference in the crystal magnetic anisotropy and the magnetization-and-thickness product is undesirable for implementing the toggle writing.

Figure 8:
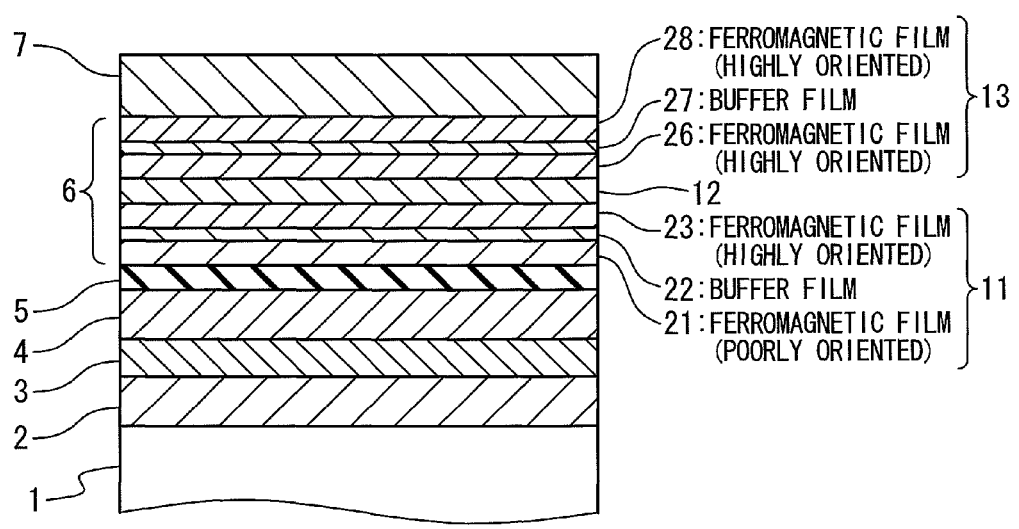
FIG. 8 is a sectional view showing an exemplary structure of an MRAM in a second embodiment of the present invention.

In a second embodiment, a technique is provided for reducing the difference in the characteristics between the first and second ferromagnetic layers 11 and 13. Specifically, in the second embodiment, as shown in FIG. 8, the second ferromagnetic layer 13 is composed of a plurality of ferromagnetic films 26, 28, and a buffer film 27 placed therebetween. It should be noted that the structure of the first ferromagnetic layer 11 may be any of the structures shown in FIGS. 5A, 5B, 7A and 7B. The ferromagnetic films 26 and 28 are formed of ferromagnetic material, such as permalloy (NiFe) and CoFe. The buffer film 27 is formed of material that enhances the crystalline orientation of the ferromagnetic film 28, such as tantalum or ruthenium, and thereby maintains the ferromagnetic coupling between the ferromagnetic films 26 and 28. The thickness of the buffer film 27 is properly selected to provide ferromagnetic coupling between the ferromagnetic films 26 and 28. Such structure allows the second ferromagnetic layer 13 to be have a structure similar/or identical to that of the first ferromagnetic layer 11, and thereby reduces the difference in the characteristics between the first and second ferromagnetic layers 11 and 13.

Figure 9:
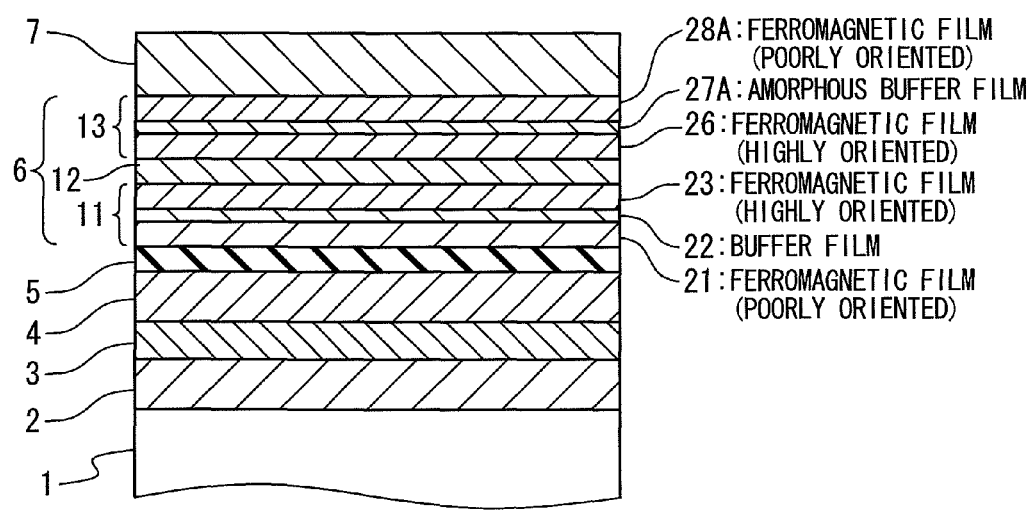
FIG. 9 is a sectional view showing a preferable structure of the MRAM in the second embodiment of the present invention.

FIG. 9 shows another structure for further reducing the difference in the characteristics between the first and second ferromagnetic layers 11 and 13. In the structure of FIG. 8, both of the ferromagnetic films 26 and 28 included in the second ferromagnetic layer 13 are highly-oriented, because the ferromagnetic films 26 and 28 are both formed on the non-magnetic layer 12, which exhibits high crystalline orientation. As for the first ferromagnetic layer 11, on the other hand, the ferromagnetic film 21 exhibits poor crystalline orientation as mentioned above. This concludes that there is a difference in the crystalline structure between the first and second ferromagnetic layers 11 and 13. The structure of FIG. 9 is intended to reduce the difference in the structure between the first and second ferromagnetic layers 11 and 13, from the viewpoint of the crystalline orientations of the ferromagnetic films incorporated therein.

In detail, in the structure of FIG. 9, the second ferromagnetic layer 13 is composed of ferromagnetic films 26, 28A, and an amorphous buffer film 27A placed therebetween. The amorphous buffer film 27A is formed to be amorphous, namely, to have no crystalline orientation. In such structure, the ferromagnetic film 28A exhibits poor crystalline orientation, since the ferromagnetic film 28A is formed on the amorphous buffer film 27A having no crystalline orientation. Thus, in the structure of FIG. 9, the first and second ferromagnetic layers 11 and 13 is each composed of one poorly-oriented ferromagnetic film (namely, the ferromagnetic film 21 or 28A), and one highly-oriented ferromagnetic film (namely, the ferromagnetic film 23 or 26), and this reduces the difference in the structure between the first and second ferromagnetic layers 11 and 13. The reduction in the structure difference is preferable for reducing the characteristics difference between the first and second ferromagnetic layers 11 and 13.

The amorphous buffer film 27A may be a very thin film formed of non-magnetic amorphous material, such as SiN, AlN and AlO$_x$. When the amorphous buffer film 27A is made of the non-magnetic material, the fact that the amorphous buffer film 27A is formed at the very thin film thickness is important in order to provide ferromagnetic coupling between the ferromagnetic films 26 and 28A. The amorphous buffer film 27A is not required to be continuous in order to ferromagnetically couple the ferromagnetic films 26 and 28A. Rather, the fact that the amorphous buffer film 27A exhibits the island structure is preferable as mentioned above.

The amorphous buffer film 27A may be also made of amorphous ferromagnetic material, such as NiFeTaO$_x$, NiFeTaN$_x$, CoFeB, and NiFeB. The fact that the amorphous buffer film 27A is formed of the amorphous ferromagnetic material is advantageous in that the ferromagnetic films 26 and 28A are ferromagnetically coupled even when the thickness of the amorphous buffer film 27A increased.

Although the amorphous buffer film 27A deteriorates the crystalline orientation of the ferromagnetic film 28A formed thereon, there is a case that the excessive deterioration of the crystalline orientation of the ferromagnetic film 28A is not preferable. The crystalline orientation of the ferromagnetic film 28A is desired to be flexibly controllable on the basis of desired characteristics.

Figure 10:
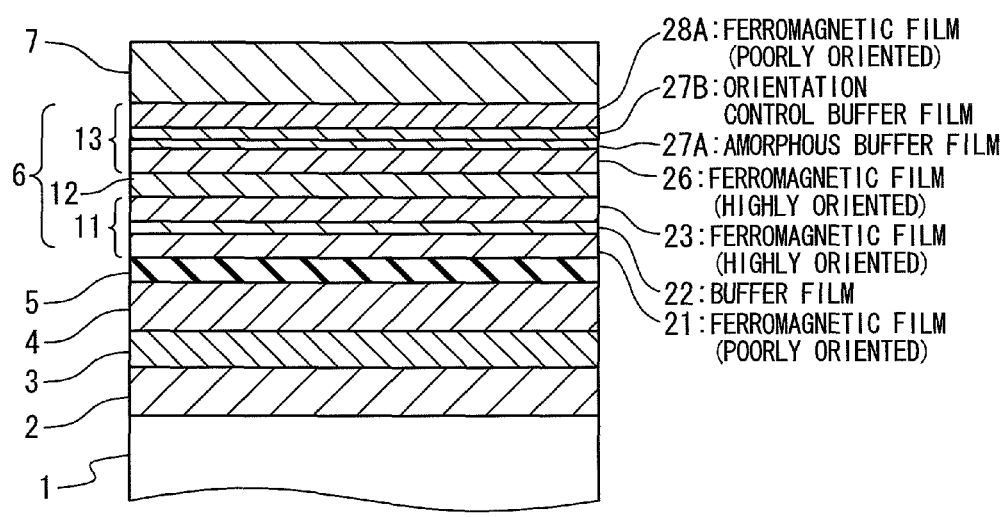
FIG. 10 is a sectional view showing another preferable structure of the MRAM in the second embodiment of the present invention.

In order to control the crystalline orientation of the ferromagnetic film 28A, as shown in FIG. 10, it is preferable that an orientation control buffer film 27B is inserted between the amorphous buffer film 27A and the ferromagnetic film 28A. The orientation control buffer film 27B may be formed of a film that enhances the crystalline orientation of the ferromagnetic film formed thereon, such as a tantalum film or a ruthenium film. Such structure allows the ferromagnetic film 28A to exhibit properly controlled crystalline orientation. Specifically, the formation of the thick orientation control buffer film 27B enhances the crystalline orientation of the ferromagnetic film 28A. On the contrary, the formation of the thin orientation control buffer film 27B deteriorates the crystalline orientation of the ferromagnetic film 28A.

Figure 11A:
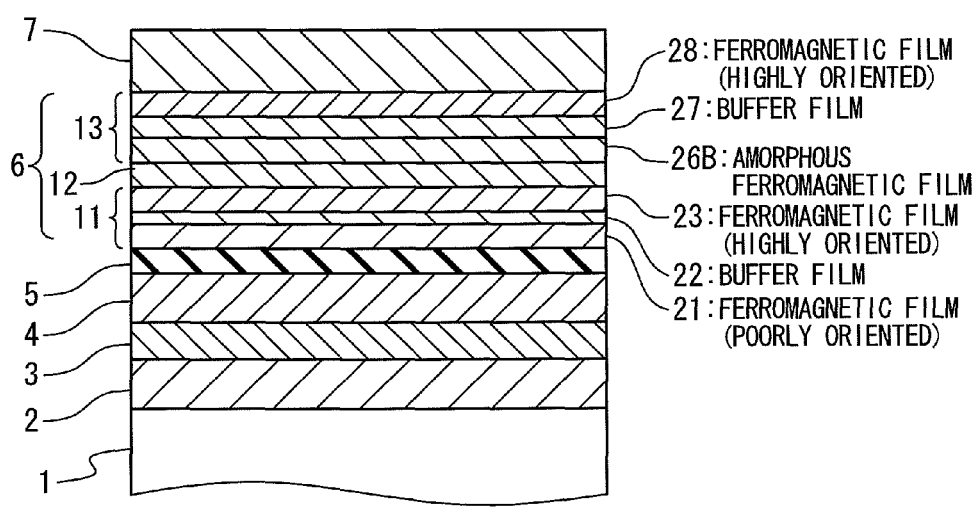
FIG. 11A is a sectional view showing still another preferable structure of the MRAM in the second embodiment of the present invention.

FIG. 11A shows another structure for further reducing the difference in the characteristics between the first and second ferromagnetic layers 11 and 13. In the structure of FIG. 11A, the second ferromagnetic layer 13 is composed of an amorphous ferromagnetic layer 26B, a buffer film 27 and a ferromagnetic film 28. The amorphous ferromagnetic layer 26B is typically formed of NiFeTaO$_x$, NiFeTaN$_x$, CoFeB, and NiFeB. The buffer film 27 is formed of material that enhances the crystalline orientation of the ferromagnetic film 28 and thereby maintains ferromagnetic coupling between the ferromagnetic films 26 and 28, such as tantalum, and ruthenium. In such structure, the second ferromagnetic layer 13 is composed of one ferromagnetic film exhibiting no crystalline orientation (namely, the ferromagnetic film 26B) and another highly-oriented ferromagnetic film (namely, the ferromagnetic film 28), and the difference in the structure between the first and second ferromagnetic layers 11 and 13 is reduced in view of the crystalline orientation.

Figure 11B:
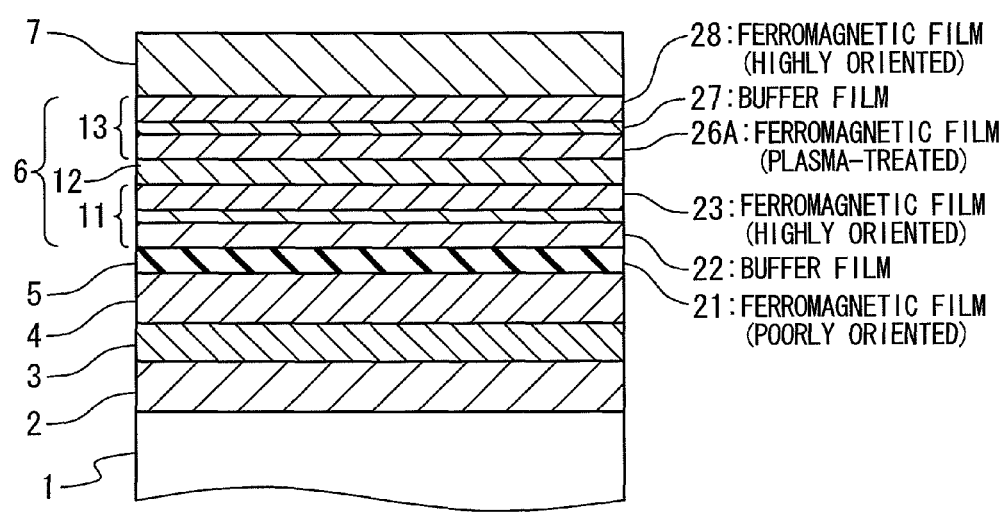
FIG. 11B is a sectional view showing still another preferable structure of the MRAM according to the second embodiment of the present invention.

FIG. 11B shows still another structure for reducing the difference in the characteristics between the first and second ferromagnetic layers 11 and 13. In the structure of FIG. 11B, the second ferromagnetic layer 13 is composed of ferromagnetic films 26A, 28 and a buffer film 27 placed therebetween. The ferromagnetic film 26A is subjected to a plasma treatment after the ferromagnetic film 26A is deposited, to deteriorate the crystalline orientation thereof. The buffer film 27 is formed of material that enhances the crystalline orientation of the ferromagnetic film 28 and thereby maintains ferromagnetic coupling between the ferromagnetic films 26A and 28. In such structure, the second ferromagnetic layer 13 is composed of one poorly-oriented ferromagnetic film (namely, the ferromagnetic film 26A), and one highly-oriented ferromagnetic film (namely, the ferromagnetic film 28). This effectively reduces the difference in the structure between the first and second ferromagnetic layers 11 and 13 from the viewpoint of the crystalline orientation, and thereby reduces the characteristics difference between the first and second ferromagnetic layers 11 and 13.

Third Embodiment

In a third embodiment, a technique is provided in which three or more ferromagnetic layers are incorporated within the free magnetic layer 6. The increase in the number of the ferromagnetic layers within free magnetic layer 6 is effective for avoiding undesirable magnetization reversal of the free magnetic layer 6 due to the thermal activation, because it increases the total volume of the ferromagnetic layers within the free magnetic layer 6. As described later, it should be noted that the term "ferromagnetic layer" described here means to include the layer in which adjacent two ferromagnetic films are antiferromagnetically coupled.

FIG. 12 shows an exemplary MRAM structure in which the free magnetic layer 6 is composed of the three ferromagnetic layers: a first ferromagnetic layer 11, a second ferromagnetic layer 13 and a third ferromagnetic layer 15. A non-magnetic layer 12 is inserted between the first and second ferromagnetic layers 11 and 13, and another non-magnetic layer 14 is inserted between the second and third ferromagnetic layers 13 and 15. The non-magnetic layer 12 is designed to provide antiferromagnetic coupling between the first and second ferromagnetic layers 11 and 13. Correspondingly, the non-magnetic layer 14 is designed to provide antiferromagnetic coupling between the second and third ferromagnetic layers 13 and 15. The first ferromagnetic layer 11 is composed of: ferromagnetic films 21, 23; and a buffer film 22 placed therebetween. The buffer film 22 is designed to enhance the crystalline orientation of the ferromagnetic film 23 and to thereby enhance the crystalline orientation of the non-magnetic layer 12 formed thereon. The second and third ferromagnetic layers 13 and 15 are each composed of a single-layered ferromagnetic film.

In the structure of FIG. 12, all the layers positioned on or above the buffer film 22, that is, the ferromagnetic film 23, the non-magnetic layer 12, the second ferromagnetic layer 13, the non-magnetic layer 14 and the third ferromagnetic layer 15, exhibit high crystalline orientations. This is preferable in that the strong antiferromagnetic couplings are exerted between the first and second ferromagnetic layers 11 and 13, and between the second and third ferromagnetic layers 13 and 15.

However, the structure shown in FIG. 12 suffers from a problem that the crystalline orientations of the respective layers (or film) are more enhanced as the distance from the buffer film 22 increases. That is, a layer deposited later exhibits higher crystalline orientation than another layer deposited before. In detail, the structure of FIG. 12 may result in the following two problems.

One problem is that the crystalline orientation of the non-magnetic layer 14 may be higher than the crystalline orientation of the non-magnetic layer 12. The difference in the crystalline orientation between the non-magnetic layers 12 and 14 may cause the difference of the strength of the antiferromagnetic coupling between the first and second ferromagnetic layers 11 and 13 from that between the second and third ferromagnetic layers 13 and 15. This may cause a writing error when the toggle writing is implemented. In the toggle writing, it is important that the ferromagnetic layers within the free magnetic layer 6 operate as a single magnetic structure. The non-uniformity in the magnitudes of the antiferromagnetic couplings is not preferred, because it may cause only some, not all of the ferromagnetic layers within the free magnetic layer 6 to be selectively flopped.

Another problem is that the difference in the structure among the first to third ferromagnetic layers 11, 13 and 15 may be too large from the viewpoint of the crystalline orientations. The first ferromagnetic layer 11 includes the ferromagnetic film 21, which is poorly-oriented. On the other hand, the second ferromagnetic layer 13 is composed of a highly-oriented ferromagnetic film. In addition, the third ferromagnetic layer 15 is composed of a ferromagnetic film having higher crystalline orientation than that of the second ferromagnetic layer 13. This undesirably increases the characteristics difference among the first to third ferromagnetic layers 11, 13, and 15, especially, the difference in the crystal magnetic anisotropy.

Figure 13:
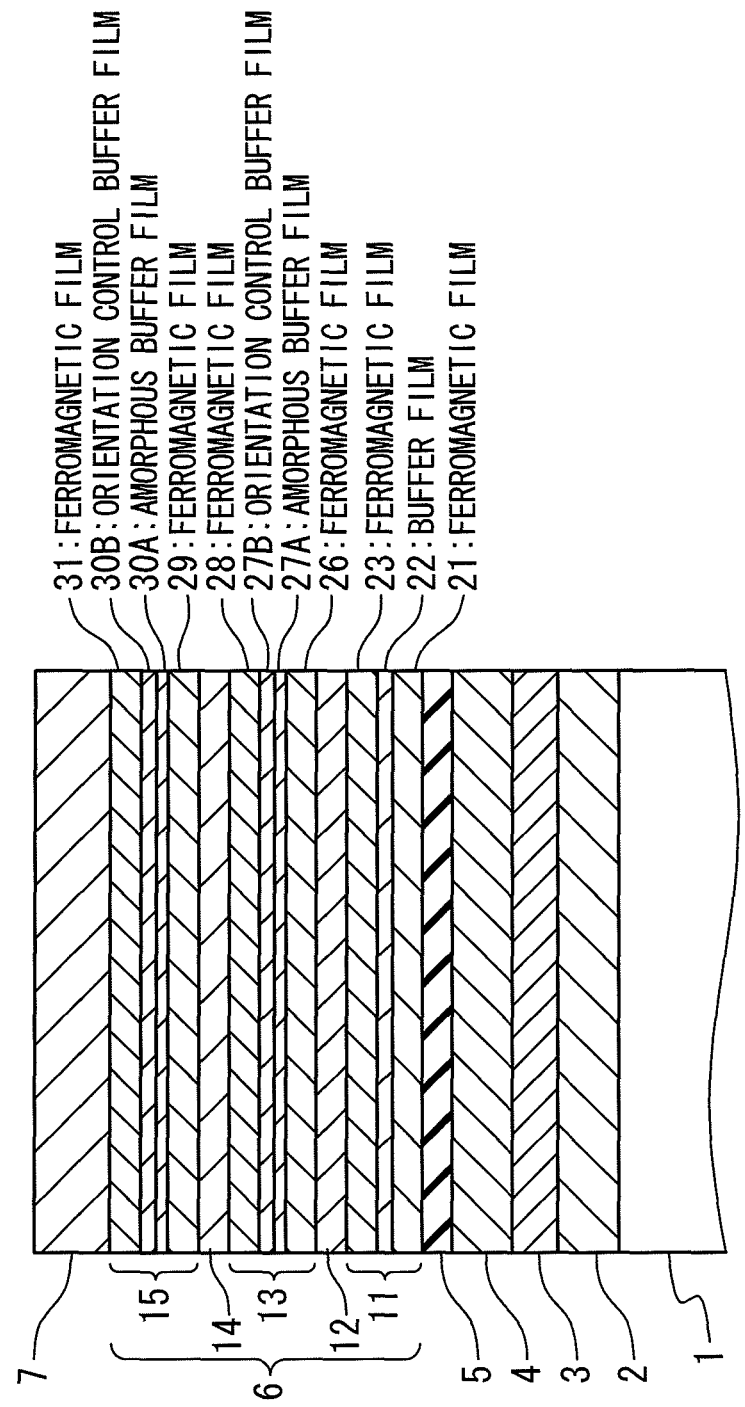
FIG. 13 is a graph showing an asteroid curve corresponding to a switching magnetic field ($H_c$)

FIG. 13 shows an exemplary structure for dealing with these problems. The structure of FIG. 13 addresses controlling the crystal orientations of the ferromagnetic films within the second ferromagnetic layer 13 and thereby controlling the strength of the antiferromagnetic coupling between the second and third ferromagnetic layers 13 and 15, namely, the exchange coupling energy J therebetween. Specifically, in the MRAM shown in FIG. 13, the second ferromagnetic layer 13 is composed of ferromagnetic films 21, 23, an amorphous buffer film 27A, and an orientation control buffer film 27B. The amorphous buffer film 27A and the orientation control buffer film 27B are inserted between the ferromagnetic films 21 and 23. Correspondingly, the third ferromagnetic layer 15 is composed of ferromagnetic films 29, 31, an amorphous buffer film 30A and an orientation control buffer film 30B. The amorphous buffer film 30A and the orientation control buffer film 30B are inserted between the ferromagnetic films 29 and 31.

The amorphous buffer film 27A and the orientation control buffer film 27B, which are inserted into the second ferromagnetic layer 13, effectively reduce the difference in the crystalline orientation between the non-magnetic layers 12 and 14. The amorphous buffer film 27A is composed of an amorphous thin film, such as $SiO_x$, while the orientation control buffer film 27B is composed of material that enhances the crystalline orientation, such as a tantalum film and a ruthenium film. The amorphous buffer film 27A avoids the crystalline orientation of the ferromagnetic film 28 being influenced by the crystalline orientation of the ferromagnetic film 26. In detail, the ferromagnetic film 26 within the second ferromagnetic layer 13 is highly-oriented due to the effect of the buffer film 22 within the first ferromagnetic layer 11; however, the amorphous buffer film 27A, inserted between the ferromagnetic film 26 and the ferromagnetic film 28, separates the crystalline structure of the ferromagnetic film 28 from that of the ferromagnetic film 26. The orientation control buffer film 27B provides desired crystalline orientation for the ferromagnetic film 28. The increase in the thickness of orientation control buffer film 27B allows the ferromagnetic film 28 formed thereon to have a high crystalline orientation. The decrease in the thickness of the orientation control buffer film 27B, on the other hand, allows the ferromagnetic film 28 to have a poor crystalline orientation. As thus described, the amorphous buffer film 27A and the orientation control buffer film 27B provides flexible control of the crystalline orientation of the ferromagnetic film 28, and thereby reduce the difference in the crystalline orientation between the non-magnetic layers 12 and 14. In addition, the amorphous buffer film 27A and the orientation control buffer film 27B provides flexible control of the crystalline orientation of the ferromagnetic film 28, and thereby reduce the difference in the structure between the first and second ferromagnetic layers 11 and 13, from the viewpoint of the crystalline orientation. It should be noted that the structure of the second ferromagnetic layer 13 shown in FIG. 11A may be used instead of that shown in FIG. 13.

On the other hand, the amorphous buffer film 30A and the orientation control buffer film 30B, which are inserted into the third ferromagnetic layer 15, addresses controlling the crystal orientations of the ferromagnetic films within the third ferromagnetic layer 15. Similarly to the second ferromagnetic layer 13, the amorphous buffer film 30A is composed of an amorphous thin film, such as $SiO_x$. The orientation control buffer film 30B is formed of material that enhances the crystalline orientation of the thin film formed thereon, such as a tantalum film and a ruthenium film. The amorphous buffer film 30A and the orientation control buffer film 30B provides flexible control of the crystalline orientation of the ferromagnetic film 31 formed thereon, due to the effect similar to the amorphous buffer film 27A and the orientation control buffer film 27B within the second ferromagnetic layer 13. This effectively reduces the difference in the structure among the first to third ferromagnetic layers 11, 13, and 15, from the viewpoint of the crystalline orientation.

Figure 14:
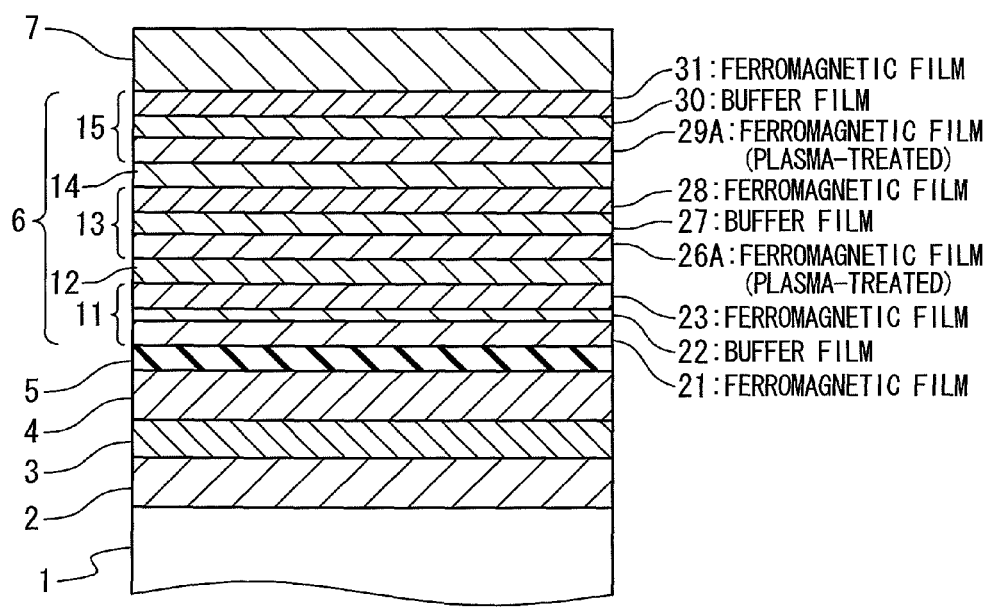
FIG. 14 is a sectional view showing another preferable structure of the MRAM in the third embodiment of the present invention.

FIG. 14 shows another structure that reduce the difference in the structure among the first to third ferromagnetic layers 11, 13 and 15, while dealing with the problems with regard to the crystal orientations of the layers (or films) formed on or above the buffer film 22. In the MRAM shown in FIG. 14, the second ferromagnetic layer 13 is composed of ferromagnetic films 26A, 28, and a buffer film 27 inserted therebetween. The ferromagnetic film 26A is subjected to a plasma treatment after being deposited, to thereby deteriorate the crystalline orientation thereof. The buffer film 27 is formed of material that enhances the crystalline orientation of the ferromagnetic film 28 and thereby maintains ferromagnetic coupling between the ferromagnetic films 26A and 28. The crystalline orientation of the ferromagnetic film 28 can be controlled on the thickness of the buffer film 27. Correspondingly, the third ferromagnetic layer 15 is composed of ferromagnetic films 29A, 31, and a buffer film 30 inserted therebetween. The ferromagnetic film 29A is subjected to a plasma treatment after being deposited, to thereby deteriorate the crystalline orientation. The buffer film 30 is formed of material that enhances the crystalline orientation of the ferromagnetic film 31 and thereby maintains the ferromagnetic coupling between the ferromagnetic films 29A and 31. The crystalline orientation of the ferromagnetic film 31 can be controlled on the thickness of the buffer film 30.

In such structure, the crystalline orientation of the non-magnetic layer 14 is controlled by the degree of the plasma treatment performed on the ferromagnetic film 26A, and thus the difference in the crystalline orientation between the non-magnetic layers 12 and 14 is effectively reduced. For example, the crystalline orientation of the non-magnetic layer 14 is more deteriorated by subjecting the ferromagnetic film 26A to the plasma treatment for a long time. On the contrary, the crystalline orientation of the non-magnetic layer 14 is less deteriorated when the ferromagnetic film 26A is subjected to a plasma treatment for a short time.

In addition, the structure shown in FIG. 14 effectively reduces the difference in the structure among the first to third ferromagnetic layers 11, 13, and 15 from the viewpoint of the crystalline orientation, because of the plasma treatments performed on the ferromagnetic film 26A of the second ferromagnetic layer 13 and the ferromagnetic film 29A of the third ferromagnetic layer 15. It should be noted that the plasma treatments on the ferromagnetic films 26A and 29A allow the first to third ferromagnetic layers 11, 13 and 15 to each incorporate one highly-oriented ferromagnetic film (namely, the ferromagnetic films 21, 26A or 29A) and another poorly-oriented ferromagnetic film (namely, the ferromagnetic films 23, 28 or 31), as is understood from FIG. 14.

Figure 15:
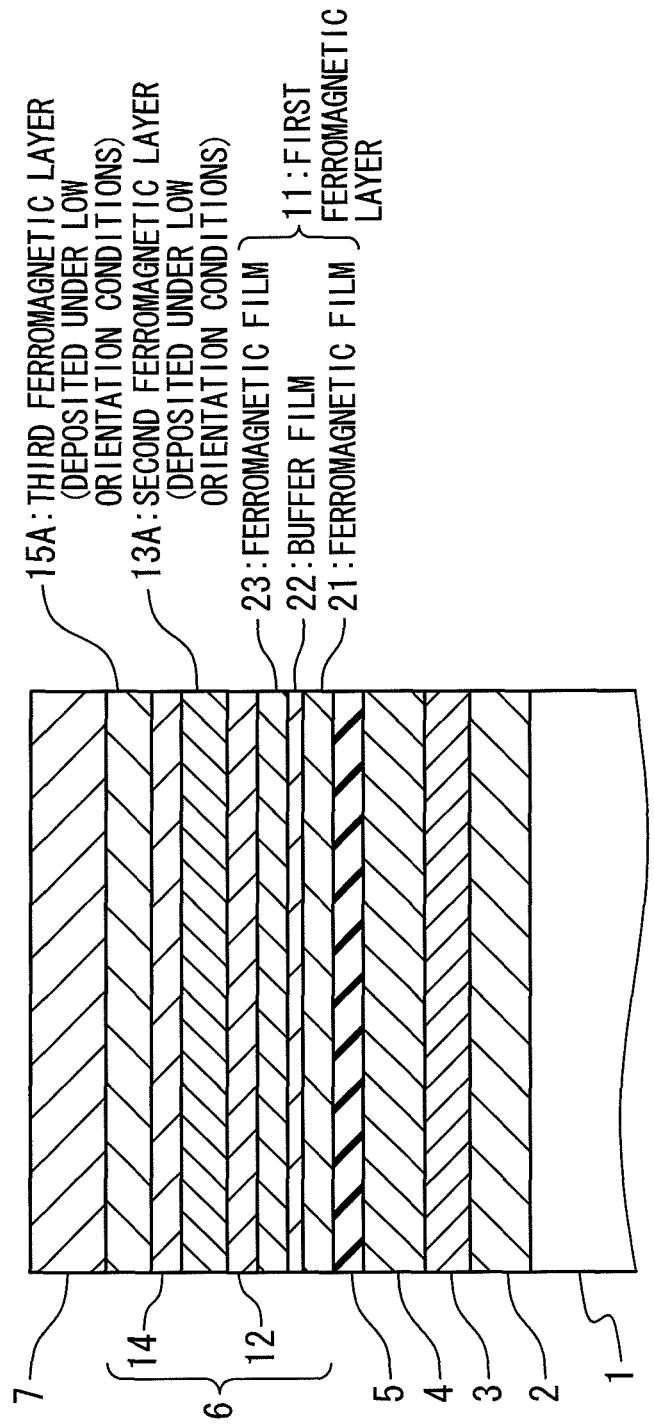
FIG. 15 is a sectional view showing still another preferable structure of the MRAM in the third embodiment of the present invention.

Although being preferable for dealing with the problems with regard to the crystal orientations of the layers (or films) formed on or above the buffer film 22, the structures shown in FIGS. 13, 14 suffer from structure complexity. FIG. 15 shows an exemplary MRAM structure addressing structure simplicity, dealing with the problems with regard to the crystal orientations of the layers (or films) formed on or above the buffer film 22.

In the MRAM shown in FIG. 15, the free magnetic layer 6 is composed of first to third ferromagnetic layer 11, 13A and 15A; and non-magnetic layers 12, 14 placed therebetween. The second and third ferromagnetic layers 13A and 15A are deposited under conditions in which the second and third ferromagnetic layers 13A and 15A do not exhibit excessively high crystalline orientations. Specifically, the second and third ferromagnetic layers 13A and 15A are formed by a sputtering method using sputter gas to which a slight amount of oxygen or nitrogen is added. Alternatively, the second and third ferromagnetic layers 13A and 15A may be formed of ferromagnetic material doped with a slight amount of non-magnetic material.

The structure shown in FIG. 15 effectively prevents the non-magnetic layer 14 from having excessively high crystalline orientation, due to the properly controlled crystalline orientation of the second ferromagnetic layer 13A. Therefore, the difference in the crystalline orientation is effectively reduced between the non-magnetic layers 12 and 14.

In addition, the crystalline orientations of the second and third ferromagnetic layer 13A and 15A are properly controlled in the structure shown in FIG. 15, and the difference in the structure is effectively reduced among the first to third ferromagnetic layers 11, 13 and 15, from the viewpoint of the crystalline orientation.

It should be understood that the number of the ferromagnetic layers is not limited to three, although FIGS. 12 to 14 show the structures in which the number of the ferromagnetic layers is 3. It is apparent to those skilled in the art that the free magnetic layer 6 may incorporate four or more ferromagnetic layers. In this case, the ferromagnetic layers except for the ferromagnetic layer in contact with the tunnel barrier layer 5

(namely, the first ferromagnetic layer 11) are configured similarly to the structure of the second ferromagnetic layer 13 (or the third ferromagnetic layer 15).

Fourth Embodiment

Figure 16:
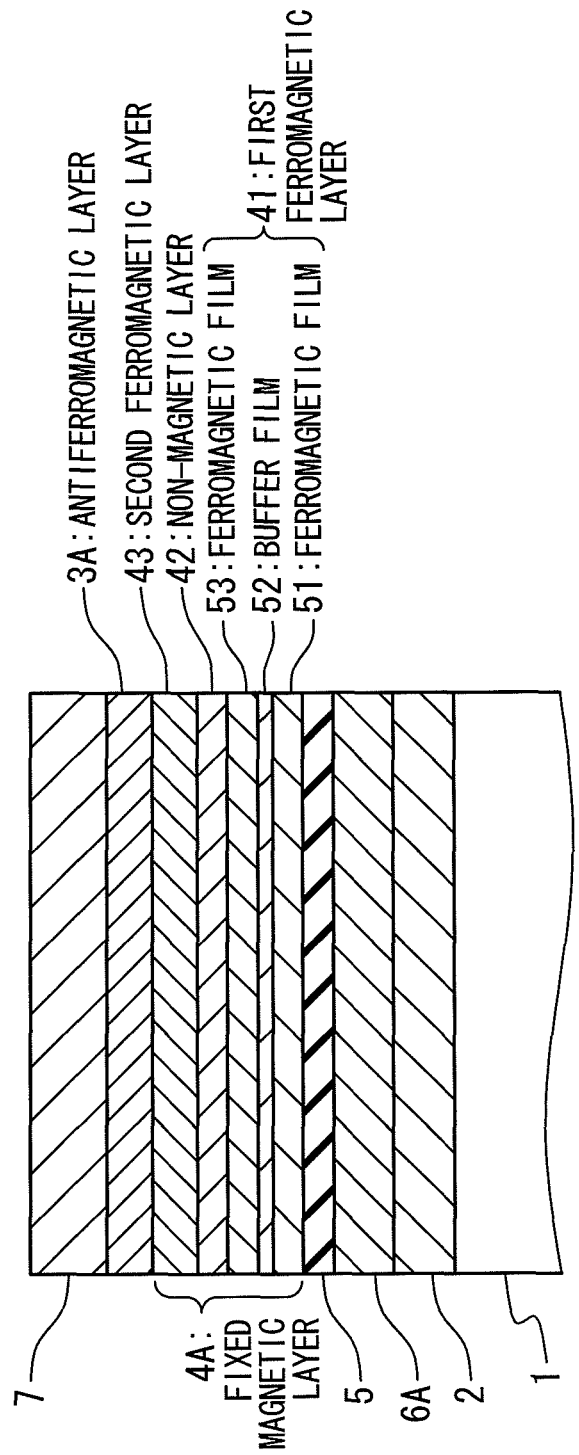
FIG. 16 is a sectional view showing an exemplary structure of an MRAM in a fourth embodiment of the present invention.

In a fourth embodiment, as shown in FIG. 16, the present invention is applied to a fixed magnetic layer constituted by an SAF, located on a tunnel barrier layer. Such structure eliminates the necessity for forming the free magnetic layer on the tunnel barrier layer which is typically amorphous, and thereby effectively improves the property of the free magnetic layer.

However, the fact that the fixed magnetic layer of the SAF is formed on the tunnel barrier layer may cause a problem that the crystalline orientation of a non-magnetic layer formed between the ferromagnetic layers within the fixed magnetic layer, and thereby deteriorate the antiferromagnetic coupling between the ferromagnetic layers. The deterioration of the antiferromagnetic coupling between the ferromagnetic layers is not preferable, because the magnetizations of the ferromagnetic layers within the fixed magnetic layer may be undesirably reversed.

In addition, the structure in which the fixed magnetic layer is formed on the tunnel barrier layer undesirably deteriorates the crystalline orientation of the antiferromagnetic layer formed on the fixed magnetic layer. This may result in a problem that the exchanging interaction exerted on the fixed magnetic layer by the antiferromagnetic layer is deteriorated, and the magnetization of the fixed magnetic layer is not sufficiently fixed.

The MRAM structure in the fourth embodiment is directed to deal with such problems. Specifically, the MRAM structure in the fourth embodiment is composed of a bottom electrode 2, a free magnetic layer 6A, a tunnel barrier layer 5, a fixed magnetic layer 4A, an antiferromagnetic layer 3A and a top contact layer 7. The free magnetic layer 6A is formed of a single ferromagnetic layer or an SAF, and is designed so that the magnetization(s) thereof is reversible. The tunnel barrier layer 5 is formed of a very thin non-magnetic insulative film. Similarly to the first to third embodiments, the tunnel barrier layer 5 may be composed of an AlO$_x$ layer formed through the oxidization of an aluminum film. It should be noted that the thus-formed AlO$_x$ layer is amorphous.

The fixed magnetic layer 4A is formed of an SAF, and the net magnetization thereof is fixed by the antiferromagnetic layer 3A. In detail, the fixed magnetic layer 4A is composed of a first ferromagnetic layer 41, a second ferromagnetic layer 43, and a non-magnetic layer 42 placed therebetween. The second ferromagnetic layer 43 is formed of magnetically hard ferromagnetic material, such as CoFe. The non-magnetic layer 42 is designed so as to provide antiferromagnetic exchange coupling between the first and second ferromagnetic layers 41 and 43. In a preferred embodiment, the non-magnetic layer 42 is composed of a ruthenium film having a thickness of about 0.9 nm.

The first ferromagnetic layer 41 is composed of ferromagnetic layers 51, 53, and a buffer layer 52 placed therebetween. The ferromagnetic layers 51 and 53 are formed of magnetically hard ferromagnetic material, such as CoFe. The buffer layer 52 is formed of material through an appropriate deposition method so that the crystalline orientation of the ferromagnetic film 53 formed thereon is enhanced. The buffer layer 52 is formed so as to provide ferromagnetic coupling between the ferromagnetic films 51 and 53. Although incorporating multiple ferromagnetic films 51 and 53, the first ferromagnetic layer 41 magnetically behaves as if it is a single ferromagnetic layer.

Similarly to the first embodiment, the buffer layer 52 placed between the ferromagnetic films 51 and 53 is essentially important in order to increase the exchange coupling between the first ferromagnetic layer 41 and the second ferromagnetic layer 43. The buffer layer 52 formed on the ferromagnetic film 51 improves the crystalline orientation of the ferromagnetic film 53 formed thereon, and consequently improves the crystalline orientation of the non-magnetic layer 42 formed on the ferromagnetic film 53. The improvement of the crystalline orientation of the non-magnetic layer 42 enhances the antiferromagnetic exchange coupling between the first and second ferromagnetic layers 41 and 43. This allows the net magnetization of the fixed magnetic layer 4A to be zero, which preferably avoids the magnetization of the fixed magnetic layer 4A being undesirably reversed.

The formation of the buffer layer 52 is also preferable for enhancing the crystalline orientation of the antiferromagnetic layer 3A formed on the fixed magnetic layer 4A. The formation of the buffer layer 52 increases not only the crystalline orientation of the non-magnetic layer 42, but also the crystal orientations of the second ferromagnetic layer 43, and the antiferromagnetic layer 3A. The improvement of the crystalline orientation of the antiferromagnetic layer 3A increases the magnitude of the exchange coupling exerted on the fixed magnetic layer 4A by the antiferromagnetic layer 3A, and thereby achieves strongly fixing the magnetization of the fixed magnetic layer 4A. This is advantageous for avoiding the net magnetization of the fixed magnetic layer 4A from being undesirably reversed.

Figure 17A:
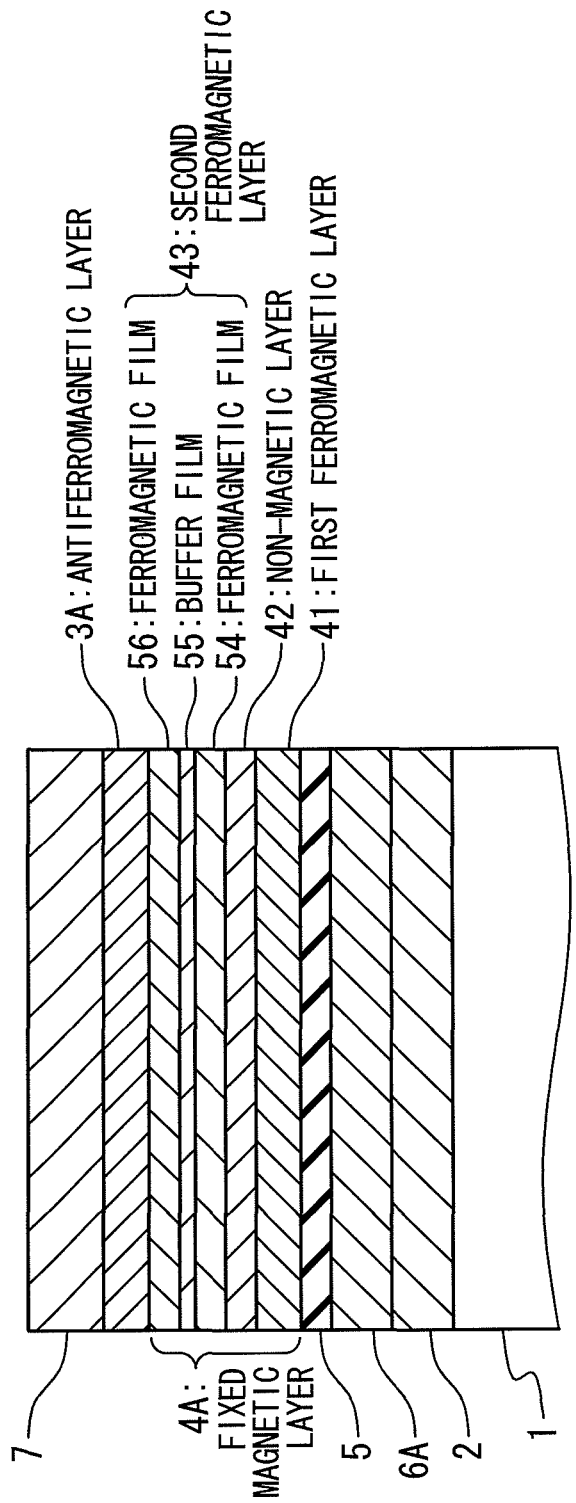
FIG. 17A is a sectional view showing another structure of the MRAM in the fourth embodiment of the present invention.

As shown in FIG. 17A, the improvement of the crystalline orientation of the antiferromagnetic layer 3A may be also attained by a structure in which the buffer layer is formed within the second ferromagnetic layer 43. Specifically, in the structure of FIG. 17A, the second ferromagnetic layer 43 is composed of a plurality of ferromagnetic films 54, 56, and a buffer layer 55 placed therebetween. The buffer layer 55 is formed of material through an appropriate method so that the crystalline orientation of the ferromagnetic film 56 formed thereon is enhanced. In addition, the buffer layer 55 is formed to provide ferromagnetic coupling between the ferromagnetic films 54 and 56, so that the second ferromagnetic layer 43 behaves as if it is a single-layered ferromagnetic film although incorporating the multiple ferromagnetic films 54, 56. In such configuration, the buffer layer 55 improves the crystalline orientation of the ferromagnetic film 56 formed thereon, and thereby enhances the crystalline orientation of the antiferromagnetic layer 3A further formed thereon. As mentioned above, the improvement of the crystalline orientation of the antiferromagnetic layer 3A achieves strongly fixing the magnetization of the fixed magnetic layer 4A, and this is advantageous for avoid the magnetization of the fixed magnetic layer 4A being undesirably reversed.

Other Applications

The layered ferromagnetic structure of the present invention effectively enhances exchange coupling regardless of the underlayer structure. Thus, the application of the layered ferromagnetic structure of the present invention is not limited to a tunnel barrier layer within an MRAM. In a fifth embodiment, another exemplary application of the layered ferromagnetic structure of the present invention will be presented. As shown in FIG. 17B, the free magnetic layer may be positioned below the tunnel barrier. In an alternative embodiment, the layered ferromagnetic structure of the present invention may be used for as a magnetic structure other than a free magnetic layer and a fixed magnetic layer. For example, the layered ferromagnetic structure of the present invention may be used as a layer for providing a stable static magnetic field to a free magnetic layer.

Figure 17C:
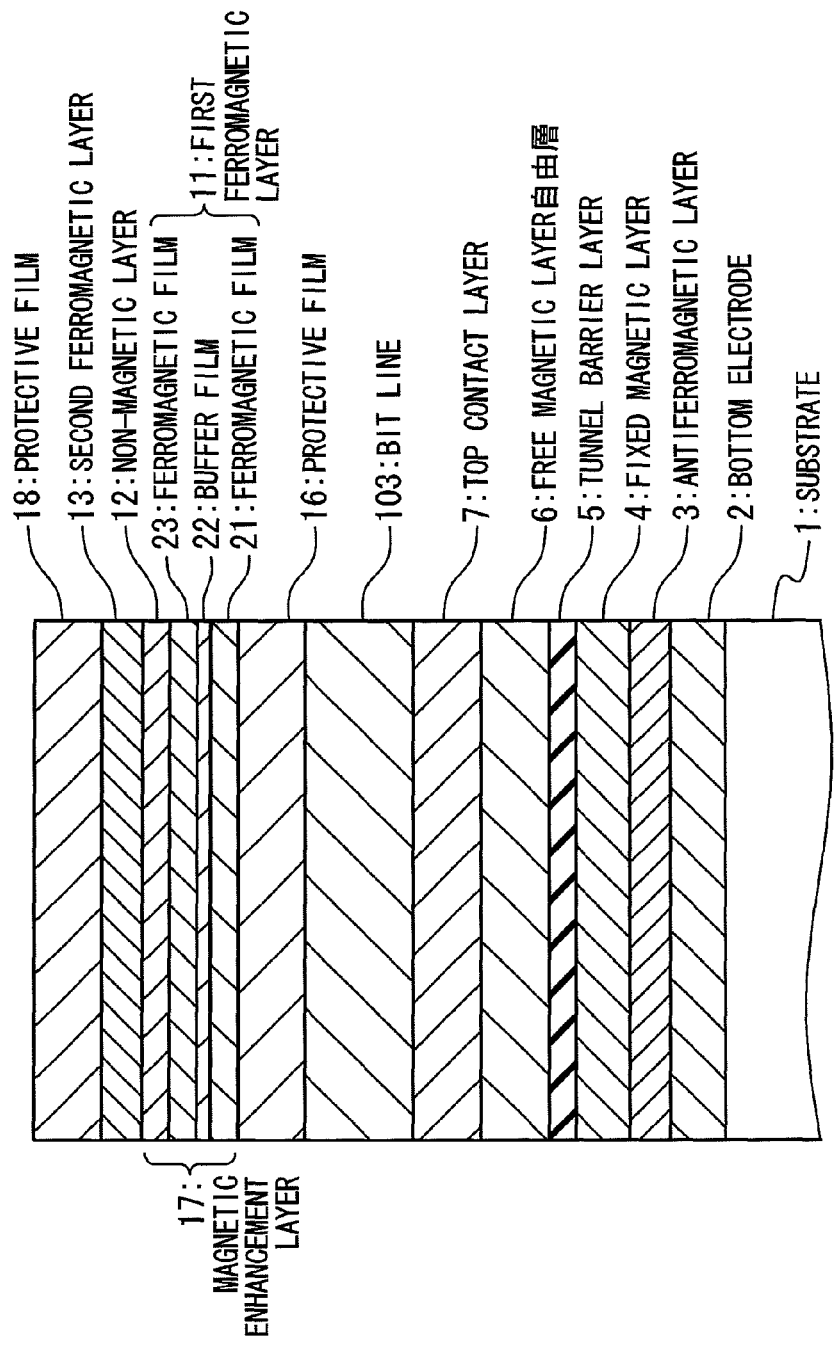
FIG. 17C is a sectional view showing another preferable structure of the MRAM in the fifth embodiment.

Alternatively, the layered ferromagnetic structure of the present invention may be used as a layer to concentrate a magnetic field generated by a current through an interconnection. FIG. 17C shows an exemplary MRAM structure for concentrate a magnetic field. As shown in FIG. 17C, a magnetic enhancement layer 17 is formed on the top surface of a bit line 14. The magnetic enhancement layer 17 is composed of a layered ferromagnetic structure of the present invention, and therefore achieves flexible control of whether the magnetic enhancement layer 17 provides the ferromagnetic or antiferromagnetic exchange coupling, and also provides flexible control of the magnitude of the exchange coupling, regardless of the structure of an underlayer protective layer 16. As a result, the magnetic enhancement layer 17 may function as a high magnetic permeability layer which concentrates the magnetic field developed by a current through the bit line 14 to thereby increase the magnetic field applied to the free magnetic layer. Alternatively, the magnetic enhancement layer 17 may function as a magnet layer for applying a biasing magnetic field to a free layer. Such technique is effective not only for MRAM but also for a magnetic head.

In the following, advantageous effects of the present invention will be explained below in detail on the basis of results of various experiments.

Experimental Result

1. First Experiment

The first experiment descried in the following addresses proving that the structure showing FIG. 5A (in which the buffer film 22 is inserted into the first ferromagnetic layer 11) increases the exchange coupling energy J to enhance the exchange coupling between the first ferromagnetic layers 11 and 13. As mentioned above, the increase in the exchange coupling energy J is especially important in order to attain the asteroid writing.

Firstly, an experiment has been carried out in order to prove advantages of the structure in which the buffer film 22 is composed of a very thin Ta film. Specifically, MTJ elements incorporating differently-structured SAFs within the free magnetic layers have been manufactured, and the magnetization curves of the respective free magnetic layers have been measured. The SAF structures are as follows:

Comparative Example 1

$Ni_{81}Fe_{19}$ (4 nm)/Ru (2.1 nm)/$Ni_{81}Fe_{19}$ (4 nm)

Embodiment 1

Present Invention $Ni_{81}Fe_{19}$(2 nm)/Ta(0.4 nm)/$Ni_{81}Fe_{19}$(2 nm)/Ru(2.1 nm)/$Ni_{81}Fe_{19}$(4 nm)

It should be noted that the slashes indicate that the film on the left is placed at the lower position (namely, on the side of the substrate) in the descriptions of SAF structures and MTJ element structures in this specification. Moreover, all of the samples, including embodiments of the present invention and comparative examples, have been manufactured through a magnetron sputtering in a magnetic field and a radical oxidization. The film depositions have been followed by heat treatment at 275° C. for five hours.

As for the SAF of Embodiment 1, the Ta film of 0.4 nm corresponds to the buffer film 22, the NiFe films of 2.0 nm separated by the Ta film correspond to the ferromagnetic films 21 and 23, respectively. The NiFe films and Ta film correspond to the first ferromagnetic layer 11. Moreover, the Ru film of 2.1 nm corresponds to the non-magnetic layer 12, and the NiFe film of 4 nm corresponds to the second ferromagnetic layer 13. It should be noted that the Ru film of 2.1 nm provides the antiferromagnetic exchange coupling. In addition, it is expected that the Ta film of 0.4 nm is not continuous, having the island structure as shown in FIG. 6. It should be noted that the Ta film of 0.4 nm means to have an average thickness of 0.4 nm.

The entire structures of the measured MTJ elements are as follows:

substrate/Ta(20 nm)/NiFe(3 nm)/PtMn(20 nm)/CoFe(2.5 nm)/Ru(0.9 nm)/CoFe(2.5 nm)/Al(1 nm)$O_x$/SAF/Al(0.7 nm)$O_x$/Ta(5 nm)/Al(20 nm)/Ta(70 nm)

The expression "Al(1 nm)$O_x$" indicates that the AlOx film is formed by the oxidization of an Al film of 1 nm. Similarly, the expression "Al(0.7 nm)$O_x$" indicates that the AlO$_x$ film is formed by the oxidization of an Al film of 0.7 nm. Moreover, the compositions of CoFe layers of all the samples are $Co_{90}Fe_{10}$, including embodiments and comparative examples.

Figure 3:
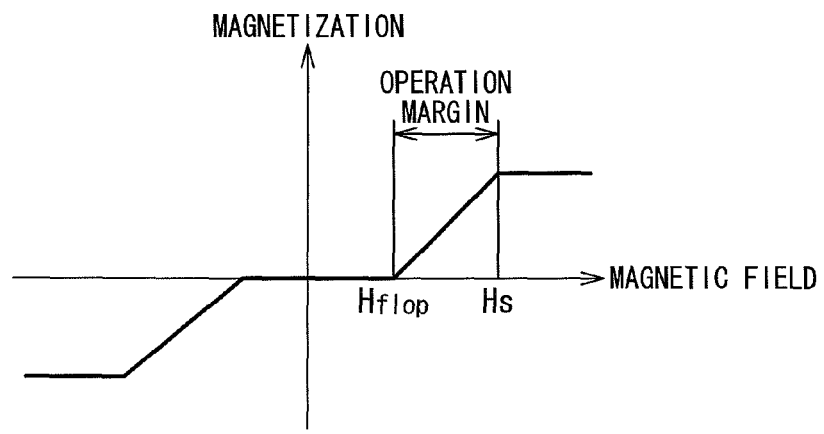
FIG. 3 is a graph showing an ideal magnetization curve of an SAF.

It should be noted that the magnetic field where the magnetization is finally saturated is defined as the saturation magnetic field $H_s$, and the increase in the saturation magnetic field $H_s$ implies the increase in the exchange coupling energy J as explained with reference to FIG. 3.

Figure 18A:
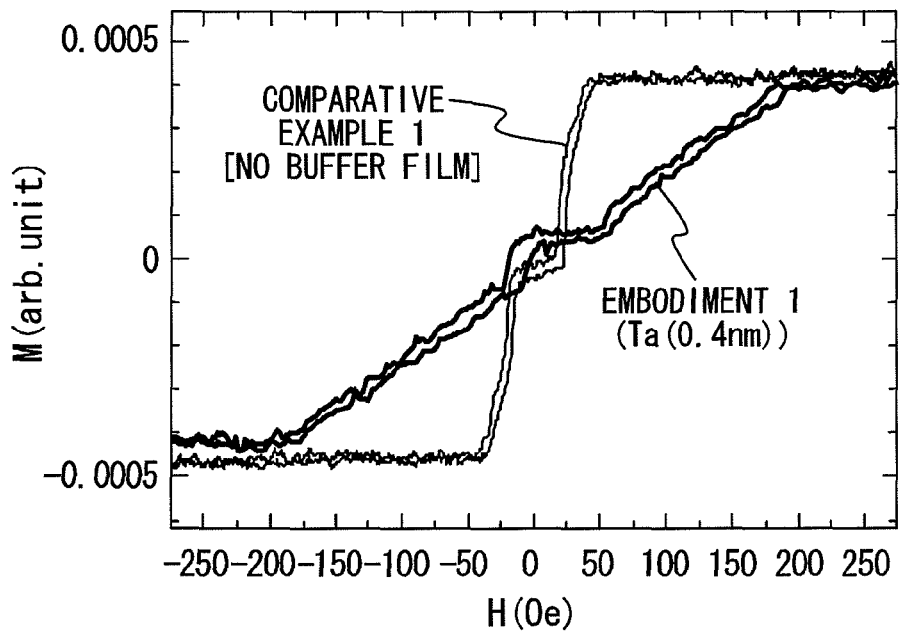
FIG. 18A is a graph showing magnetization curves of the SAFs of Embodiment 1 and Comparative Example 1.

FIG. 18A is the magnetization curves of the SAFs of Comparative Example 1 and Embodiment 1. The thin line indicates the magnetization curve of the SAF of Comparative Example 1, and the thick line indicates the magnetization curve of the SAF of Embodiment 1. As can be seen from FIG. 18A, the SAF of Embodiment 1 has the saturation magnetic field $H_s$ higher than that of the SAF of Comparative Example 1. Specifically, the saturation magnetic field $H_s$ of the SAF of Embodiment 1 is about 200 (Oe), and the saturation magnetic field $H_s$ of the SAF of Comparative Example 1 is about 50 (Oe). The result of this experiment implies that the insertion of the thin Ta film (corresponding to the buffer film 22) into the first ferromagnetic layer 11 effectively increases the exchange coupling between the first and second ferromagnetic layers 11 and 13; in other words, the insertion of the thin Ta film effectively increases the exchange coupling energy J.

Moreover, the similar evaluation was performed with respect to the SAFs in which the non-magnetic layer 12 is formed of a Ru film, and the first ferromagnetic layer 11 and the second ferromagnetic layer 13 are each composed of a layered structure of a NiFe film and a CoFe film, with the CoFe films of the first ferromagnetic layer 11 and the second ferromagnetic layer 13 separated by the Ru film. Specifically, MTJ elements including SAFs having the following two different structures within the free magnetic layers have been manufactured, and the magnetization curves of the free magnetic layers has been measured:

Comparative Example 2

$Ni_{81}Fe_{19}$(3 nm)/CoFe(0.5 nm)/Ru(2.1 nm)/CoFe(0.5 nm)/$Ni_{81}Fe_{19}$ (3 nm)

Embodiment 2

Present Invention $Ni_{81}Fe_{19}$(1.5 nm)/Ta(0.4 nm)/$Ni_{81}Fe_{19}$(1.5 nm)/CoFe(0.5 nm)/Ru(2.1 nm)/CoFe(0.5 nm)/$Ni_{81}Fe_{19}$(3 nm)

With respect to the SAF of Embodiment 2, the Ta film of 0.4 nm corresponds to the buffer film 22, and the NiFe film of 1.5 nm located therebelow corresponds to the ferromagnetic film 21, the NiFe film of 1.5 nm and the CoFe film of 0.5 nm which are located above the Ta film correspond to the ferromagnetic layer 23. The structure consisting of the NiFe films, the CoFe film and the Ta film correspond to the first ferromagnetic layer 11. Moreover, the Ru film of 2.1 nm corresponds to the non-magnetic layer 12, and the NiFe film of 3 nm corresponds to the second ferromagnetic layer 13. It should be noted that the CoFe films separated by the Ru film within the SAFs are used to increase the exchange coupling energy J in the samples of both of Comparative Example 2 and Embodiment 2

Figure 18B:
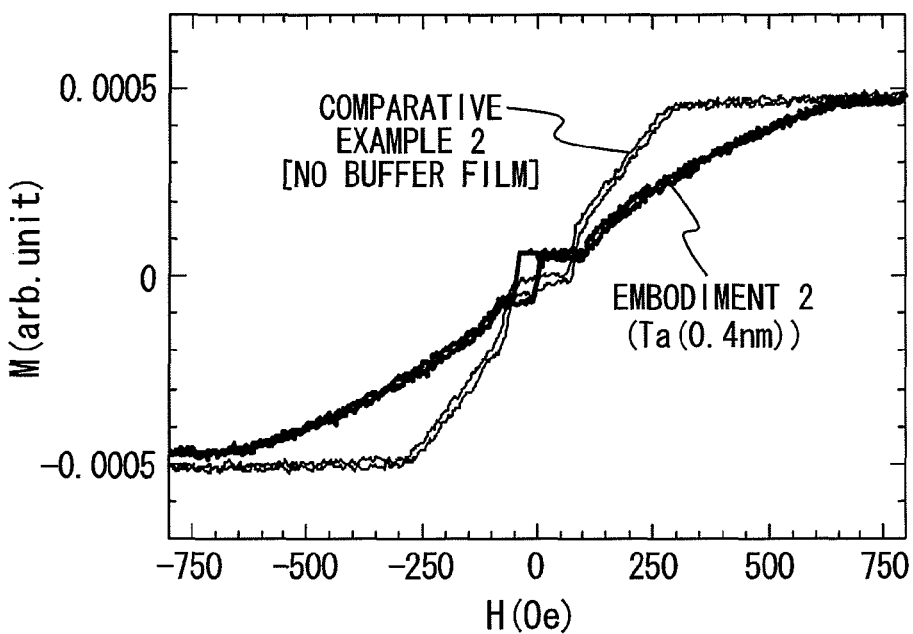
FIG. 18B is a graph showing magnetization curves of the SAFs of Embodiment 2 and Comparative Example 2.

FIG. 18B shows the magnetization curves of the SAFs of Comparative Example 2 and Embodiment 2. The thin line indicates the magnetization curve of the SAF of Comparative Example 2, and the thick line indicates the magnetization curve of the SAF of Embodiment 2. As can be seen from FIG. 18B, the SAF of Embodiment 2 has the saturation magnetic field $H_s$ higher than that of the SAF of Comparative Example 2. Specifically, the saturation magnetic field $H_s$ of the SAF in Embodiment 2 is about 650 (Oe), and the saturation magnetic field $H_s$ of the SAF of Comparative Example 2 is about 250 (Oe). FIG. 18B also proves that the insertion of the thin Ta film (corresponding to the buffer film 22) into the first ferromagnetic layer 11 effectively increases the exchange coupling between the first and second ferromagnetic layers 11 and 13, that is, the insertion of the thin Ta film effectively increases the exchange coupling energy J.

Furthermore, the structure in which the Ru film that provides ferromagnetic coupling between ferromagnetic films on the top and bottom surfaces thereof is used as the buffer film 22 has been examined to prove the advantage thereof. As mentioned above, there are two different implementations in which the Ru film provides ferromagnetic coupling between two ferromagnetic layers. One is to form the Ru film very thinly, and the other one is to adjust the thickness of the Ru film so that the Ru film provides the exchange coupling ferromagnetically. Both of the two implementations will be evaluated below.

More specifically, the following four different SAFs have been incorporated within MTJ elements having the above-described structure, and then, the magnetization curves of the SAFs have been measured:

Comparative Example 3

$Ni_{81}Fe_{19}$ (4 nm)/Ru (2.1 nm)/$Ni_{81}Fe_{19}$ (4 nm)

Embodiment 3

Present Invention $Ni_{81}Fe_{19}$(2 nm)/Ru(0.5 nm)/$Ni_{81}Fe_{19}$(2 nm)/Ru(2.1 nm)/$Ni_{81}Fe_{19}$(4 nm)

Comparative Example 4

$Ni_{81}Fe_{19}$(2 nm)/Ru(1.2 nm)/$Ni_{81}Fe_{19}$(2 nm)/Ru(2.1 nm)/$Ni_{81}Fe_{19}$ (4 nm)

Embodiment 4

Present Invention $Ni_{81}Fe_{19}$(2 nm)/Ru(1.4 nm)/$Ni_{81}Fe_{19}$(2 nm)/Ru(2.1 nm)/$Ni_{81}Fe_{19}$ (4 nm)

In the SAFs in Embodiment 3, Comparative Example 4 and Embodiment 4, the lower Ru film corresponds to the buffer film 22, and the NiFe films on the top and bottom surfaces thereof correspond to the ferromagnetic films 21 and 23. Moreover, the Ru film of 2.1 nm corresponds to the non-magnetic layer 12, and the NiFe film of 4 nm formed on the Ru film of 2.1 nm corresponds to the second ferromagnetic layer 13.

It should be noted that the SAFs of Embodiment 3, Comparative Example 4 and Embodiment 4 are different in the thickness of the lower Ru film. In the SAF of Embodiment 3, the Ru film has a very thin thickness, specifically, a thickness of 0.5 nm. This implies that the lower Ru film within the SAF of Embodiment 3 is expected to be a discontinuous film, having the island structure. Since the thickness of the lower Ru film is very thin, the NiFe films of 2 nm on the top and bottom surfaces thereof are ferromagnetically coupled due to the partial direct contact. In the SAF of Comparative Example 4, on the other hand, the lower Ru film has a thickness of 1.2 nm. The lower Ru film having the thickness of 1.2 nm does not provide exchange coupling between the ferromagnetic films on the top and bottom surfaces thereof. Therefore, the NiFe films of 2 nm on the top and bottom surfaces of the Ru film are not magnetically coupled in the SAF of Comparative Example 4. Finally, in the SAF in Embodiment 4, the lower Ru film has a thickness of 1.4 nm. The Ru film having the thickness of 1.4 nm effectively provides ferromagnetic exchange coupling between the ferromagnetic films on the top and bottom surfaces thereof. As a result, the NiFe films of 2 nm on the top and bottom surfaces of the Ru film are ferromagnetically coupled in the SAF of Example 4.

Figure 19A:
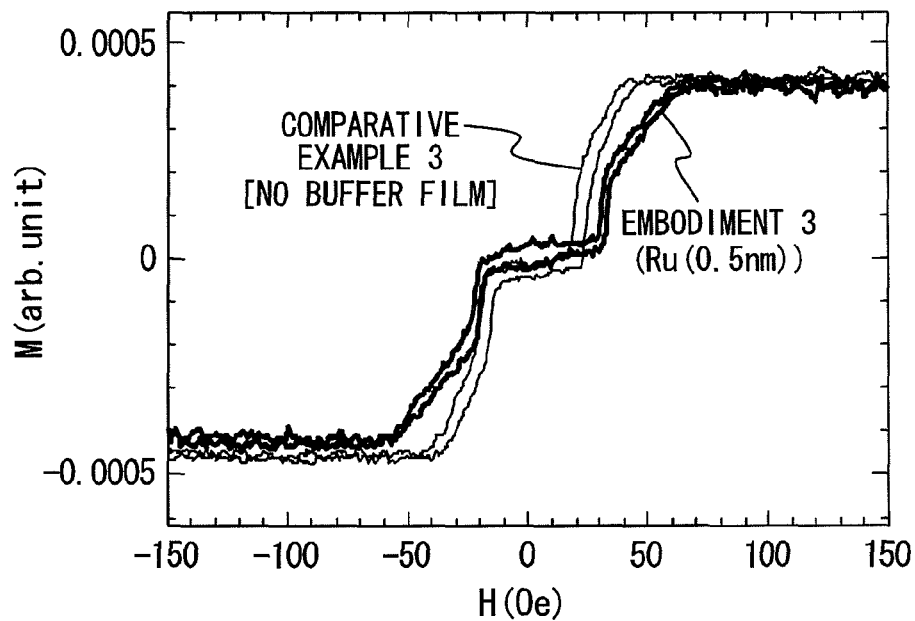
FIG. 19A is a graph showing magnetization curves of the SAFs of embodiment 3 and Comparative Example 3.

FIG. 19A is a graph showing the magnetization curves of the SAFs of Comparative Example 3 and Embodiment 3. As can be understood from this graph, the SAF of Embodiment 3, having the Ru film as the buffer film 22, has a greater saturation magnetic field $H_s$ than that of the SAF of Comparative Example 3, which does not have the buffer film 22.

Figure 19B:
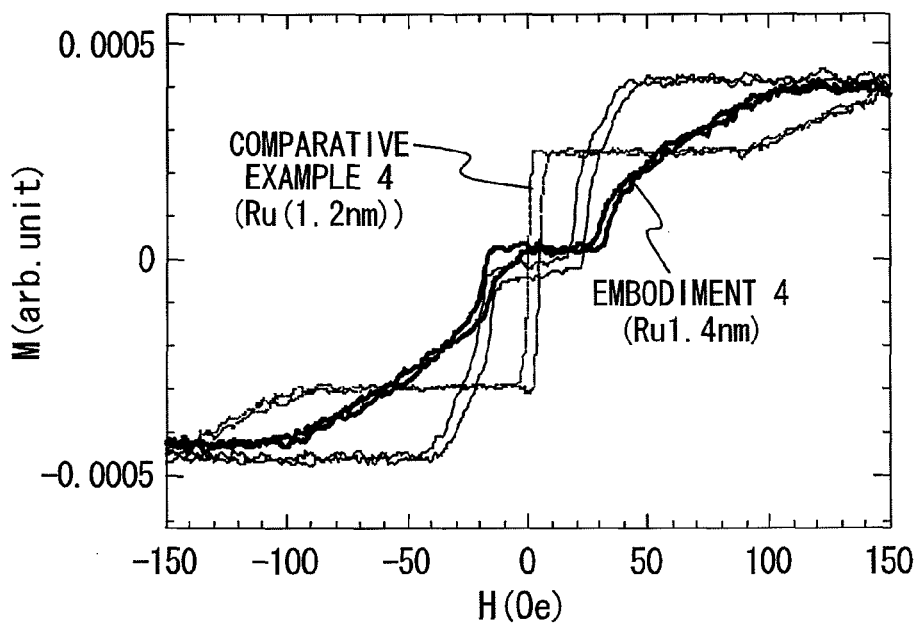
FIG. 19B is a graph showing magnetization curves of the SAFs of Embodiment 4 and Comparative Example 4.

FIG. 19B is a graph showing the magnetization curves of the SAFs of Comparative Example 4 and Embodiment 4. The SAF of Embodiment 4 has a saturation magnetic field $H_s$ larger than that of the SAF of Comparative Example 3. Specifically, the SAF of Comparative Example 3 has a saturation magnetic field of about 40 (Oe), and the SAF of Embodiment 4 has a saturation magnetic field of about 100 (Oe). It should be noted that the SAF of Comparative Example 4 has a spontaneous magnetization even when the external magnetic field is approximately 0. This implies that the SAF of Comparative Example 4 does not satisfy the requirement required by the toggle writing, exhibiting no flip magnetic field. This is because the NiFe film located at the lowest position is not magnetically coupled to the adjacent ferromagnetic film, since the Ru film inserted as the buffer film 22 does not provide the exchange coupling.

These results imply that the use of the Ru film that provides ferromagnetic coupling between the ferromagnetic films on the top and bottom surfaces thereof as the buffer film 22 effectively improves the saturation magnetic field $H_s$, namely, increases the exchange coupling energy J. Moreover, the graph of FIG. 19B indicates that the Ru film inserted as the buffer film 22 is required to provide the ferromagnetic exchange coupling.

Furthermore, dependences of the material and thickness of the buffer layer on the magnitude of the exchange coupling energy J between the ferromagnetic layers within the SAF have been examined with respect to SAFs having the following structures:

$Ni_{81}Fe_{19}$ (2 nm)/Buffer Layer/$Ni_{81}Fe_{19}$ (2 nm)/Ru (2.1 nm)/$Ni_{81}Fe_{19}$ (4 nm)

The exchange coupling energies J have been determined in accordance with Equation (1) from the magnetization curves of the measured SAFs.

FIG. 20 is a table showing the measurement results. As can be understood from FIG. 20, all of the examined non-magnetic materials exhibit the effect of increasing the exchange coupling energy J, when used as the buffer layer. This is because the insertion of the buffer layer changes the surface energy on the top surface of the ferromagnetic film 23 within the SAF, and thereby terminates the non-orientation crystal growth, resulting in the changes in the manners of the crystal growth of the magnetic layers deposited thereon. Additionally, the measurement results shown in FIG. 20 suggest that all of the materials in the Embodiments exhibits the effect of the improving the crystalline orientation of the non-magnetic layer 12.

In addition, the results shown in FIG. 20 indicates that the use of tantalum and zirconium as the buffer layer remarkable increases the exchange coupling energy J, at least when the NiFe film is used as the ferromagnetic layers. This implies that tantalum and zirconium and the elements located near them in the periodic table (that is, Nb, Hf, Mo and W) exhibit remarkable effects for increasing the exchange coupling energy J. The crystal orientations of the ferromagnetic film 23 and the non-magnetic layer 12 deposited thereon are largely improved by the fact that the buffer layer includes at least any of the elements selected from a group consisting of Ta, Zr, Nb, Hf, Mo and W. In particular, the use of zirconium is especially preferable, because the buffer layer of zirconium provides large exchange coupling energy J with reduced thickness as compared with the other materials.

The inventors consider that the effect of the increase in the exchange coupling energy J caused by the insertion of the buffer layer results from the improvement of the crystal orientations of the ferromagnetic film formed thereon and the non-magnetic layer thereon. This is concluded from TEM (Transmission Electron Microscope) observation images of the sections of the SAFs.

Figure 21A:
FIG. 21A is a TEM image of the SAF of the embodiment of the present invention.
Figure 21B:
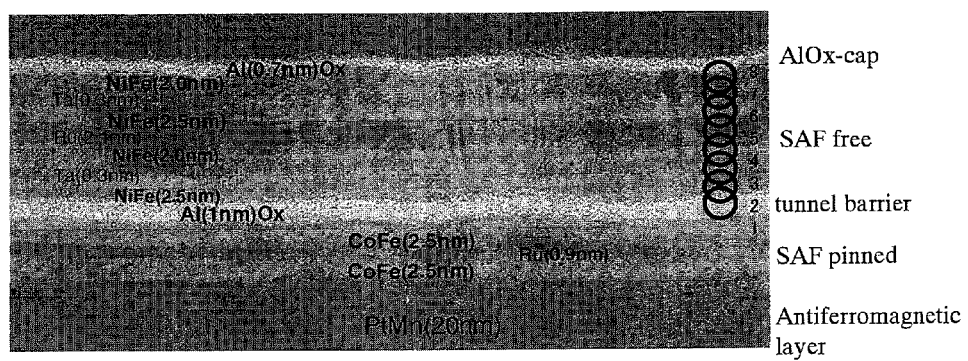
FIG. 21B is a TEM image of the SAF of the embodiment of the present invention.

FIGS. 21A, 21B are TEM images of the sections of the SAFs in accordance with the present invention. The structures of the SAFs are as follows:

Sample of FIG. 21A:
Ta(10 nm)/Al(1 nm)$O_x$/NiFe(4 nm)/Ta(0.3 nm)/NiFe(4 nm)/Ru(2.1 nm)/NiFe(4 nm)/Ta(0.3 nm)/NiFe(4 nm)/Ru(3 nm)

Sample of FIG. 21B
Ta (20 nm)/NiFe (3 nm)/PtMn (20 nm)/CoFe (2.5 nm)/Ru (0.9 nm)/CoFe(2.5 nm)/Al(1 nm)$O_x$/NiFe(2.5 nm)/Ta(0.3 nm)/NiFe(2 nm)/Ru(2.1 nm)/NiFe(2.5 nm)/Ta(0.3 nm)/NiFe(2 nm)/Al(0.7 nm)$O_x$/Ta(10 nm)

It should be noted that the Ta film of 0.3 nm is used as the buffer layer in each SAF.

Figure 22A:
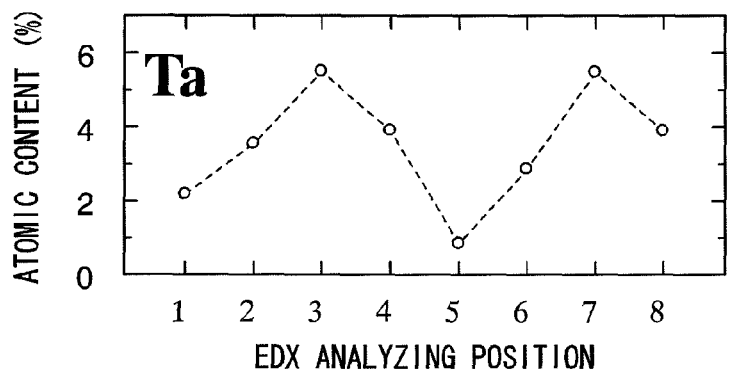
FIG. 22A is a graph showing a distribution of Ta in the SAF of the embodiment of the present invention, which is measured by an EDX technique.
Figure 22B:
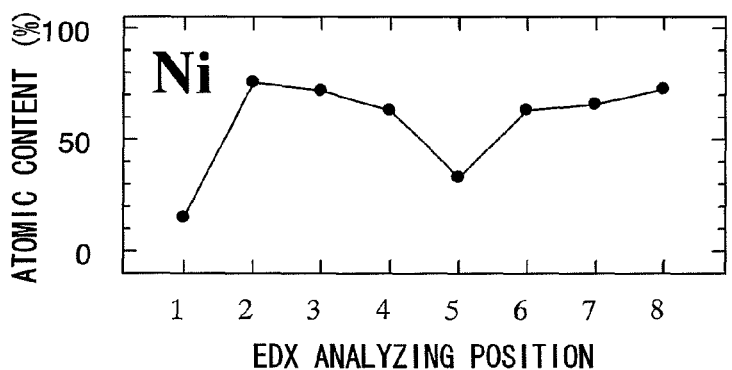
FIG. 22B is a graph showing a distribution of Ni in the SAF of the embodiment of the present invention, which is measured by an EDX technique.
Figure 22C:
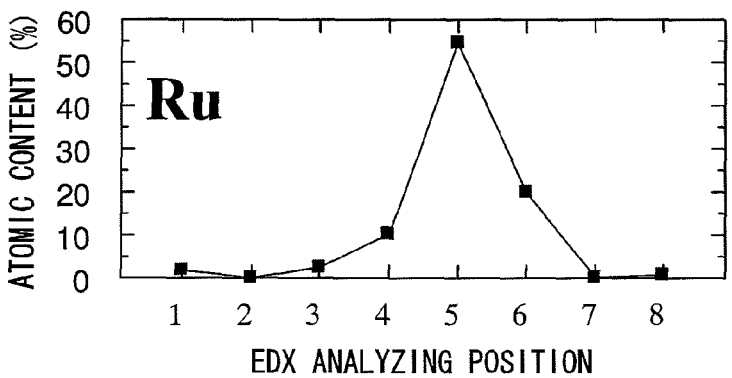
FIG. 22C is a graph showing a distribution of Ru in the SAF of the embodiment of the present invention, which is measured by an EDX technique.

A composition analysis based on an EDX (Energy Dispersive X-Ray Spectroscopy) technique is implemented on the positions "1" to "13" of FIG. 21B to confirm that the above-described structures are maintained in the respective SAFs. FIGS. 22A to 22C show the results of the composition analysis based on the EDX. The graphs shown in FIGS. 22A to 22C clearly depicts that ruthenium, nickel and tantalum exist at the desired positions within the SAFs. For example, the position "3" in the TEM image of FIG. 21B is the position where the Ta film of 0.3 nm is to be positioned. And, the fact that the Ta film exists at the position "3" is evident from the fact that the Ta content has a peak at the position "3".

The TEM images of FIGS. 21A, 21B clearly indicate that the Ta film of 0.3 nm functions as the buffer layer to improve the crystalline orientations of the layers formed thereon. With reference to FIG. 21A, the crystalline orientations are not observed in the NiFe film of 4 nm formed on the $AlO_x$ film; the contrast is different as compared with the NiFe films in the other portions. The same goes for the NiFe film of 2.5 nm formed on the $AlO_x$ film in the TEM image shown in FIG. 21B. On the contrary, the crystal structure having an FCC (111) orientation is clearly observed in the NiFe film formed on the Ta film used as the buffer film 22. Additionally, the crystal structure having an HCP (001) orientation is clearly observed in the Ru film of 2.1 nm formed on the NiFe film. Furthermore, a TEM analysis of the conventional SAF structure of NiFe(8 nm)/Ru(2.1 nm)/NiFe (8 nm), from which the buffer layer is excluded, has concluded that sharp change in lattice image contrasts, sufficiently clear FCC (111) orientation of the NiFe film, and sufficiently clear HCP (001) orientation of the Ru film are not observed in the TEM image, on the contrary to the images shown in FIGS. 21A, 21B. This indicates that the Ta film of 0.3 nm remarkably improves the crystalline orientation of the (111) plane which is the closest packed face of the NiFe film formed thereon, and thereby improves the crystalline orientation of the (001) plane which is the closest packed face of the Ru film formed thereon.

2. Second Experiment

The second experiment addresses proving advantageous effect of the structures shown in FIGS. 5A, 7A and 7B, in which the buffer film 22 is formed of ferromagnetic material doped with element that improves the crystalline orientation of the ferromagnetic film thereon. In detail, the second experiment addresses confirming that the buffer layer composed of a $(Ni_{81}Fe_{19})_{100-x}Ta_x$ film and a $(Ni_{81}Fe_{19})_{100-x}Zr_x$ film effectively increases the saturation magnetic field $H_s$ and the exchange coupling energy J. The index x indicates the composition of Ta or Zr represented in the atomic percent.

Specifically, samples of the following structures have been manufactured in the second experiment:

substrate/Ta(5 nm)/Al(1 nm)$O_x$/SAF/Al(0.7 nm)$O_x$/Ta(10 nm)

The structures of the SAFs have been selected from below:

Embodiment 5

NiFe (1 nm)/$(Ni_{81}Fe_{19})_{100-x}Ta_x$ (1 nm)/NiFe (3 nm)/Ru (2.1 nm)/NiFe(3 nm)/$(Ni_{81}Fe_{19})_{100-x}Ta_x$ (1 nm)/NiFe (1 nm)

Embodiment 5b

NiFe (1.5 nm)/$(Ni_{81}Fe_{19})_{85}Zr_{15}$(1 nm)/NiFe(1.5 nm)/Ru (2.1 nm)/NiFe (1.5 nm)/$(Ni_{81}Fe_{19})_{85}Zr_{15}$(1 nm)/NiFe(1.5 nm)

Embodiment 6

$(Ni_{81}Fe_{19})_{100-x}Ta_x$(1 nm)/NiFe (3 nm)/Ru(2.1 nm)/NiFe (3 nm)/$(Ni_{81}Fe_{19})_{100-x}Ta_x$(1 nm)

Embodiment 6b $(Ni_{81}Fe_{19})_{85}Zr_{15}$(1 nm)/NiFe(3 nm)/Ru(2.1 nm)/NiFe(3 nm)/$(Ni_{81}Fe_{19})_{85}Zr_{15}$(1 nm)

Embodiment 7

NiFe (2 nm)/$(Ni_{81}Fe_{19})_{100-x}Zr_x$(3 nm)/Ru(2.1 nm)/$(Ni_{81}Fe_{19})_{100-x}Zr_x$(3 nm)/NiFe(2 nm)

It should be noted that the Ni content is 81%, and the Fe content is 19%, in all the NiFe films of the samples.

The SAFs in Embodiments 5 and 5b generally correspond to the free magnetic layer 6 shown in FIG. 5A. Specifically, as for Embodiment 5, the lower NiFe/$(Ni_{81}Fe_{19})_{100-x}Ta_x$/NiFe structure corresponds to the first ferromagnetic layer 11. In this structure, the NiFe film of 1 nm, the $(Ni_{81}Fe_{19})_{100-x}Ta_x$ film of 1 nm, and the NiFe film of 3 nm correspond to the ferromagnetic film 21, the buffer film 22 and the ferromagnetic film 23, respectively. In addition, the Ru film corresponds to the non-magnetic layer 12, and the upper NiFe/$(Ni_{81}Fe_{19})_{100-x}Ta_x$/NiFe structure corresponds to the second ferromagnetic layer 13. As for Embodiment 5b, the NiFe(1.5 nm)/$(Ni_{81}Fe_{19})_{85}Zr_{15}$ (1 nm)/NiFe(1.5 nm) structure corresponds to the first ferromagnetic layer 11, and the NiFe film of 1.5 nm, the $(Ni_{81}Fe_{19})_{85}Zr_{15}$ film of 1 nm, and the NiFe film of 1.5 nm correspond to the ferromagnetic film 21, the buffer film 22 and the ferromagnetic film 23, respectively.

The SAFs of Embodiments 6 and 6b generally correspond to the free magnetic layer 6 shown in FIG. 7A. Specifically, as for Embodiment 6, the lower $(Ni_{81}Fe_{19})_{100-x}Ta_x$/NiFe structure corresponds to the first ferromagnetic layer 11. In this structure, the $(Ni_{81}Fe_{19})_{100-x}Ta_x$ film corresponds to the buffer film 22, and the NiFe film corresponds to the ferromagnetic film 23. In addition, the Ru film corresponds to the non-magnetic layer 12, and the upper NiFe/$(Ni_{81}Fe_{19})_{100-x}Ta_x$ structure corresponds to the second ferromagnetic layer 13. As for Embodiment 6b, the $(Ni_{81}Fe_{19})_{85}Zr_{15}$(1 nm)/NiFe(3 nm) structure corresponds to the first ferromagnetic layer 11, and the $(Ni_{81}Fe_{19})_{85Za15}$ film of 1 nm and the NiFe film of 3 nm correspond to the buffer film 22 and the ferromagnetic film 23, respectively.

The SAF of Embodiment 7 generally corresponds to the free magnetic layer 6 shown FIG. 7B. Specifically, the lower NiFe/$(Ni_{81}Fe_{19})_{100-x}Zr_x$ structure corresponds to the first ferromagnetic layer 11. In this structure, the NiFe film corresponds to the ferromagnetic film 21, and the $(Ni_{81}Fe_{19})_{100-x}Ta_x$ film corresponds to the buffer film 22. In addition, the Ru film corresponds to the non-magnetic layer 12, and the upper side $(Ni_{81}Fe_{19})_{100-x}Zr_x$/NiFe structure corresponds to the second ferromagnetic layer 13.

Figure 23A:
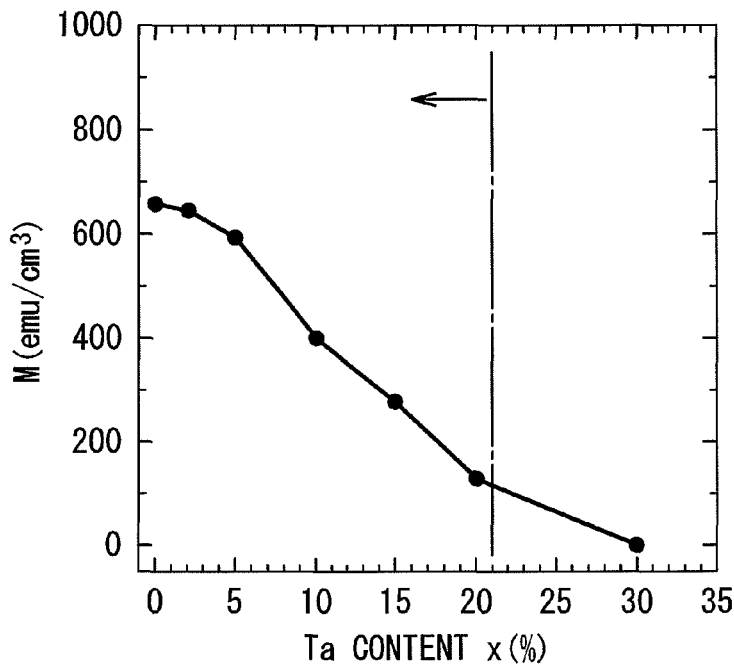
FIG. 23A is a graph showing the dependence of the magnetization M of a $(Ni_{81}Fe_{19})_{100-x}Ta_x$ film on the Ta context x.

FIG. 23A is a graph showing the dependence of the magnetization M of the $(Ni_{81}Fe_{19})_{100-x}Ta_x$ film on the Ta content x. As can be understood from FIG. 23A, the $(Ni_{81}Fe_{19})_{100-x}Ta_x$ film exhibits stable ferromagnetism when the Ta content x is 20 atomic % or less. This implies that when the buffer film 22 is composed of the $(Ni_{81}Fe_{19})_{100-x}Ta_x$ film, the Ta content x is preferably 20 atomic % or less.

Figure 23B:
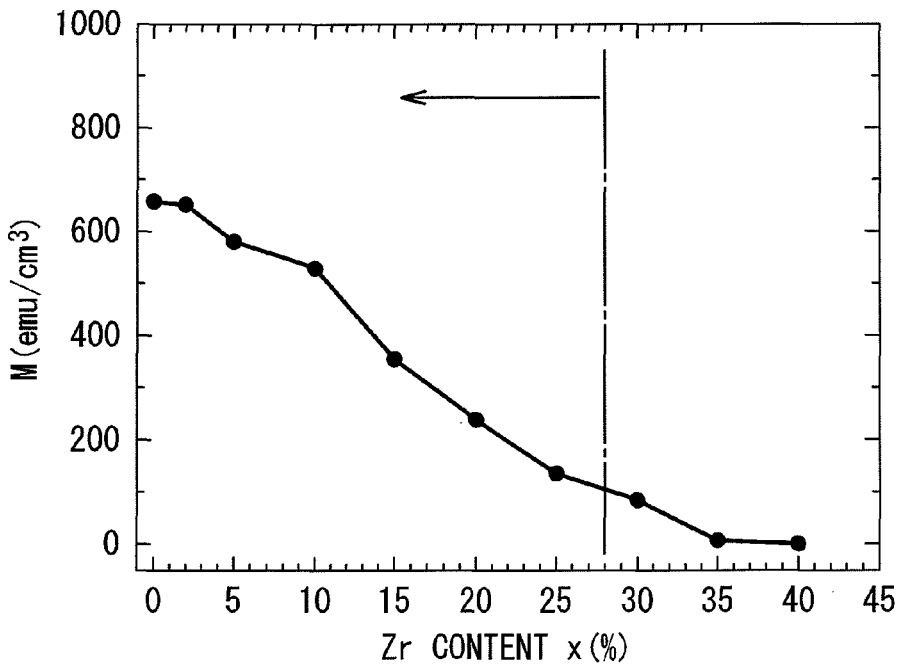
FIG. 23B is a graph showing the dependence of the magnetization M of a $(Ni_{81}Fe_{19})_{100-x}Zr_x$ film on the Zr context x.

FIG. 23B is a graph showing the dependence of the magnetization M of the $(Ni_{81}Fe_{19})_{100-x}Zr_x$ film on the Zr content x. The $(Ni_{81}Fe_{19})_{100-x}Zr_x$ film exhibits large magnetization and stable ferromagnetism, when the Zr content is 25 atomic % or less. This implies that the Zr content x is preferable 25 atomic % or less.

Figure 24:
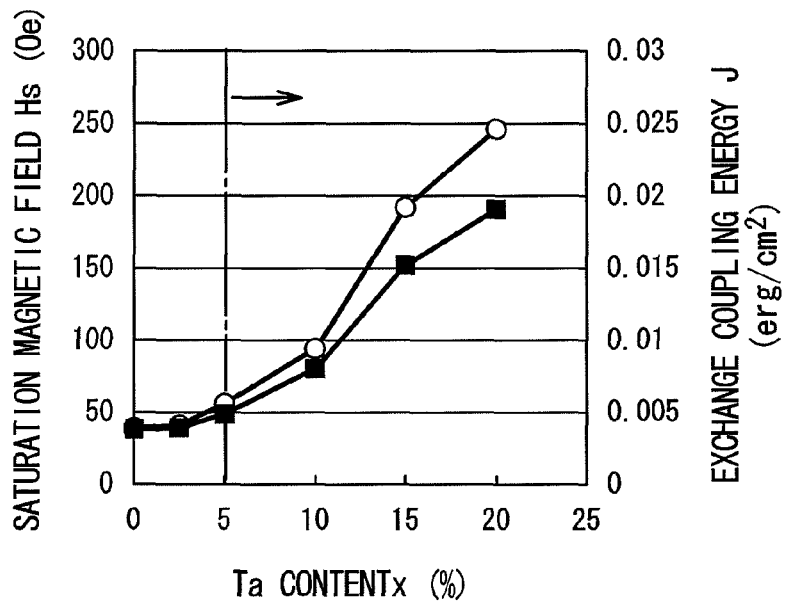
FIG. 24 is a graph showing the dependence of the exchange coupling energy J and saturation magnetic field $H_s$ of Embodiment 5 on the Ta context x.

FIG. 24 is a graph showing the dependence of the exchange coupling energy J and the saturation magnetic field $H_s$ of the SAF in Embodiment 5 on the Ta content x. As can be understood from FIG. 24, the saturation magnetic field $H_s$ and the exchange coupling energy J are increased when the Ta content x of the $(Ni_{81}Fe_{19})_{100-x}Ta_x$ film exceeds 5 atomic %. This implies that the increase in the Ta amount included in the $(Ni_{81}Fe_{19})_{100-x}Ta_x$ film leads to the enhancement of the crystal orientations of the Ru film and the NiFe film formed thereon. In other words, this proves the effectiveness of the use of the $(Ni_{81}Fe_{19})_{100-x}Ta_x$ film in the buffer film 22.

These results indicate that it preferable that the Ta content x of the $(Ni_{81}Fe_{19})_{100-x}Ta_x$ film ranges from 5 and 20 atomic % m in order to increase the saturation magnetic field $H_s$ and the exchange coupling energy J.

Figure 25:
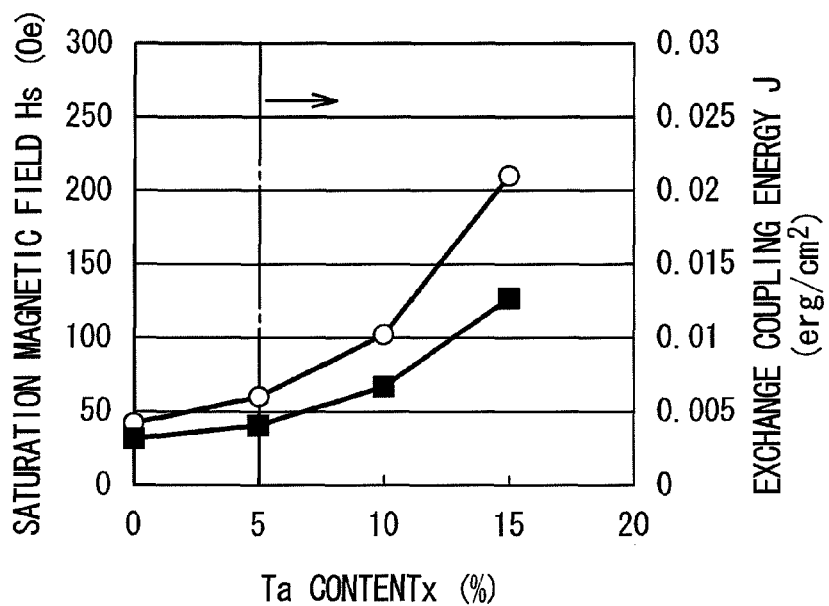
FIG. 25 is a graph showing the dependence of the exchange coupling energy J and saturation magnetic field $H_s$ of Embodiment 6 on the Ta content x.

FIG. 25 is a graph showing the dependence of the exchange coupling energy J and the saturation magnetic field $H_s$ of the SAF of Embodiment 6 on the Ta content x. Similarly to Embodiment 5, the structure in which the $(Ni_{81}Fe_{19})_{100-x}Ta_x$ film (namely, the buffer film 22) is directly formed on the $AlO_x$ film (namely, the tunnel barrier layer 5) effectively increases the saturation magnetic field $H_s$ and the exchange coupling energy J when the Ta content x exceeds 5 atomic %. This proves that the use of the $(Ni_{81}Fe_{19})_{100-x}Ta_x$ film as the buffer film 22 is also effective, when the buffer film 22 composed of the $(Ni_{81}Fe_{19})_{100-x}Ta_x$ film is directly formed on the tunnel barrier layer 5.

Additionally, the magnetization curves of the SAFs of Embodiments 5b, 6b, in which the $(Ni_{81}Fe_{19})_{85}Zr_{15}$ film of 1 nm is used as the buffer layer, have been measured. The measurement depicts that the saturation magnetic fields $H_s$ of the SAFs of Embodiments 5b, 6b are 125 (Oe) and 151 (Oe), respectively. As shown in FIG. 24, the $(Ni_{81}Fe_{19})_{100-x}Zr_x$ film is also effectively used as the buffer film 22, as is the case of the $(Ni_{81}Fe_{19})_{100-x}Ta_x$ film, so that the strength of the antiferromagnetic coupling has been increased by three times or more; the conventional SAF in which the buffer layer is not inserted (that is, the Ta content of the ferromagnetic films is 0%) has a saturation magnetic field of 42 (Oe). Additionally, as shown in FIG. 23B, the Zr content x is preferably 25 atomic % or less under the conditions that the $(Ni_{81}Fe_{19})_{100-x}Zr_x$ film exhibits stable ferromagnetisms.

Figure 26:
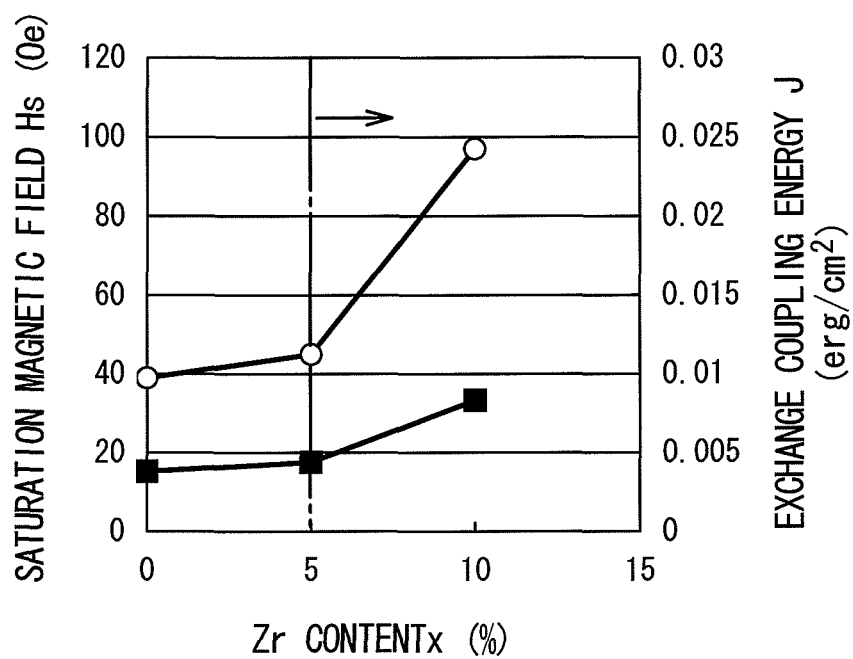
FIG. 26 is a graph showing the dependence of the exchange coupling energy J and saturation magnetic field $H_s$ of Embodiment 7 on the Ta context x.

FIG. 26 is a graph showing the dependence of the exchange coupling energy J and the saturation magnetic field $H_s$ of the SAF of Embodiment 7 on the Zr content x. The Zr content x is selected from 0, 5 and 10 atomic %. It should be noted that that the $(Ni_{81}Fe_{19})_{100-x}Zr_x$ film exhibits ferromagnetism with the Zr contents x of 0, 5 and 10 atomic %. As can be seen from FIG. 26, the saturation magnetic field $H_s$ and the exchange coupling energy J are increased when the Zr content x of the $(Ni_{81}Fe_{19})_{100-x}Zr_x$ film exceeds 5 atomic %. This proves the effectiveness of the use of the $(Ni_{81}Fe_{19})_{100-x}Zr_x$ film as the buffer film 22 directly contacted with the non-magnetic layer 12.

3. Third Experiment

The third experiment addresses proving that the structure shown in FIG. 8 allows the exchange coupling energy J to be controlled by controlling the thickness of the buffer film 22 (and the buffer film 27), and that the change in the exchange coupling energy J is accompanied by a only reduced change in the magneto-crystalline anisotropy field $H_k$. As mentioned above, the independent control of the exchange coupling energy J from the magneto-crystalline anisotropy field Hk is especially advantageous for achieving the toggle writing.

Specifically, a set of SAFs having the following structures are used to evaluate the exchange coupling energies J of the SAFs in which the buffer film 22 is formed within the first ferromagnetic layer 11:

Embodiment 8 substrate/Ta(20 nm)/NiFe(3 nm)/PtMn(20 nm)/CoFe(2.5 nm)/Ru(0.9 nm)/CoFe(2.5 nm)/Al(1 nm)$O_x$/$Ni_{81}Fe_{19}$(2 nm)/Ta($d_{Ta}$)/$Ni_{81}Fe_{19}$(2 nm)/Ru(2.1 nm)/$Ni_{81}Fe_{19}$(2 nm)/Ta($d_{Ta}$)/$Ni_{81}Fe_{19}$(2 nm)/Al(0.7 nm)$O_x$/Ta(5 nm)/Al(20 nm)/Ta(70 nm)

The layered structure on the top surface of the $AlO_x$ film, composed of the $Ni_{81}Fe_{19}$ film, the Ta film and the $Ni_{81}Fe_{19}$ film, corresponds to the first ferromagnetic layer 11. Within the layered structure on the $AlO_x$ film, the Ta film having a thickness of $d_{Ta}$ (nm) corresponds to the buffer film 22. Correspondingly, the layered structure on the top surface of the Ru film of 2.1 nm (corresponding to the non-magnetic layer 12), composed of the $Ni_{81}Fe_{19}$ film, the Ta film and the $Ni_{81}Fe_{19}$ film, corresponds to the second ferromagnetic layer 13. Within the layered structure on the Ru film of 2.1 nm, the Ta film having a thickness of $d_{Ta}$ (nm) corresponds to the buffer film 27. The thickness $d_{Ta}$ of the Ta film is selected from the range between 0 and 0.4 nm. The sample in which the Ta film has a thickness of 0 nm corresponds to the SAF in which the buffer film 22 is not formed, namely, the SAF of the comparative example.

Figure 27:
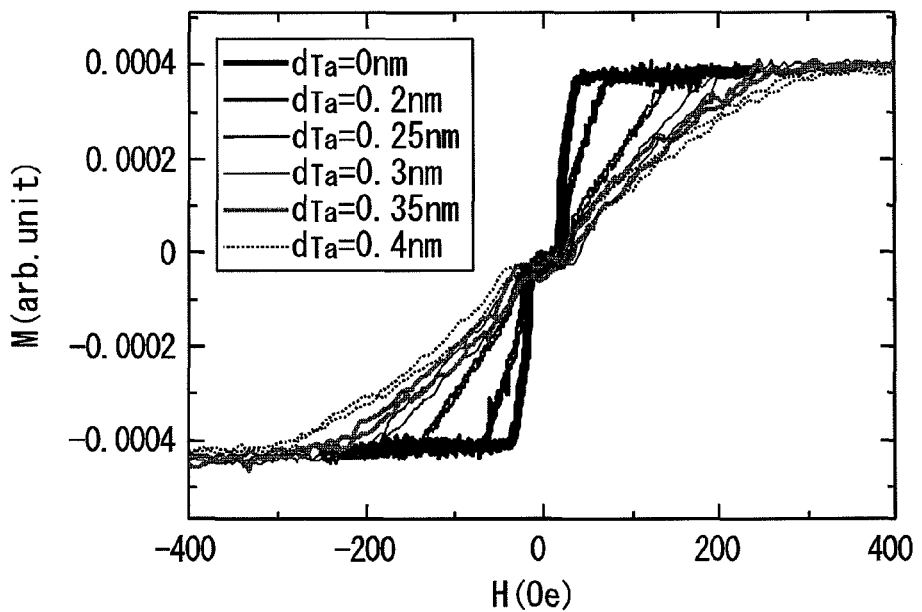
FIG. 27 is a graph showing the magnetization curve of the SAF of Embodiment 8 of the present invention, which includes a Ta film as a buffer film.
Figure 28:
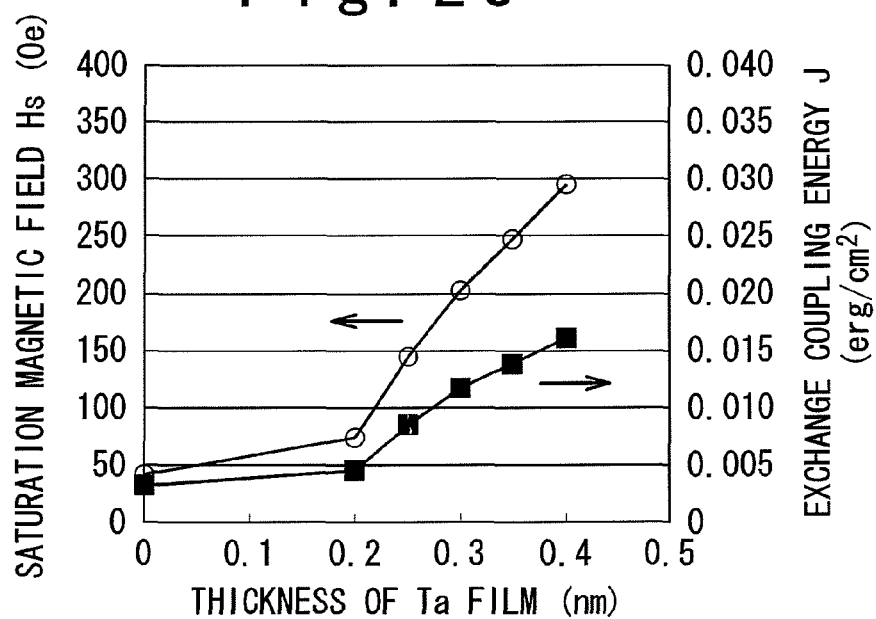
FIG. 28 is a graph showing a relation between a saturation magnetic field $H_s$ and a thickness of the Ta film used as the buffer film of the SAF of Embodiment 8.

FIG. 27 is the magnetization curves of the SAFs of Embodiments 8. As shown in FIG. 27, the saturation magnetic field $H_s$ is changed on the basis of the thickness $d_{Ta}$ of the Ta film used as the buffer film 22 (and the buffer film 27). FIG. 28 is a graph showing the dependence of the exchange coupling energy J and the saturation magnetic field $H_s$ on the thickness of the Ta film. When the thickness of the Ta film functioning as the buffer film 22 is increased from 0 nm to 0.4 nm, the saturation magnetic field $H_s$ is increased from 42 (Oe) to 295 (Oe), and the exchange coupling energy J is also increased from 0.00317 (erg/cm$^2$) to 0.01601 (erg/cm$^2$). This fact indicates that the exchange coupling energy J can be controlled by controlling the thickness of the buffer film 22 (and the buffer film 27).

The controllability of the exchange coupling energy J is surely one important feature of the present invention. However, the conventional technique also allows the control of the exchange coupling energy J. For example, as is conventionally known, the control of the exchange coupling energy J can be attained by forming CoFe films directly on the non-magnetic layer 12 within the first and second ferromagnetic layers 11 and 13, and then controlling the thicknesses of the CoFe films.

Specifically, SAFs having the following structure provides the control of the exchange coupling energy J with a thickness $d_{CoFe}$ of the CoFe film.

Comparative Example 5 substrate/Ta(20 nm)/NiFe(3 nm)/PtMn(20 nm)/CoFe(2.5 nm)/Ru(0.9 nm)/CoFe(2.5 nm)/Al(1 nm)$O_x$/$Ni_{81}Fe_{19}$(4 nm)/CoFe($d_{CoFe}$)/Ru(2.1 nm)/CoFe($d_{CoFe}$)/$Ni_{81}Fe_{19}$(4 nm)/Al(0.7 nm)$O_x$/Ta(5 nm)/Al(20 nm)/Ta(70 nm)

Figure 29:
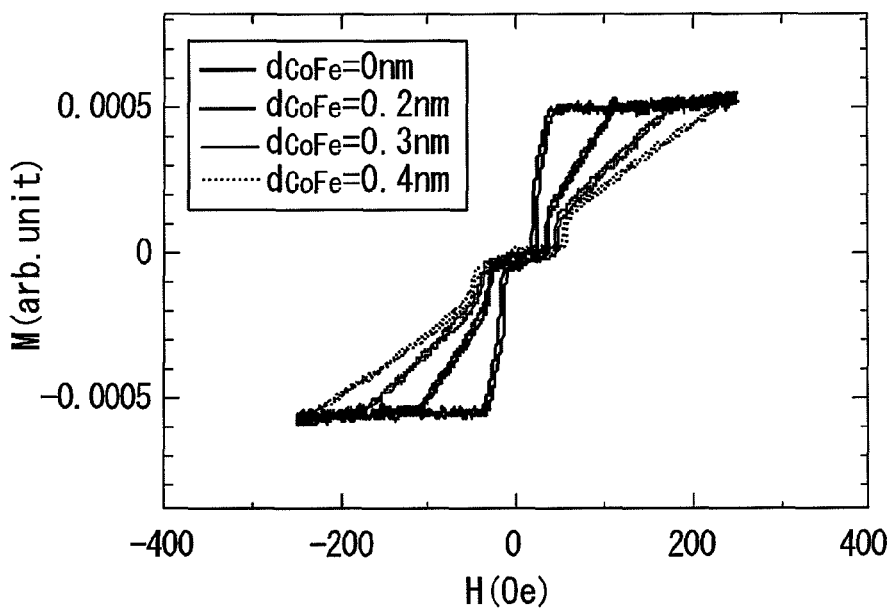
FIG. 29 is a graph showing a magnetization curve of the SAF of Comparative Example 5, which includes a CoFe film within ferromagnetic layers.
Figure 30:
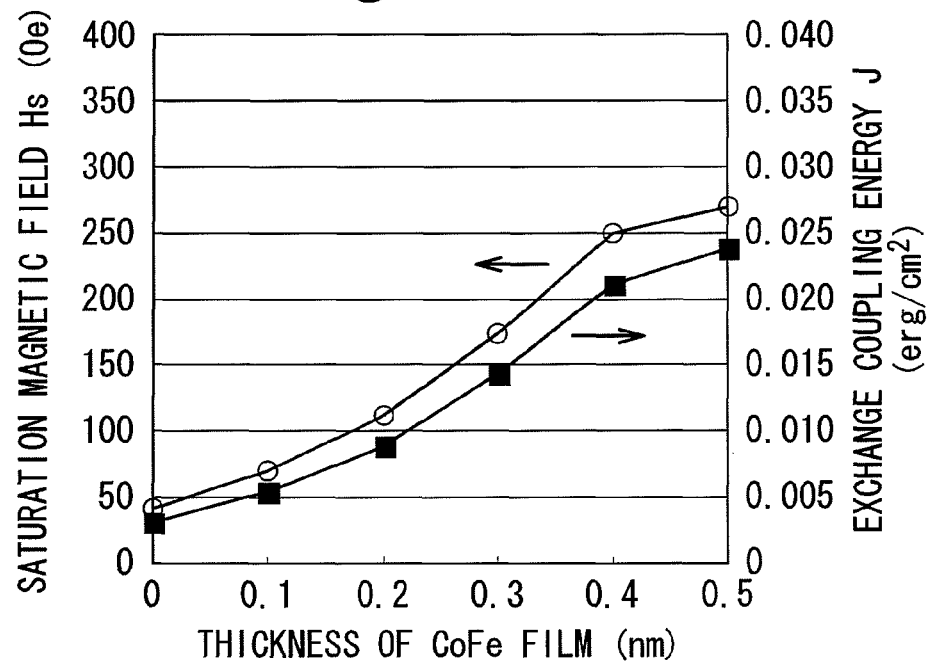
FIG. 30 is a graph showing a relation between a saturation magnetic field $H_s$ and the thickness of the CoFe film of the SAF of Comparative Example 5.

FIG. 29 is the magnetization curves of the SAFs having the above-described structure. As shown in FIG. 29, the saturation magnetic field $H_s$ is changed on the thickness $d_{CoFe}$ of the CoFe film. FIG. 30 is a graph showing the dependence of the exchange coupling energy J and the saturation magnetic field $H_s$ on the thickness of the Ta film. When the thickness of the CoFe film is increased from 0 nm to 0.4 nm, the saturation magnetic field $H_s$ is increased from 42 (Oe) to 249 (Oe), and the exchange coupling energy J is also increased from 0.00317 (erg/cm$^2$) to 0.02114 (erg/cm$^2$).

However, one advantage of the present invention as compared with the technique of controlling the exchange coupling energy J by the thickness $d_{CoFe}$ of the CoFe film is that the exchange coupling energy J is accompanied by a small change in the magneto-crystalline anisotropy field $H_k$. This fact is proved by using samples having the following structures:

Embodiment 8' substrate/Ta(20 nm)/Al(1 nm)$O_x$/$Ni_{81}Fe_{19}$(2 nm)/Ta($d_{Ta}$)/$Ni_{81}Fe_{19}$(2 nm)/Ru(2.1 nm)/Ta(10 nm)

Comparative Example 5' substrate/Ta(20 nm)/Al(1 nm)$O_x$/$Ni_{81}Fe_{19}$(4 nm)/CoFe($d_{CoFe}$)/Ru(2.1 nm)/Ta(10 nm)

It should be noted that the sample of Embodiment 8' has a structure corresponding to Embodiment 8, and the sample of Comparative Example 5' has a structure corresponding to Comparative Example 5. In detail, the sample of Embodiment 8' is the sample used for the measurement of the magneto-crystalline anisotropy field $H_k$ of the portion corresponding to the first ferromagnetic layer 11 within Embodiment 8. Correspondingly, the sample of Comparative Example 5' is the sample used for the measurement of the magneto-crystalline anisotropy field $H_k$ of the corresponding portion, in Comparative Example 5.

Figure 31A:
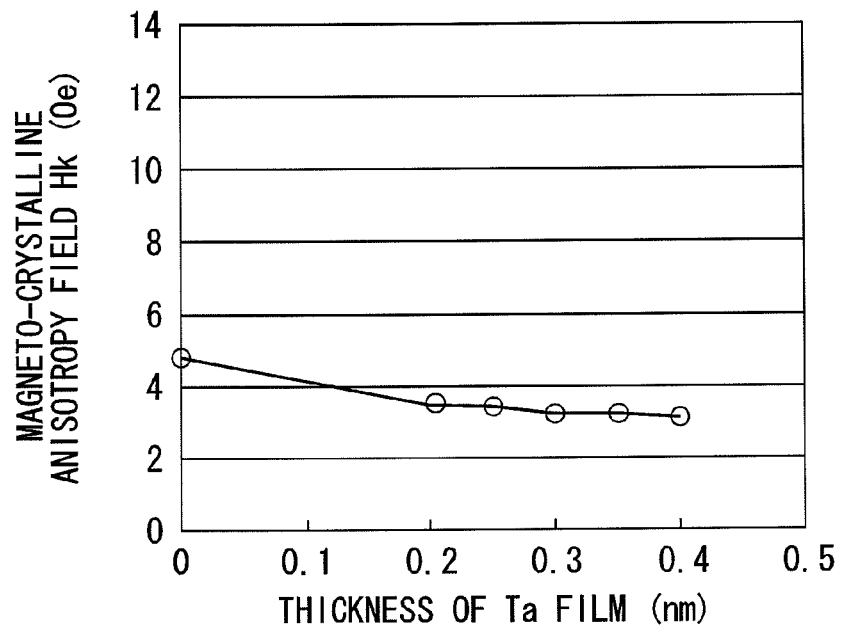
FIG. 31A is a graph showing a relation between the magneto-crystalline anisotropy field $H_k$ and the thickness of the Ta film of the SAF of Embodiment 8 of the present invention.
Figure 31B:
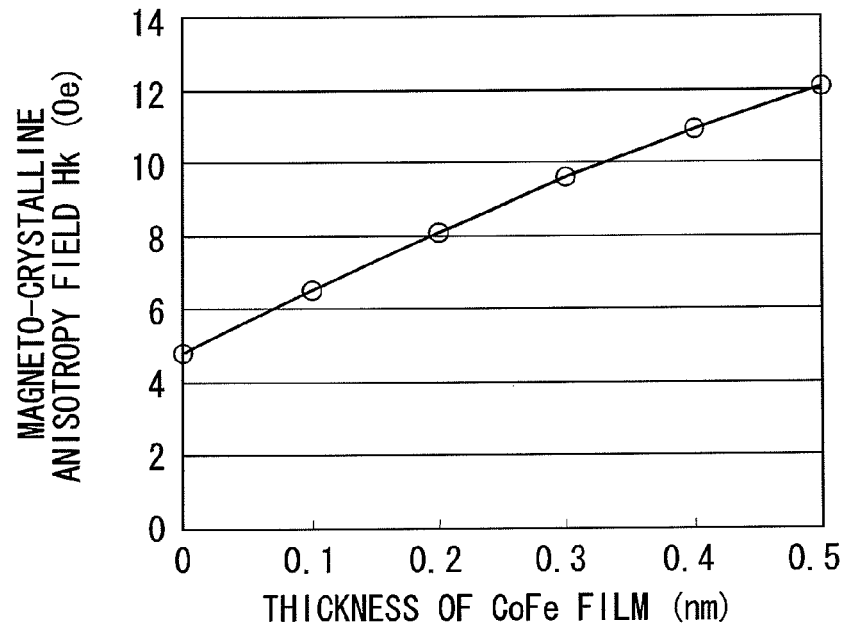
FIG. 31B is a graph showing a relation between the magneto-crystalline anisotropy field $H_k$ and the thickness of the CoFe film of the SAF of Comparative Example 5.

FIG. 31A is a graph showing the magneto-crystalline anisotropy field $H_k$ of Embodiment 8', and FIG. 31B is a graph showing the magneto-crystalline anisotropy field $H_k$ of Comparative Example 5'. As shown in FIG. 31B, Comparative Example 5' exhibits a remarkable increase in the magneto-crystalline anisotropy field $H_k$ as the increase in the thickness of the CoFe film. This implies that the control of the exchange coupling energy J on the thickness of the CoFe film is undesirably accompanied by the change in the magneto-crystalline anisotropy field $H_k$. On the contrary, as shown in FIG. 31A, Embodiment 8' exhibits a reduced change in the magneto-crystalline anisotropy field $H_k$ as the increase in the thickness of the Ta film. This implies that the exchange coupling energy J is controllable on the thickness of the Ta film, without a significant change in the magneto-crystalline anisotropy field $H_k$.

Minutely patterned free magnetic layers require the decrease in the shape magnetic anisotropy for decreasing the switching magnetic field $H_c$ thereof. This is achieved by reducing a magnetization and thickness product (namely, the product of the film thickness and the saturation magnetization of the free magnetic layer). However, it is not preferable that the reduction in the magnetization and thickness product is accompanied by the change in the magneto-crystalline anisotropy field $H_k$. It is also undesirable that the exchange coupling energy J is decreased accordingly. In the following, the allowability of the reduction in the magnetization and thickness product is examined from the viewpoint of the magneto-crystalline anisotropy field $H_k$ and the exchange coupling energy J, with respect to Embodiment 8 and Comparative Example 5.

FIG. 32 is a table showing the dependence of the magneto-crystalline anisotropy field $H_k$ and the exchange coupling energy J on the thickness of the $Ni_{81}Fe_{19}$ film with respect to the samples of Embodiment 8 and Comparative Example 5. As can be understood from FIG. 32, an advantage of the structure of Embodiment 8 is that the sufficient exchange coupling energy J is maintained without any substantial change in the magneto-crystalline anisotropy field $H_k$, when the thickness of the free magnetic layer is reduced to thereby reduce the shape magnetic anisotropy. The structure of Comparative Example 5 suffers from a remarkable increase in the magneto-crystalline anisotropy field $H_k$ when the film thickness of the $Ni_{81}Fe_{19}$ film is reduced to reduce the magnetization and thickness product. This is caused by the increase in the ratio of the volume of the CoFe films to the volume of the SAF. As mentioned above, the reduction in the film thickness of the CoFe is accompanied by a significant decrease in the exchange coupling energy J, although it may avoid the increase in the magneto-crystalline anisotropy field $H_k$. On the other hand, the structure of Embodiment 8 achieves a saturation magnetic field $H_s$ of 150 (Oe) or more, and a sufficiently large exchange coupling energy J with a reduced change in the magneto-crystalline anisotropy field $H_k$, even when the film thickness of the $Ni_{81}Fe_{19}$ film is reduced. Additionally, the structure of Embodiment 8 allows a significant reduction in the magnetization and thickness product, as compared with the structure of Comparative Example 5.

As explained above, the structure of Embodiment 8 of the present invention allows the flexible control of the exchange coupling energy J on of the thickness of the Ta film of the buffer layer. In addition, the control of the exchange coupling energy J on the thickness of the Ta film and the thickness of the NiFe film is accompanied by only a small change in the magneto-crystalline anisotropy field $H_k$. Also, the structure of Embodiment 8 allows the significant reduction in the magnetization and thickness product. Such advantages are not obtained by the structure of Comparative Example 5.

4. Fourth Embodiment

The fourth experiment addresses proving that the structure in which the amorphous buffer layer inserted within the second ferromagnetic layer, such as the structure shown in FIG. 13, allows the controllable reduction of the exchange coupling energy J. In this experiment, a very thin $SiO_2$ film is used as the amorphous buffer layer.

Specifically, a set of SAFs having the following structures have been manufactured, and the exchange coupling energies J thereof have been measured:

substrate/Ta(20 nm)/NiFe(3 nm)/PtMn(20 nm)/CoFe(2.5 nm)/Ru(0.9 nm)/CoFe(2.5 nm)/underlayer/$Ni_{81}Fe_{19}$ (1.5 nm)/$SiO_2$($d_{SiO2}$)/Ta(0.3 nm)/$Ni_{81}Fe_{19}$(1.5 nm)/Ru(2.1 nm)/NiFe(2.5 nm)/Al(0.7 nm)$O_x$/Ta(5 nm)/Al(20 nm)/Ta(70 nm)

The underlayer is selected between an Al(1 nm)$O_x$ layer and an Al(1 nm)$O_x$/Ru(3 nm) layered structure. It should be noted that the Al(1 nm)$O_x$ layer is a layer obtained by the oxidization of an Al film of 1 nm, as mentioned above. The NiFe/$SiO_2$/Ta/NiFe film stack formed on the underlayer corresponds to the second ferromagnetic layer 13 in FIG. 13. In detail, the $SiO_2$ film corresponds to the amorphous buffer film 27A, and the Ta film corresponds to the orientation control buffer film 27B. The thickness $d_{SiO2}$ of the $SiO_2$ film are selected from the range between 0 and 1 nm.

Figure 33:
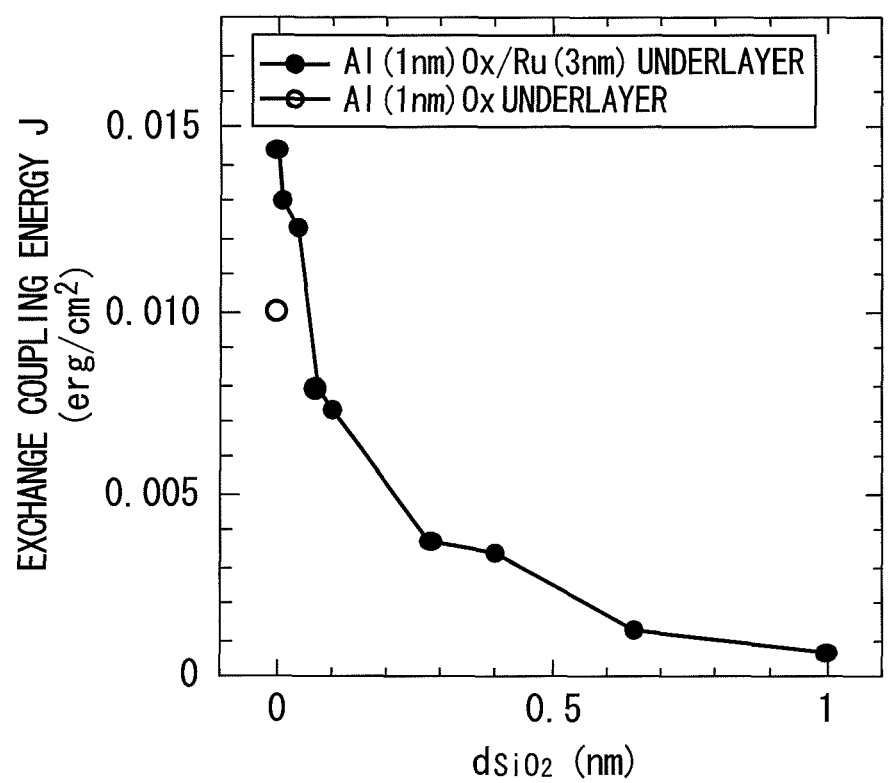
FIG. 33 is a graph showing a relation between the exchange coupling energy J and the thickness of a $SiO_2$ film used as an amorphous buffer film.

FIG. 33 is a graph showing the dependence of the exchange coupling energy J of the SAFs of the above-described structure on the film thickness of the $SiO_2$ film. When the $SiO_2$ film is not inserted (namely, when $d_{SiO2}$ is 0 nm), the SAF provides the exchange coupling energy J of 0.0144 (erg/cm$^2$). The exchange coupling energy J is decreased as the thickness of the $SiO_2$ film is increased. When the thickness of the $SiO_2$ film is increased up to 1 nm, the exchange coupling energy J is reduced down to approximately 0.

The result of FIG. 33 proves that the exchange coupling energy J can be controllably decreased by inserting the amorphous buffer layer into the ferromagnetic layer.

5. Fifth Experiment

The fifth embodiment addresses proving that the insertion of the amorphous buffer layer allows the control of the exchange coupling energy J and thereby provides the flexible control of the saturation magnetic field $H_s$ of the SAF.

Specifically, MTJ elements including SAFs having the following structures have been manufactured and the magnetization curves (and the saturation magnetic fields of the SAFs have been measured:

SAF of Embodiment 9

Present Invention $Ni_{81}Fe_{19}$(2 nm)/Ta(0.225 nm)/$Ni_{81}Fe_{19}$(2 nm)/Ru(2.1 nm)/$Ni_{81}Fe_{19}$(2 nm)/Ta(0.225 nm)/$Ni_{81}Fe_{19}$(2 nm)/$SiO_2$ ($d_{SiO2}$)/$Ni_{81}Fe_{19}$(2 nm)/Ta($d_{Ta}$)/$Ni_{81}Fe_1$ (2 nm)/Ru(2.1 nm)/$Ni_{81}Fe_{19}$(2 nm)/Ta($d_{Ta}$)/$Ni_{81}Fe_{19}$(2 nm)

SAF of Comparative Example 6

$Ni_{81}Fe_{19}$(3 nm)/CoFe(0.35 nm)/Ru(2.1 nm)/$Ni_{81}Fe_{19}$(3 nm)/CoFe(0.35 nm)/Ru($d_{Ru}$)/$Ni_{81}Fe_{19}$ (3.7 nm)

The thicknesses $d_{SiO2}$ of the $SiO_2$ films of the SAFs of Embodiment 9 are selected from 0, 0.04, and 0.24 nm. The thicknesses dTa of the Ta films are selected from 0.225 nm and 0.30 nm.

On the other hand, the thicknesses $d_{Ru}$ of the Ru films of the SAFs of Comparative Example 6 are selected from 3.5 nm and 4.9 nm. Such selection addresses examining the controllability of magnitude of the exchange coupling, in other words, the saturation magnetic field $H_s$ on the basis of the thickness $d_{Ru}$ of the Ru film. It should be noted that the Ru film is allowed to have a thickness corresponding to the peak of the antiferromagnetic exchange coupling energy. The thickness of 3.5 nm corresponds to the second-order peak, and the thickness of 4.9 nm corresponds to the third-order peak. The unstable antiferromagnetic coupling prevents the SAF from exhibiting desired functions, when the Ru film has a thickness different from the thicknesses corresponding to the peaks of the antiferromagnetic exchange coupling energy.

The MTJ elements incorporating the SAFs having the above-described structures have been designed to have the following structure as a whole:

substrate/Ta(20 nm)/NiFe(3 nm)/PtMn(20 nm)/CoFe(2.5 nm)/Ru(0.9 nm)/CoFe(2.5 nm)/Al(1 nm)$O_x$/SAF/Al(0.7 nm)$O_x$/Ta(5 nm)/Al(20 nm)/Ta(70 nm)

Figure 34A:
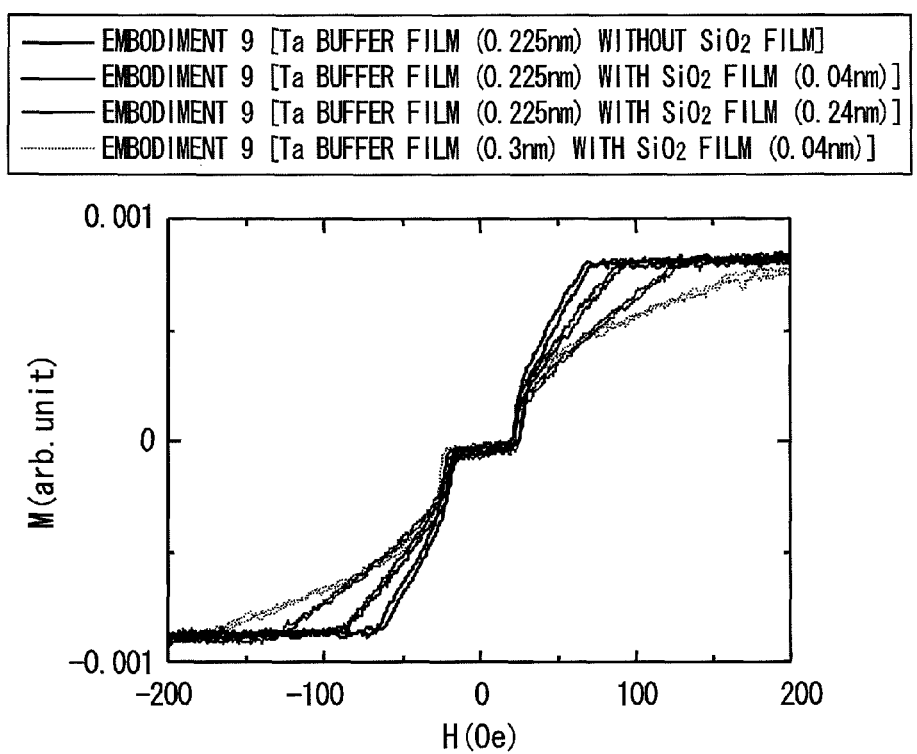
FIG. 34A is a graph showing a magnetization curve of the SAF of Embodiment 9 of the present invention.

As shown in FIG. 34A, the structure of the SAFs of Embodiment 9 allows the control of the saturation magnetic field $H_s$ on the basis of the thickness $d_{SiO2}$ of the $SiO_2$ film and the thickness $d_{Ta}$ of the Ta film. Specifically, the SAF of Embodiment 9 achieves a saturation magnetic field $H_s$ of 68 (Oe) with a $SiO_2$ film thickness $d_{SiO2}$ of 0.24 nm and a Ta film thickness $d_{Ta}$ of 0.225 nm. The saturation magnetic field $H_s$ is increased up to 188 (Oe) by decreasing the thickness of the $SiO_2$, or increasing the thickness of the Ta film (in the range where the ferromagnetic coupling between the NiFe films is not disturbed). Specifically, the SAF of Embodiment 9 achieves a saturation magnetic field $H_s$ of 188 (Oe) with a $SiO_2$ film thickness $d_{SiO2}$ of 0.04 nm and a Ta film thickness $d_{Ta}$ of 0.3 nm. The results shown in FIG. 34A indicate that the proper control of the thickness $d_{SiO2}$ of the $SiO_2$ film and the thickness $d_{Ta}$ of the Ta film allows the control of the magnitude of the antiferromagnetic exchange coupling through the Ru film, and consequently enables the flexible control of the saturation magnetic field $H_s$.

Figure 34B:
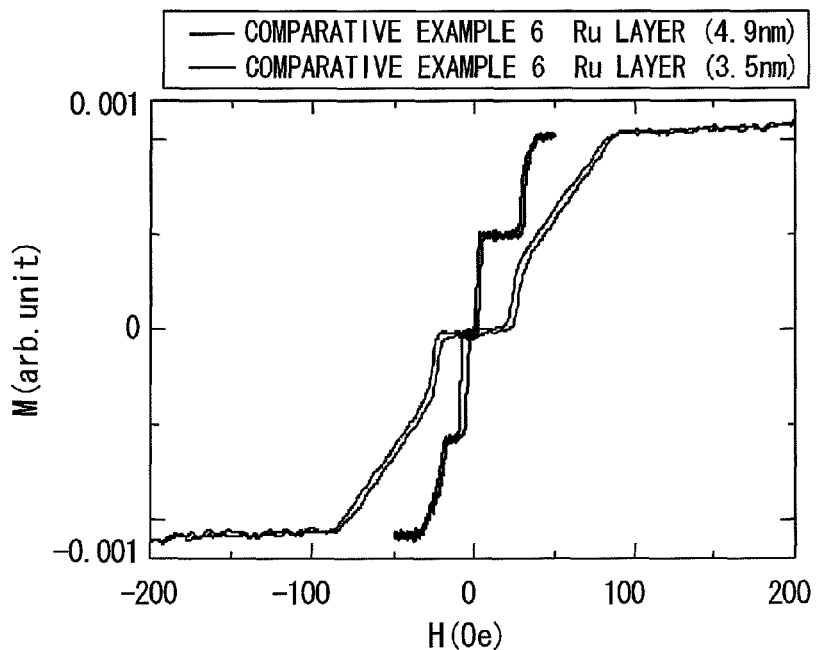
FIG. 34B is a graph showing a magnetization curve of the SAF of Comparative Example 6.

On the other hand, as shown in FIG. 34B, the SAF of Comparative Example 6 exhibits a saturation magnetic field $H_s$ of 90 (Oe) with a Ru film thickness $d_{Ru}$ of 3.5 nm. However, the SAF of Comparative Example 6 does not provide desired functions, when the thickness $d_{Ru}$ of the Ru film is increased up to 4.9 nm. This is because the sufficiently strong antiferromagnetic exchange coupling is not exerted through the Ru film, when the thickness $d_{Ru}$ of the Ru film is increased up to 4.9 nm. The result of FIG. 34B indicates that the essential difficulty exists in controlling the saturation magnetic field $H_s$ of the SAF of Comparative Example 6 through the thickness $d_{Ru}$ of the Ru film.

6. Sixth Experiment

The sixth experiment addresses proving that advantages of the insertion of the buffer layer (namely, the effectiveness of the structure of FIG. 16) for the SAF used as the fixed magnetic layer formed on the upper surface of the tunnel barrier layer. As mentioned above, the ferromagnetic layers and the non-magnetic layer placed therebetween exhibit poor crystal orientation within the SAF, when the SAF used as the fixed magnetic layer is formed on the upper surface of the tunnel barrier layer. This undesirably leads to deteriorated antiferromagnetic coupling between the ferromagnetic layers. The deteriorated antiferromagnetic coupling may undesirably cause the orientations of the magnetizations of the ferromagnetic layers to be directed in the same direction by an external magnetic field. This is not preferable for using the SAF as the fixed magnetic layer. The fifth experiment has proved that the insertion of the buffer layer enhances the antiferromagnetic exchange coupling, and thereby allows providing an SAF-based fixed magnetic layer free from influences of the external magnetic field.

Specifically, MTJ elements having the following structures have been manufactured, and the magnetization curves of the SAFs incorporated therein have been measured:

substrate/Ta (20 nm)/Ni$_{81}$Fe$_{19}$(4 nm)/Al(0.99 nm)O$_x$/SAF fixed magnetic layer/PtMn(20 nm)/Ta(10 nm)

The structure of the SAF fixed magnetic layer is as follows:

Embodiment 10

Ni$_{81}$Fe$_{19}$(2 nm)/Ta(0.3 nm)/Ni$_{81}$Fe$_{19}$(2.8 nm)/Ru(0.9 nm)/Ni$_{81}$Fe$_{19}$(4 nm)

Embodiment 11

Ni$_{81}$Fe$_{19}$(2 nm)/Ta(0.4 nm)/Ni$_{81}$Fe$_{19}$(2.8 nm)/Ru(0.9 nm)/Ni$_{81}$Fe$_{19}$(4 nm)

Comparative Example 7

Ni$_{81}$Fe$_{19}$ (4 nm)/Ru(0.9 nm)/Ni$_{81}$Fe$_{19}$(4 nm)

Comparative Example 8

Ni$_{81}$Fe$_{19}$ (3 nm)/Ru(0.9 nm)/Ni$_{81}$Fe$_{19}$(3 nm)

Regarding the SAF fixed magnetic layer in Embodiments 10 and 11, it should be noted that the Ta film having the thickness of 0.3 nm or 0.4 nm corresponds to the buffer layer 52 in FIG. 16, and the NiFe films on the top and bottom surfaces thereof correspond to the ferromagnetic films 51 and 53. Moreover, the Ru film corresponds to the non-magnetic layer 42, and the NiFe film having the thickness of 4 nm formed thereon corresponds to the second ferromagnetic layer 43.

Figure 35A:
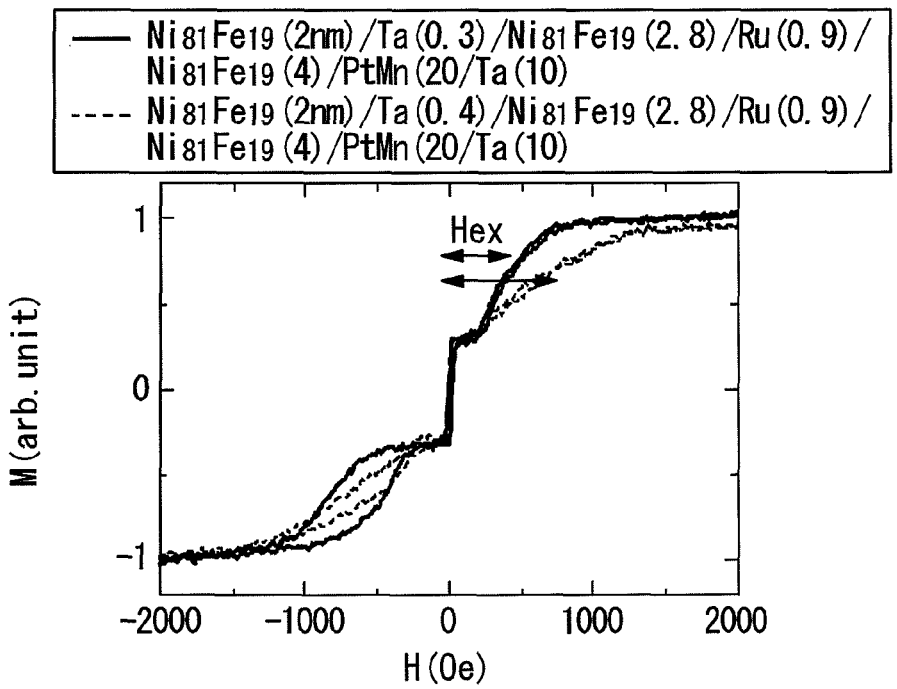
FIG. 35A is a graph showing magnetization curves of the SAFs of Embodiments 10 and 11 of the present invention.
Figure 35B:
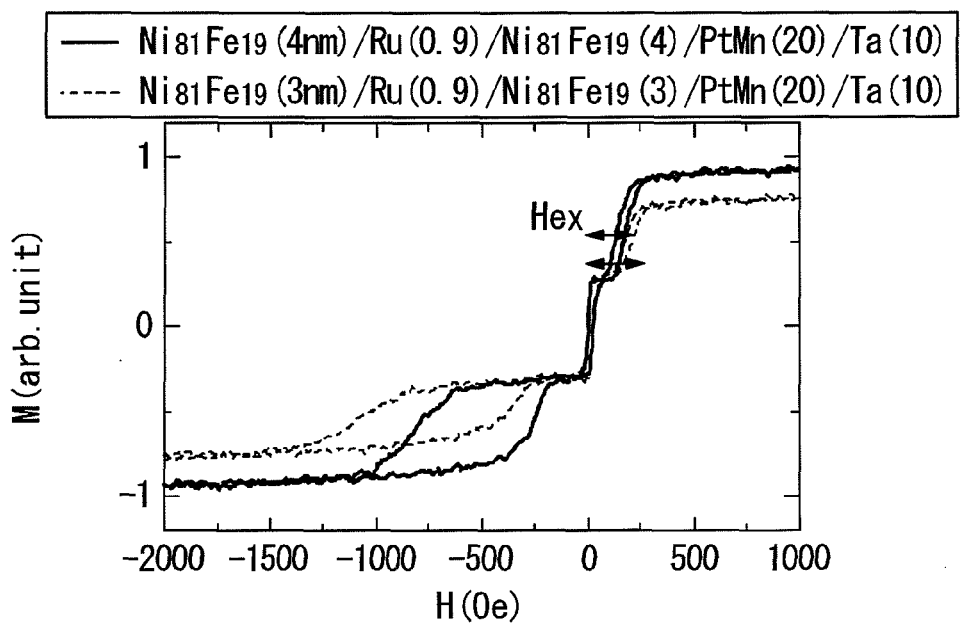
FIG. 35B is a graph showing magnetization curves of the SAFs of Comparative Examples 7 and 8.

FIG. 35A is a graph showing the magnetization curves of the SAF fixed magnetic layers of Embodiments 10 and 11, and FIG. 35B is a graph showing the magnetization curves of the SAF fixed magnetic layers in Comparative Examples 7 and 8. As shown in FIG. 35B, the SAF fixed magnetic layers of Comparative Examples 7, 8 exhibit requested properties of the SAF, only when the external magnetic field $H_{ex}$ is positive; the antiferromagnetic coupling between the ferromagnetic layers is easily released when the external magnetic field $H_{ex}$ is negative, as can be understood from the fact that the large hysteresis appears in the graph shown in FIG. 35B. Additionally, the application of the relatively small external magnetic field $H_{ex}$ undesirably releases the antiferromagnetic coupling, when the external magnetic field $H_{ex}$ is positive. Specifically, the antiferromagnetic coupling of the magnetizations of the ferromagnetic layers is released at an external magnetic field $H_{ex}$ of 202 (Oe) in the SAF fixed magnetic layer of Comparative Example 7. As for the Comparative Example 8, the antiferromagnetic coupling is released at an external magnetic field $H_{ex}$ of 168 (Oe).

On the other hand, the SAF fixed magnetic layers in Embodiments 10 and 11 exhibits a reduced hysteresis for the negative external magnetic field $H_{ex}$. In addition, the antiferromagnetic coupling is not released, unless an excessively large positive external magnetic field $H_{ex}$ is applied. Specifically, the antiferromagnetic coupling of the magnetizations of the ferromagnetic layers is released at an external magnetic field $H_{ex}$ of 475 (Oe) in the SAF fixed magnetic layer of Embodiment 10. As for the Embodiment 11, the antiferromagnetic coupling is released at an external magnetic field $H_{ex}$ of 706 (Oe).

This result indicates:

(1) The insertion of the buffer layer improves the crystalline orientation of the Ru film and increases the exchange coupling between the ferromagnetic layers in the SAF fixed magnetic layer; and (2) The insertion of the buffer layer improves the crystal orientation of the NiFe film formed on the Ru film and the PtMn film formed thereon, and thereby enhances the exchange coupling between the PtMn film and the SAF fixed magnetic layer.

7. Seventh Experiment

The seventh experiment addresses proving the effectiveness of the buffer insertion in an MTJ element in which a crystalline MgO film that exhibits high (001) orientation is used as the tunnel barrier layer, and an SAF film stack is used as the free magnetic layer formed thereon. In this experiment, MTJ elements having the following structures have been manufacture through a magnetron sputtering:

Embodiment 12

Substrate/Ta(10 nm)/PtMn(15 nm)/CoFe(2.5 nm)/Ru(0.9 nm)/Co$_{40}$Fe$_{40}$B$_{20}$ (2.5 nm)/MgO(2 nm)/Ni$_{81}$Fe$_{19}$(2 nm)/Ta (d$_{Ta}$)/Ni$_{81}$Fe$_{19}$ (2 nm)/Ru(2.1 nm)/Ni$_{81}$Fe$_{19}$(2 nm)/Ta(d$_{Ta}$)/Ni$_{81}$Fe$_{19}$(2 nm)/Al(0.7 nm)O$_x$/Ta(10 nm)

The layered structure on the MgO tunnel barrier film, composed of the Ni$_{81}$Fe$_{19}$ film, the Ta film and the Ni$_{81}$Fe$_{19}$ film, corresponds to the first ferromagnetic layer 11. Within the layered structure on the MgO tunnel barrier film, the Ta film of the thickness d$_{Ta}$(nm) corresponds to the buffer film 22.

Similarly, the layered structure on the Ru film of 2.1 nm (corresponding to the non-magnetic layer 12), composed of the $Ni_{81}Fe_{19}$ film, the Ta film and the $Ni_{81}Fe_{19}$ film, corresponds to the second ferromagnetic layer 13. Within the layered structure on the Ru film, the Ta film having a thickness of $d_{Ta}$ (nm) corresponds to the buffer film 27. The thickness $d_{Ta}$ of the Ta film is selected from the range between 0 and 0.35 nm. The sample in which the Ta film has a thickness $d_{Ta}$ of 0 nm designates the SAF in which the buffer film 22 is not formed, namely, the SAF of the comparative example. The free magnetic layers have the same structure as the free magnetic layers on the $AlO_x$ barrier presented in the third experiment. The MgO barrier film has been formed through sputtering an MgO target. A TEM analysis is used to confirm that the formed MgO film exhibits crystalline structure with high (001) orientation. Then, the magnetoresistance ratios of the MTJ elements of Embodiment 12 range from 50% to 55% at a bias voltage of 1 mV, while the magnetoresistance ratios of the MTJ elements of Embodiment 8, which incorporate an $AlO_x$ barrier, range from 30% to 35%. This implies that the MTJ elements with the MgO barrier exhibit superior magnetoresistance ratio, as compared with the $AlO_x$ barrier. Such high magnetoresistance ratios result from the high (001) orientation of the MgO barrier.

Figure 36:
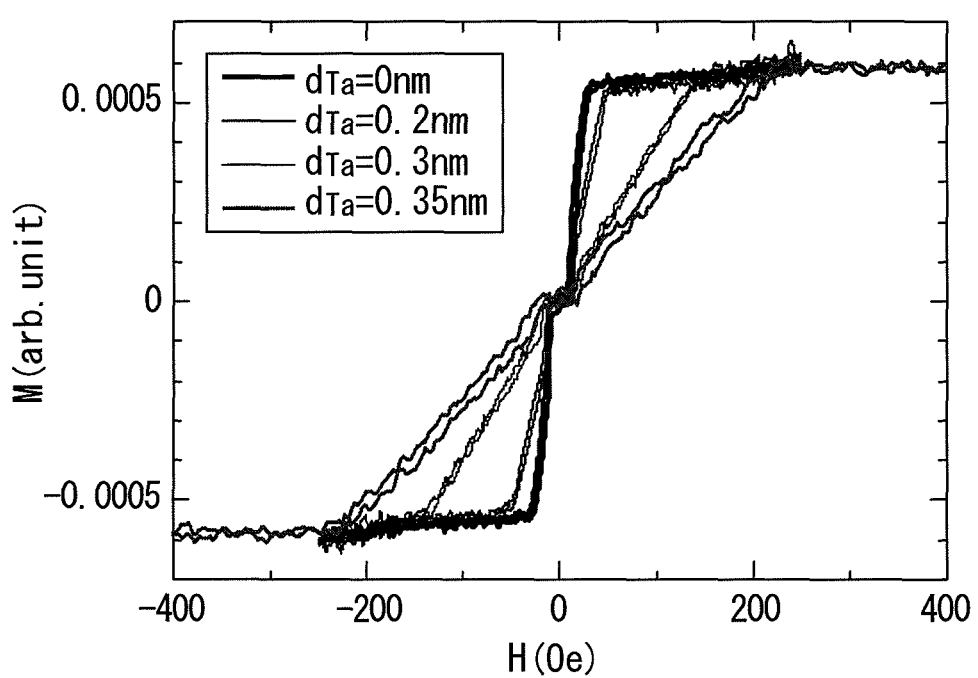
FIG. 36 is a graph showing a magnetization curve of SAF of Embodiment 12 of the present invention, which includes a Ta film as a buffer film.

FIG. 36 is the magnetization curves of the SAFs of the above-described structure. The obtained magnetization curves represent behaviors similar to the curves shown in FIG. 27. The saturation magnetic field $H_s$ is changed on the thickness $d_{Ta}$ of the Ta film used as the buffer film 22 (and the buffer film 27). The saturation magnetic field $H_s$ is increased as the increase in the buffer thickness. Specifically, the saturation magnetic field $H_s$ is increased from 33 (Oe) to 255 (Oe) as the thickness of the Ta film functioning as the buffer film 22 is increased from 0 nm to 0.35 nm. This fact indicates that the Ta buffer layer enhances the exchange coupling through the non-magnetic layer Ru within the SAFs, and the exchange coupling energy J is controllable by the thickness of the buffer film 22 (and the buffer film 27), when the tunnel barrier is formed of a crystalline MgO film.

Additionally, the use of a Zr buffer layer in place of the Ta buffer layer also achieves a large increase in the saturation magnetic field $H_s$.

As thus described, the first to fifth experiments have proved that the technique of the present invention achieves the enhancement of the exchange coupling within the SAF regardless of the structure and/or material of the underlayer therebelow.

It is apparent that the present invention is not limited to the above-described embodiments, which may be modified and changed without departing from the scope of the invention.

What is claimed is:

1. An MTJ element comprising:
a fixed magnetic layer positioned over a substrate;
a free magnetic layer positioned over said substrate; and
a tunnel barrier layer placed between said fixed and free magnetic layers and comprising an insulative layer,
wherein one of said fixed and free magnetic layers is positioned over said tunnel barrier layer,
wherein said one of said fixed and free magnetic layers includes:
a first ferromagnetic layer formed on said tunnel barrier layer;
a first non-magnetic layer formed on said first ferromagnetic layer; and
a second ferromagnetic layer formed on said first non-magnetic layer,
wherein a top surface of said first ferromagnetic layer is in contact with said first non-magnetic layer, and
wherein said first ferromagnetic layer includes a first orientation control buffer consisting of material selected from a group consisting of tantalum (Ta), ruthenium (Ru), niobium (Nb), vanadium (V), osmium (Os), rhodium (Rh), iridium (Ir), titanium (Ti), zirconium (Zr), hafnium (Hf), copper (Cu), chromium (Cr), molybdenum (Mo), tungsten (W), aluminum (Al), magnesium (Mg), silicon (Si), yttrium (Y), cerium (Ce), palladium (Pd), rhenium (Re), and alloys thereof,
wherein said first ferromagnetic layer further includes:
a first ferromagnetic film; and
a second ferromagnetic film positioned over said first ferromagnetic film, and
wherein said first orientation control buffer is placed between said first and second ferromagnetic films and designed to provide ferromagnetic coupling between said first and second ferromagnetic films, and
wherein the closest-packed face of said second ferromagnetic film is configured with a higher orientation perpendicular to the film plane compared to said first ferromagnetic film.

2. The MTJ element according to claim 1, wherein said second ferromagnetic film has a FCC structure, and exhibits higher FCC (111) orientation, compared to said first ferromagnetic film.

3. The MTJ element according to claim 2, wherein said second ferromagnetic film is formed of material selected from a group consisting of nickel, iron, cobalt, and alloys thereof, and
wherein said first non-magnetic layer is formed of ruthenium or alloy thereof.

4. An MTJ element, comprising:
a fixed magnetic layer positioned over a substrate;
a free magnetic layer positioned over said substrate; and
a tunnel barrier layer placed between said fixed and free magnetic layers and comprising an insulative layer,
wherein one of said fixed and free magnetic layers is positioned over said tunnel barrier layer,
wherein said one of said fixed and free magnetic layers includes:
a first ferromagnetic layer formed on said tunnel barrier layer;
a first non-magnetic layer formed on said first ferromagnetic layer; and
a second ferromagnetic layer formed on said first non-magnetic layer,
wherein a top surface of said first ferromagnetic layer is in contact with said first non-magnetic layer,
wherein said first ferromagnetic layer includes:
a ferromagnetic film formed on said tunnel barrier layer; and
a first orientation control buffer which is ferromagnetic and formed on said ferromagnetic film,
wherein said first non-magnetic layer is formed on said first orientation control buffer, and
wherein said first orientation control buffer is configured to be ferromagnetic, and consists of:
ferromagnetic material; and
at least one material selected from a group consisting of tantalum, niobium, zirconium, hafnium, molybdenum, and tungsten, and
wherein said first orientation control buffer is formed directly on said ferromagnetic film.

5. The MTJ element of claim 4, wherein said first ferromagnetic layer and said second ferromagnetic layer are coupled by antiferromagnetic coupling.

6. An MTJ element comprising:
a fixed magnetic layer positioned over a substrate;
a free magnetic layer positioned over said substrate; and
a tunnel barrier layer placed between said fixed and free magnetic layers and comprising an insulative layer,
wherein one of said fixed and free magnetic layers is positioned over said tunnel barrier layer,
wherein said one of said fixed and free magnetic layers includes:
a first ferromagnetic layer formed on said tunnel barrier layer;
a first non-magnetic layer formed on said first ferromagnetic layer; and
a second ferromagnetic layer formed on said first non-magnetic layer,
wherein a top surface of said first ferromagnetic layer is in contact with said first non-magnetic layer,
wherein said first ferromagnetic layer further includes:
a first ferromagnetic film;
a first orientation control buffer; and
a second ferromagnetic film positioned over said first ferromagnetic film,
wherein said first orientation control buffer is placed between said first and second ferromagnetic films and designed to provide ferromagnetic coupling between said first and second ferromagnetic films, and
wherein said first orientation control buffer is configured to be ferromagnetic, and consists of:
ferromagnetic material; and
at least one material selected from a group consisting of tantalum, niobium, zirconium, hafnium, molybdenum, and tungsten.

7. The MTJ element according to claim 6, wherein said ferromagnetic material is NiFe,
wherein said at least one material is tantalum or zirconium, and
wherein a tantalum or zirconium content of said first orientation control buffer ranges from 5 to 25 atomic %.

* * * * *

UNITED STATES PATENT AND TRADEMARK OFFICE
CERTIFICATE OF CORRECTION

| | |
|---|---|
| PATENT NO. | : 8,865,326 B2 |
| APPLICATION NO. | : 12/834646 |
| DATED | : October 21, 2014 |
| INVENTOR(S) | : Yoshiyuki Fukumoto and Chuuji Igarashi |

It is certified that error appears in the above-identified patent and that said Letters Patent is hereby corrected as shown below:

In the Specification

Figure 1D:
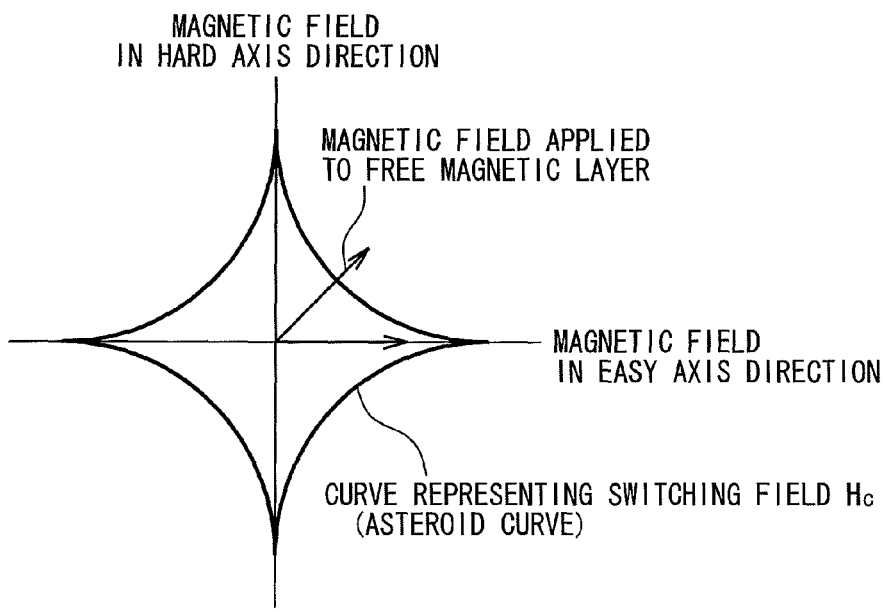
Figure 2A:
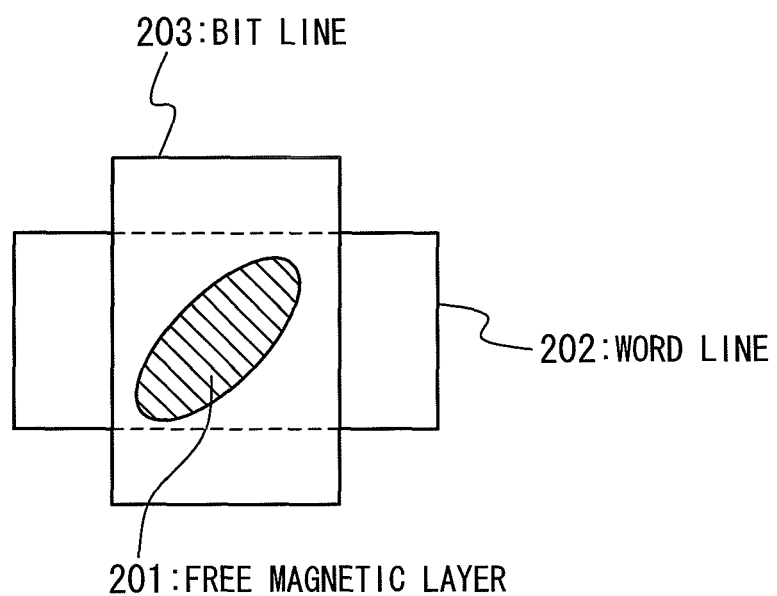
FIG. 2A is a plan view showing another exemplary structure of the conventional MRAM.

Column 11, Line 60: Delete "FIG. 13" and insert -- FIG. 1D --

Column 17, Line 47: Delete "No" and insert -- Mo --

Column 30, Line 42: Delete "$H_5$" and insert -- $H_s$ --

Column 38, Line 13: Delete "fields" and insert -- fields $H_s$) --

Column 38, Line 22: Delete "$Ni_{81}Fe_1$" and insert -- $Ni_{81}Fe_{19}$ --

Signed and Sealed this
Tenth Day of March, 2015

Michelle K. Lee
*Deputy Director of the United States Patent and Trademark Office*